(12) United States Patent
Saitoh

(10) Patent No.: US 9,105,652 B2
(45) Date of Patent: Aug. 11, 2015

(54) METHOD OF MANUFACTURING SEMICONDUCTOR DEVICE

(75) Inventor: Masaki Saitoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 65 days.

(21) Appl. No.: 14/119,407

(22) PCT Filed: May 21, 2012

(86) PCT No.: PCT/JP2012/003311
§ 371 (c)(1),
(2), (4) Date: Nov. 21, 2013

(87) PCT Pub. No.: WO2012/160800
PCT Pub. Date: Nov. 29, 2012

(65) Prior Publication Data
US 2014/0099766 A1 Apr. 10, 2014

(30) Foreign Application Priority Data
May 24, 2011 (JP) .................................. 2011-115941

(51) Int. Cl.
*H01L 21/00* (2006.01)
*H01L 29/66* (2006.01)
*H01L 27/12* (2006.01)
*H01L 29/786* (2006.01)
*H01L 21/266* (2006.01)

(52) U.S. Cl.
CPC ........ *H01L 29/66492* (2013.01); *H01L 21/266* (2013.01); *H01L 27/1288* (2013.01); *H01L 29/66757* (2013.01); *H01L 29/78624* (2013.01)

(58) Field of Classification Search
CPC .............. H01L 27/1288; H01L 21/266; H01L 29/66757; H01L 29/66492; H01L 29/78624
See application file for complete search history.

(56) References Cited

U.S. PATENT DOCUMENTS

| 5,604,139 A * | 2/1997 | Codama et al. ............... 438/151 |
| 6,306,693 B1 | 10/2001 | Ishiguro et al. |
| 2003/0124778 A1 * | 7/2003 | Doi et al. ...................... 438/151 |

(Continued)

FOREIGN PATENT DOCUMENTS

| JP | 7-226518 A | 8/1995 |
| JP | 2001-85695 A | 3/2001 |

(Continued)

OTHER PUBLICATIONS

U.S. Appl. No. 14/112,216, filed Oct. 16, 2013.

*Primary Examiner* — Benjamin Sandvik
*Assistant Examiner* — Farid Khan
(74) *Attorney, Agent, or Firm* — Chen Yoshimura LLP

(57) ABSTRACT

A resist layer (46a) including a thick film section (47a), which is relatively thick, at one side thereof, and a thin film section (47b), which is relatively thin, at the other side thereof is formed using a multiple-tone mask. A gate electrode (15a) is formed at a place where it will be provided on a semiconductor layer (12a) so as to be narrower than the resist layer (46a), by executing isotropic etching to a conductive film (44) formed in advance using the resist layer (46a) as a mask, in order to form overhang portions (48) on the resist layer (46a) at both sides of the gate electrode (15a). Then, the entire thin film section (47b) is removed, the thick film section (47a) is made thinner, and impurities are implanted into the semiconductor layer (12a) using the remaining resist layer (46a) and the gate electrode (15a) as masks.

12 Claims, 41 Drawing Sheets

(56) References Cited

U.S. PATENT DOCUMENTS

| | | |
|---|---|---|
| 2003/0178650 A1* | 9/2003 | Sonoda et al. ............... 257/204 |
| 2006/0278875 A1 | 12/2006 | Ohnuma et al. |
| 2007/0045627 A1 | 3/2007 | Park et al. |
| 2008/0044958 A1* | 2/2008 | Hwang .................. 438/154 |
| 2010/0224878 A1* | 9/2010 | Kimura .................. 257/57 |

FOREIGN PATENT DOCUMENTS

| | | |
|---|---|---|
| JP | 2003-282880 A | 10/2003 |
| JP | 2007-19490 A | 1/2007 |
| JP | 2008-47891 A | 2/2008 |
| JP | 2010-232651 A | 10/2010 |

* cited by examiner (a)

(b)

(c)

(a)

(b)

(c)

(a)

(b)

(a)

(b)

(a)

(b)

(c)

(a)

(b)

(c)

(a)

(b)

(c)

(a)

(b)

(c)

(a)

(b)

(a)

(b)

(c)

(a)

(b)

(a)

(b)

(c)

METHOD OF MANUFACTURING SEMICONDUCTOR DEVICE

TECHNICAL FIELD

The present invention relates to a manufacturing method for a semiconductor device including thin film transistors (hereinafter referred to as TFTs) having an LDD (lightly doped drain) structure having an LDD region on side thereof, and in particular, relates to techniques to reduce the number of photomasks and to reduce the number of manufacturing steps.

BACKGROUND ART

Semiconductor devices having TFTs are widely used in electronic devices having electronic circuits such as ICs (integrated circuits), and are used as an active matrix substrate in various display devices such as a liquid crystal display device using the active matrix driving method or an organic EL (electroluminescence) display device, for example.

If, in this semiconductor device, the semiconductor layers of the TFTs are made of polysilicon (p-Si), the carrier mobility is greater than if the semiconductor layer were made of amorphous silicon (a-Si), and thus, fast operation is possible. If peripheral circuits such as driver circuits and power source circuits are made using TFTs including semiconductor layers made of polysilicon, it is possible to integrally form the peripheral circuits into the active matrix substrate.

Such a TFT having a semiconductor layer made of polysilicon adopts a top-gate type (also referred to as a coplanar type) structure in most cases. A typical top-gate type TFT includes a semiconductor layer disposed on a base substrate, a gate insulating film covering the semiconductor layer, and a gate electrode disposed so as to overlap the center portion of the semiconductor layer through the gate insulating film. In the semiconductor layer, the channel regions in position corresponding to the gate electrodes have formed on both sides thereof high-concentration impurity regions that function as a source region or a drain region, to which an impurity is implanted at a high concentration.

Such a top gate TFT sometimes suitably uses an LDD structure as a way to alleviate the electrical field in the drain region in order to prevent characteristic deterioration due to hot carriers. The LDD-structure TFTs have low-concentration impurity regions referred to as LDD regions between the channel region and the respective high-concentration impurity regions in the semiconductor layer, and the low-concentration impurity regions mitigate the occurrence of hot carriers by alleviating the electrical field in the drain region. Below, LDD TFTs having low-concentration impurity regions on both sides of the channel region in this manner are referred to as double LDD TFTs.

In a double LDD TFT, a low-concentration impurity region is also formed in the source region where durability against hot carriers is normally unnecessary. Thus, when the TFT is ON during the operation of the TFT, the resistance of the low-concentration impurity region on the source region side becomes connected in series with the source region and the drain region, and the ON current of the TFT is reduced by the amount of resistance, which reduces operation speed.

As a TFT designed to improve ON current characteristics compared to a double LDD TFT, an LDD TFT having a low-concentration impurity region only on the drain region side is known. Below, LDD TFTs having a low-concentration impurity region on only one side of the channel region in this manner are referred to as single LDD TFTs.

The semiconductor device including a single LDD TFT can be manufactured by performing: a step of implanting an impurity at a high concentration in which after a gate electrode is formed, a resist layer is formed covering a portion where a low-concentration impurity region is formed in a single side part of the gate electrode, or in other words, the semiconductor layer, and then the impurity is implanted at a high concentration in the semiconductor layer with the resist layer as a mask; and a step of implanting an impurity at a low concentration in which, after the resist layer is removed, the impurity is implanted at a low concentration in the semiconductor layer with the gate electrode as a mask.

Such a manufacturing method had a problem in that it was necessary to add a photomask to form the resist layer that functions as a mask for the portions where the low-concentration impurity regions are to be formed in order to implant an impurity at a high concentration, which caused an increase in the number of process steps and manufacturing cost. This problem similarly occurs in a semiconductor layer having the double LDD TFT described above.

A conventional method of manufacturing a semiconductor device having LDD TFTs in which it is possible to reduce the number of photomasks and reduce the number of steps has been proposed.

For example, Patent Document 1 discloses a method in which a gate electrode is formed by patterning a conductive film by wet etching, the resist layer used in the formation of the gate electrode is used as a mask to implant an impurity at a high concentration in a semiconductor layer, and then, after removing the resist layer, an impurity is implanted at a low concentration in the semiconductor layer with the gate electrode as a mask. According to this manufacturing method, due to side etching that occurs when forming the gate electrode, the gate electrode is formed narrower than the resist layer, being recessed towards the inside of the resist layer, and it is possible to provide an offset region in which an impurity is not implanted between the high-concentration impurity region formed by the first impurity implantation and the channel region, and in each offset region, it is possible to form a low-concentration impurity region by a second impurity implantation.

Patent Document 2 discloses a method in which a low-concentration impurity region (LDD region) is formed in a self-aligned manner by forming an asymmetric resist pattern with a single side portion having a thick film part that is thick and a thin film part that is thinner than the thick film part by using a photomask or a reticle in a photolithography step for forming the gate electrode, the photomask or reticle having a complementary pattern with a light intensity-reducing function made of a diffraction grating pattern or a semi-transparent film, and then, dry etching is performed using this resist pattern, thereby forming a gate electrode having a step shape, and then, an impurity element is implanted in the semiconductor layer by having the impurity pass through the thin portion of the gate electrode.

RELATED ART DOCUMENT

Patent Document

Patent Document 1: Japanese Patent Application Laid-Open Publication No. 2001-85695
Patent Document 2: Japanese Patent Application Laid-Open Publication No. 2007-19490

SUMMARY OF THE INVENTION

Problems to be Solved by the Invention

However, in the manufacturing method of Patent Document 1, the recession of the gate electrode from both sides thereof due to the side etching described above occurs uniformly for all gate electrodes, and thus, offset regions are formed on both sides of the channel region by the first impurity implantation, and the low-concentration impurity regions are formed in both offset regions by the second impurity implantation. Thus, all TFTs necessarily have the double LDD structure, and because implantation of the impurity into the semiconductor layer is not differentiated by type of LDD structure, it is not possible to form a low-concentration impurity region on only one side of the channel region, and thus, a single LDD TFT cannot be formed.

However, if, using the manufacturing method of Patent Document 1, an implantation of the impurity into the semiconductor layer constituting a double LDD TFT is performed separately from an implantation of the impurity into the semiconductor layer constituting a single LDD TFT, then gate electrodes must be formed in separate steps depending on the type of LDD structure, which makes the manufacturing steps more complex, necessitates more photomasks, increases the number of steps, and increases the cost.

Also, while it is possible to form a low-concentration impurity region on only one side of the channel region in the semiconductor layer with the manufacturing method of Patent Document 2, the width of the low-concentration impurity region shows large variation due to variation in the width and thickness of the resist layer for forming the gate electrode, and variation in the width of the gate electrode due to dry etching. Furthermore, with respect to sheet resistance in the low-concentration impurity region, impurity implantation is performed through the gate electrode part, which is thin, and thus, the implantation concentration varies due to effects of variation in the thickness of the gate electrode. In this manner, in the same manufacturing method, there are too many factors that cause variation in TFT characteristics, and thus, it is difficult to manufacturing a single LDD TFT having excellent characteristics in a stable manner.

The various problems described above similarly occur when manufacturing offset TFTs provided with an offset region having the same impurity concentration as the channel region in only the drain region. An offset TFT having an offset region on only one side of the channel region in this manner is referred to below as a single offset TFT.

The present invention is made in view of the above-mentioned points, and an object thereof is to provide excellent characteristics in a stable manner in a single LDD TFT or a single offset TFT, and to manufacture a semiconductor device having this TFT at a low cost by having a small number of photomasks and reducing the number of steps.

Means for Solving the Problems

In order to achieve the above-mentioned objects, the present invention is designed such that one photomask is used both for a resist layer for forming a gate electrode and a resist layer functioning as a mask for implanting an impurity into the semiconductor layer, and to minimize causes for variation in TFT characteristics.

Specifically, the present invention is a method of manufacturing a semiconductor device including single LDD structure or single offset structure TFTs, and has the following methods to solve the problems.

In other words, the first invention includes: a semiconductor layer forming step of forming a semiconductor film on a base substrate and patterning the semiconductor film to form a semiconductor layer; a gate insulating film forming step of forming a gate insulating film so as to cover the semiconductor layer; a conductive film forming step of forming, on the gate insulating film, a conductive film that is used to form gate electrodes; a photosensitive resin film forming step of forming a photosensitive resin film on the conductive film; a photosensitive resin film patterning step of patterning the photosensitive resin film by exposure such that an amount of light radiated onto the photosensitive resin film is controlled by using a multiple gradation mask and then developing is performed on the photosensitive resin film, thereby forming a resist layer over a portion of the semiconductor layer, the resist layer having a thick film portion on one side, and a thin film portion that is thinner than the thick film portion on another side; a conductive film patterning step of patterning the conductive film by isotropic etching using the resist layer as a mask and thereby forming a gate electrode that is narrower than the resist layer over the semiconductor layer, providing the resist layer with overhang portions that hang over both sides of the gate electrode in an eave-shape; a thin film portion removal step of removing the thin film portion, and thereby shaping the resist layer having the overhang portions such that an overhang portion hangs over only one side of the gate electrode; and an impurity implantation step of, after the thin film removal step, implanting a conductive impurity of a conductivity type different from a conductivity type of the semiconductor layer to the semiconductor layer using the resist layer as a mask, to form impurity implanted regions in the semiconductor layer respectively on both sides of a portion corresponding in position to the gate electrode, the impurity implanted region on one side of the gate electrode being formed with a gap therefrom corresponding to the overhang portion.

In the first invention, in the photosensitive resin film patterning step, a resist layer is formed over a portion of where the semiconductor layer is formed, the resist layer having a thick film portion and a thin film portion, thus having different thickness on one side thereof versus the other. Next, in the conductive film patterning step, a gate electrode is formed by isotropic etching with the resist layer as a mask, and an overhang portion that hangs over both sides of the gate electrode is formed in the resist layer. In addition, in the thin film portion removal step, relying on the difference in thickness between the thick film portion and the thin film portion, the resist layer is formed into a shape such that an overhang portion hangs over only one side of the gate electrode. Then, in the impurity implantation step, an impurity is implanted in the semiconductor layer with the resist layer, which has undergone the thin film removal step, as a mask, and thus, impurity implanted regions are formed on both sides of the channel region in the semiconductor layer. A this time, the overhang portion of the resist layer hangs over only one side of the gate electrode, and thus, only an impurity implanted region on one side of the portion of the semiconductor corresponding in position to the gate electrode is formed with a gap from the position corresponding to the gate electrode.

According to the respective steps, one photomask (multiple gradation mask) has two resist patterns: a first resist pattern in the resist layer prior to the thin film removal step; and a second resist pattern in the resist layer including only the thick film portion constituent portion that has been thinned after the thin film portion removal step. The first resist pattern is used as a mask to form the gate electrode, and the second resist pattern is used as a mask to form a low concentration impurity region or an offset region when implanting an impurity into the semiconductor layer. As a result, only one photomask is needed to form the resist layer for forming the gate electrode and the resist layer form implanting an impurity into the semiconductor layer. In other words, there is no need to form a resist layer for implanting an impurity into the semiconductor layer separately from a resist layer to form the gate electrode, and thus, the number of photomasks and the number of steps are reduced.

Furthermore, the dominant cause for variation in line width in the low concentration impurity regions or the offset regions becomes the variation in line width of the gate electrode due to side etching, and other causes that have a large impact on line width in the low concentration impurity regions and the offset regions are no longer present, and thus, it is possible to mitigate variation in line width in the low concentration impurity region and the offset region. As a result, variation in TFT characteristics is sufficiently mitigated, and single LDD structure and single offset structure TFTs with excellent characteristics can be stably attained.

Therefore, it becomes possible to manufacture a semiconductor device having TFTs at a low cost by having a small number of photomasks and a smaller number of steps while stably attaining excellent characteristics for single LDD structure or single offset structure TFTs.

The second invention is the manufacturing method for a semiconductor device according to the first invention, wherein, in the impurity implantation step, in addition to forming the impurity implanted regions, a channel region is formed in a position corresponding to the gate electrode in the semiconductor layer, and an offset region in which the impurity is not implanted is formed in the gap between one of the impurity implanted regions and the channel region, and wherein an impurity is not implanted in the offset region in a step after forming the impurity implanted regions.

In the second invention, offset regions (regions under the overhang portions) are formed in the semiconductor layer. The offset regions are not doped with an impurity in the impurity implantation step, and therefore have the same impurity concentration as that in the channel region. Also, the impurity is not implanted in the offset region in steps that follow, and the offset region is left alone, and therefore, it is possible to manufacture a semiconductor device having single offset structure TFTs.

As a result, while it is necessary to additionally perform a low concentration impurity implantation step in which an impurity is implanted at a low concentration into the offset region after the impurity implantation step when forming single LDD structure TFTs, it is unnecessary to perform the low concentration impurity implantation step when forming single offset structure TFTs, and thus, compared to forming single LDD structure TFTs, the number of steps can be decreased in an excellent manner, and a more inexpensive semiconductor device can be manufactured.

The third invention is the manufacturing method for a semiconductor device according to the first invention, wherein the impurity implantation step is a high-concentration impurity implantation step, wherein, in the high-concentration impurity implantation step, high-concentration impurity regions are formed as the impurity implanted regions, and wherein the manufacturing method further includes: a resist layer removal step of removing the resist layer that remains after the high-concentration impurity implantation step; and a low-concentration impurity implantation step of, after the resist layer removal step, implanting an impurity of the same type as the high-concentration impurity regions in the semiconductor layer using the gate electrode as a mask, and thereby forming respectively in the semiconductor layer a channel region in the position corresponding to the gate electrode and a low-concentration impurity region between the channel region and one of the high-concentration impurity regions.

In the third invention, the resist layer is removed in the resist layer removal step, and then, a low concentration impurity region is formed in the low concentration impurity implantation step by implanting an impurity to the semiconductor layer with the gate electrode as a mask. By performing the respective steps, a semiconductor device including single LDD structure TFTs can be manufactured. Single LDD structure TFTs have a wide optimal range in terms of line width of the low concentration impurity region compared to the optimal range of line width in an offset region in a single offset structure TFT, and thus, design flexibility is greater. Therefore, an excellent TFT with a balance between high ON current and low OFF current can be attained with ease. Therefore, compared to manufacturing a semiconductor device having single offset structure TFTs, it is possible to more reliably eliminate operation defects in the semiconductor device.

Also, the impurity is implanted in the semiconductor layer through only the gate insulating film, and thus, variation in sheet resistance in the low concentration impurity region can be mitigated compared to implanting in impurity through the gate electrode as disclosed in Patent Document 2. As a result, causes variation in TFT characteristics is minimized, and single LDD structure TFTs with excellent characteristics can be obtained.

The fourth invention includes: a semiconductor layer forming step of forming a semiconductor film on a base substrate and patterning the semiconductor film to form a first semiconductor layer and a second semiconductor layer; a gate insulating film forming step of forming a gate insulating film so as to cover the first semiconductor layer and the second semiconductor layer; a conductive film forming step of forming, on the gate insulating film, a conductive film that is used to form gate electrodes; a photosensitive resin film forming step of forming a photosensitive resin film on the conductive film; a photosensitive resin film patterning step of forming a first resist layer having a thick film portion on one side thereof and a thin film portion that is thinner than the thick film portion on another side thereof over a portion of the first semiconductor layer, and forming a second resist layer that is thicker than the thin film portion over a portion of the second semiconductor layer by controlling an amount of light radiated onto the photosensitive resin film by using a multiple gradation mask; a conductive film patterning step of patterning the conductive film by isotropic etching that uses the first resist layer and the second resist layer as masks, to form gate electrodes respectively over the first semiconductor layer and over the second semiconductor layer so as to be narrower than the corresponding first resist layer and second resist layer, and to form overhang portions in the first resist layer and in the second resist layer, respectively, the overhang portions hanging over both sides of the gate electrodes in an eave shape; a thin film portion removal step of removing the thin film portion, and thereby shaping the first resist layer such that an overhang portion hangs over only one side of the gate electrode, and thinning the second resist layer while leaving the second resist layer remaining; and an impurity implantation step of, after the thin film portion removal step, respectively implanting an impurity of a conductivity type different from the conductivity type of both semiconductor layers in the first semiconductor layer using the first resist layer as a mask and in the second semiconductor layer using the gate electrode as a mask, and thereby forming in the first semiconductor layer impurity implanted regions respectively on both sides of the position corresponding to the gate electrode, the impurity implanted region on one side of the gate electrode being formed with a gap therefrom corresponding to the overhang portion the overhang portion, and forming in the second semiconductor layer impurity implanted regions on both sides of the position corresponding to the gate electrode with gaps therefrom corresponding to the overhang portions.

In the fourth invention also, through steps similar to the first invention, only an impurity implanted region on one side of the position in the first semiconductor layer corresponding to the gate electrode is formed with a gap from the position corresponding to the gate electrode, and thus, while obtaining single LDD structure or single offset structure TFTs with excellent characteristics in a stable manner, it is possible to manufacture a semiconductor device with such TFTs at a low cost with a small number of photomasks and fewer steps.

Also, in the fourth invention, in the photosensitive resin film patterning step, a second resist layer is formed over a portion of the second semiconductor layer, the second resist layer being thicker than the thin film portion of the first resist layer formed over the first semiconductor layer. Next, in the conductive film patterning step, a gate electrode is formed over the second semiconductor layer and overhang portions that hang over both sides of the gate electrode are formed in the second resist layer. Additionally, in the thin film removal step, the second resist layer is thinned and left remaining. Then, in the impurity implantation step, an impurity is implanted in the second semiconductor layer with the thinned second resist layer as a mask, and thus, impurity implanted regions are formed on both sides of the channel region in the semiconductor layer. At this time, the overhang portion of the resist layer hangs over both sides of the gate electrode, and thus, respective impurity implanted regions in the semiconductor layer on both sides of the position corresponding to the gate electrode are formed at a gap from the position corresponding to the gate electrode.

According to the respective steps, single LDD structure or single offset structure TFTs included in the first semiconductor layer can be formed together with double LDD structure or double offset structure TFTs included in the second semiconductor layer. With a combination of the single LDD structure or single offset structure TFTs with the double LDD structure or double offset structure TFTs, the number of types of circuits that can be formed is greatly increased, and thus, being able to form TFTs of both structures together presents a large advantage in terms of circuit design. Also, by configuring circuits by appropriately using TFTs of whichever characteristics are needed, it is possible to attain a semiconductor device with excellent performance.

The fifth invention includes: a semiconductor layer forming step of forming a semiconductor film on a base substrate and patterning the semiconductor film to form a first semiconductor layer and a second semiconductor layer; a gate insulating film forming step of forming a gate insulating film so as to cover the first semiconductor layer and the second semiconductor layer; a conductive film forming step of forming, on the gate insulating film, a conductive film that is used to form gate electrodes; a photosensitive resin film forming step of forming a photosensitive resin film on the conductive film; a photosensitive resin film patterning step of forming a first resist layer having a thick film portion on one side thereof and a thin film portion that is thinner than the thick film portion on another side thereof over a portion of the first semiconductor layer, and forming a second resist layer having a thickness less than or equal to the thin film portion over a portion of the second semiconductor layer by controlling an amount of light radiated onto the photosensitive resin film by using a multiple gradation mask; a conductive film patterning step of patterning the conductive film by isotropic etching that uses the first resist layer and the second resist layer as masks, to form gate electrodes respectively over the first semiconductor layer and on the second semiconductor layer so as to be narrower than the corresponding first resist layer or second resist layer, and to form overhang portions in the first resist layer and in the second resist layer, respectively, the overhanging portions hanging over both sides of the gate electrodes in an eave-like shape; a thin film portion removal step of removing the thin film portion, and thereby shaping the first resist layer such that an overhang portion hangs over only one side of the gate electrode, and removing the entire second resist layer; and an impurity implantation step of, after the thin film portion removal step, respectively implanting an impurity of a conductivity type different from the conductivity type of both semiconductor layers in the first semiconductor layer using the first resist layer as a mask and in the second semiconductor layer using the gate electrode as a mask, and thereby forming in the first semiconductor layer impurity implanted regions respectively on both sides of a position corresponding to the gate electrode, the impurity implanted region being formed with a gap therefrom corresponding to the overhang portion, and forming in the second semiconductor layer impurity implanted regions with no gaps on both sides of the position corresponding to the gate electrode.

In the fifth invention also, through the respective steps similar to the first invention, only an impurity implanted region on one side of the position in the first semiconductor layer corresponding to the gate electrode is formed with a gap from the position corresponding to the gate electrode, and thus, while attaining single LDD structure or single offset structure TFTs having excellent characteristics in a stable manner, it is possible to manufacture the TFTs at a low cost by using a small number of photomasks and reducing the number of steps.

Also, in the fifth invention, in the photosensitive resin film patterning step, a second resist layer is formed over a portion of the second semiconductor layer, the second resist layer having a thickness less than or equal to the thin film portion of the first resist layer formed over the first semiconductor layer. Next, in the conductive film patterning step, a gate electrode is formed over the second semiconductor layer and overhang portions that hang over both sides of the gate electrode are formed in the second resist layer. Additionally, in the thin film removal step, the entire second resist layer is removed. Then, in the impurity implantation step, an impurity is implanted in the second semiconductor layer with the gate electrode as a mask, and thus, impurity implanted regions are formed on both sides of the channel region in the semiconductor layer. At this time, the second resist layer is already removed, and thus, the respective impurity implanted regions in the second semiconductor layer on both sides of the position thereof corresponding to the gate electrode are formed without a gap from the position corresponding to the gate electrode.

According to the respective steps, single LDD structure or single offset structure TFTs included in the first semiconductor layer can be formed together with normal structure TFTs having neither the low concentration impurity regions nor the offset regions included in the second semiconductor layer. With the combination of single LDD structure or single offset structure TFTs with normal structure TFTs, the number of types of circuits that it is possible to form is greatly increased, and thus, being able to form TFTs of both types of structures together presents a great advantage in terms of circuit design.

Also, by configuring circuits by appropriately using TFTs of whichever characteristics are needed, it is possible to attain a semiconductor layer of excellent operation.

The sixth invention is the manufacturing method for a semiconductor device of any one of the first to fifth inventions, wherein, in the photosensitive resin film patterning step, a gray tone mask is used as the multiple gradation mask.

In the sixth invention, a gray tone mask is used as the multiple gradation mask. Generally, the gray tone mask is less expensive than a half-tone mask, and therefore, it is possible to reduce the manufacturing cost for the semiconductor device.

The seventh invention includes: a semiconductor layer forming step of forming a semiconductor film on a base substrate and patterning the semiconductor film to form a first semiconductor layer and a second semiconductor layer; a gate insulating film forming step of forming a gate insulating film so as to cover the first semiconductor layer and the second semiconductor layer; a conductivity type adjusting step of adjusting a concentration of an impurity included in at least one of the first semiconductor layer and the second semiconductor layer such that the first semiconductor layer has a first conductivity type and the second semiconductor layer has a second conductivity type by implanting an impurity in at least one of the first semiconductor layer and the second semiconductor layer; a conductive film forming step of forming a conductive film to be used to form a gate electrode on the gate insulating film after the conductivity type adjusting step; a first photosensitive resin film forming step of forming a first photosensitive resin film on the conductive film; a first photosensitive resin film patterning step of patterning the first photosensitive resin film, and thereby forming a first resist layer over the entire first semiconductor layer and forming a second resist layer over a portion of the second semiconductor layer; a first conductive film patterning step of patterning the conductive film by etching that uses the first resist layer and the second resist layer as masks, to form a gate electrode above the second semiconductor layer; a first conductivity type impurity implantation step of implanting a first conductivity type impurity in the second semiconductor layer using the second resist layer as a mask, thereby forming a channel region in a position of the second semiconductor layer corresponding to the gate electrode and impurity implanted regions on both sides of the channel region, without implanting the first conductivity type impurity in the first semiconductor layer using the first resist layer as a mask; a first and second resist layer removal step of removing the first resist layer and the second resist layer after the first conductive type impurity implantation step, a second photosensitive resin film forming step of forming a second photosensitive resin film on the conductive film; a second photosensitive resin film patterning step of forming a third resist layer having a thick film portion on one side thereof and a thin film portion that is thinner than the thick film portion on another side thereof over a portion of the first semiconductor layer, and forming a fourth resist layer that is thicker than the thin film portion over the entire second semiconductor layer by controlling an amount of light radiated onto the second photosensitive resin film by using a multiple gradation mask; a second conductive film patterning step of patterning the conductive film by isotropic etching using the third resist layer and the fourth resist layer as masks, in which a gate electrode narrower than the third resist layer is formed over the first semiconductor layer and overhang portions that hang over from the fourth third resist layer on both sides of the gate electrode in an eave-shape are formed; a thin film portion removal step of, after the second conductive film patterning step, removing the thin film portion, and thereby shaping the third resist layer such that an overhang portion hangs over only one side of the gate electrode, and thinning the fourth resist layer while leaving the fourth resist layer remaining; and a second conductivity type impurity implantation step of implanting a second conductivity type impurity in the first semiconductor layer using the third resist layer as a mask after the thin film portion removal step, thereby forming impurity implanted regions respectively on one side of a position of the first semiconductor layer corresponding to the gate electrode with a gap therefrom corresponding to the overhang portion and on another side of the position corresponding to the gate electrode with no gap from the position corresponding to the gate electrode, without implanting the second conductivity type impurity in the second semiconductor layer using the fourth resist layer as a mask.

In the seventh invention also, through respective steps (semiconductor layer forming step, gate insulating film forming step, conductive film forming step, second photosensitive resin film forming step, second photosensitive resin film patterning step, second conductive film patterning step, thin film portion removal step, and second conductive type impurity implantation step) similar to those of Embodiment 1, only an impurity implanted region on one side of the position in the first semiconductor layer corresponding to the gate electrode is formed with a gap from the position corresponding to the gate electrode, and thus, while attaining single LDD structure or single offset structure TFTs having excellent characteristics in a stable manner, it is possible to manufacture the TFTs at a low cost by using a small number of photomasks and reducing the number of steps.

Also, in the seventh invention, in the conductive type adjusting step, the first semiconductor layer and the second semiconductor layer are adjusted so as to have a different conductive types from each other. Next, in the first photosensitive resin film forming step, a first photosensitive resin film is formed on the conductive film that is used to form gate electrodes. Thereafter, in the first photosensitive resin film patterning step, the first resist layer is formed over the entire first semiconductor layer, and the second resist layer is formed over a portion of the second semiconductor layer. In the first conductive film patterning step, the gate electrode is formed only over the second semiconductor layer. Next, in the first conductive type impurity implantation step, impurity implanted regions are formed only in the second semiconductor layer. Then, in the first and second resist layer removal step, the first resist layer and the second resist layer are removed.

According to the respective steps above, on the same substrate, n-type TFTs and p-type TFTs of different conductivity types with one of them having either a single LDD structure or a single offset structure can be formed together. This makes it possible to form a CMOS (complementary metal-oxide semiconductor) by combining these n-type TFTs and p-type TFTs. CMOS has characteristics of enabling faster switching, lower power consumption, and improvement in integration degree, and is an element suitable to achieve an appropriate circuit scale. Therefore, in the semiconductor device, it is possible to attain reduced power consumption and have the respective types of circuits take up less space, and it is possible to attain a semiconductor device with excellent performance.

The eighth invention is the manufacturing method for a semiconductor device according to the seventh invention, wherein the second conductivity type impurity implantation step is a high-concentration impurity implantation step, wherein, in the high-concentration impurity implantation step, high-concentration impurity regions are formed as the impurity implanted regions, wherein the manufacturing method further includes: a third resist layer removal step of removing the remaining third resist layer after the high-concentration impurity implantation step; and a low-concentration impurity implantation step of forming a channel region in a portion of the first semiconductor layer corresponding in position to the gate electrode and a low-concentration impurity region between one side of the channel region and one of the high-concentration impurity regions by implanting a second conductivity type impurity in the first semiconductor layer using the gate electrode as a mask, after the third resist layer removal step.

As in the third invention, in the eighth invention, it is possible to manufacture a semiconductor device having single LDD structure TFTs, and thus, compared to manufacturing a semiconductor device having single offset structure TFTs, it is possible to more reliably eliminate operation defects in the semiconductor device.

Also, the impurity is implanted in the semiconductor layer through only the gate insulating film, and thus, variation in sheet resistance in the low concentration impurity region can be mitigated compared to implanting in impurity through the gate electrode as disclosed in Patent Document 2. As a result, causes variation in TFT characteristics is minimized, and single LDD structure TFTs with excellent characteristics can be obtained.

The ninth invention is the manufacturing method for a semiconductor device of the seventh or eighth invention, wherein, in the second photosensitive resin film patterning step, a gray tone mask is used as the multiple gradation mask.

As in the sixth invention, in the ninth invention also, a gray tone mask, which is generally less expensive than a half tone mask, is used as a multiple gradation mask, and thus, the manufacturing cost for the semiconductor device is reduced.

The tenth invention is the manufacturing method for a semiconductor device of any one of the first to ninth inventions, wherein, in the semiconductor layer forming step, the semiconductor film is crystallized to form a crystalline semiconductor film.

In the tenth invention, the semiconductor film is crystallized to form a crystalline semiconductor film in the semiconductor layer forming step, and therefore, the first semiconductor layer and the second semiconductor layer are made of a crystalline semiconductor. The crystalline semiconductor has a significantly higher carrier mobility compared to an amorphous semiconductor. As a result, TFTs formed using semiconductor layers made of a crystalline semiconductor body can be used in an excellent manner as switching TFTs for respective pixels in a display region of a display device, and can be used as TFTs in peripheral circuits such as driver circuits and power source circuits. Thus, it is possible to specifically form a fully monolithic display device in which these TFTs are used to form the peripheral circuits integrally with the switching TFTs for the respective pixels on the same substrate.

Effects of the Invention

According to the present invention, the resist layer for forming the gate electrode and the resist layer functioning as a mask to form a low-concentration impurity region or an offset region for implanting an impurity into the semiconductor layer can both be formed of one photomask and causes for variation in TFT characteristics can be minimized, and thus, it is possible to attain excellent characteristics in a stable manner for a single LDD TFT or a single offset TFT, while manufacturing a semiconductor device having such TFTs with a small number of photomasks, a reduced number of steps, and at a low cost. As a result, it is possible to reduce the manufacturing cost while having the semiconductor device exhibit excellent functionality.

DETAILED DESCRIPTION OF EMBODIMENTS

Embodiments of the present invention will be described in detail below with reference to drawings. The present invention is not limited to the embodiments below.

Embodiment 1

Figure 1:
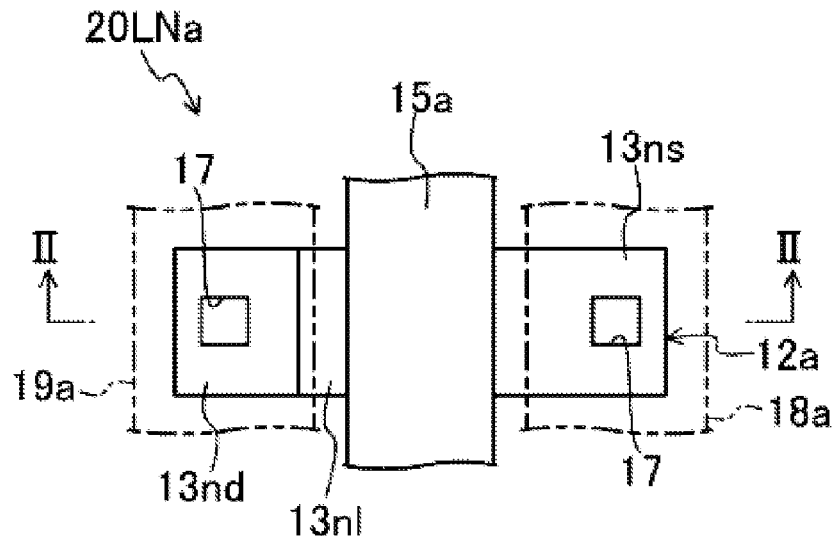
FIG. 1 is a plan view that schematically shows a TFT having a single LDD structure included in a semiconductor device of Embodiment 1.
Figure 2:
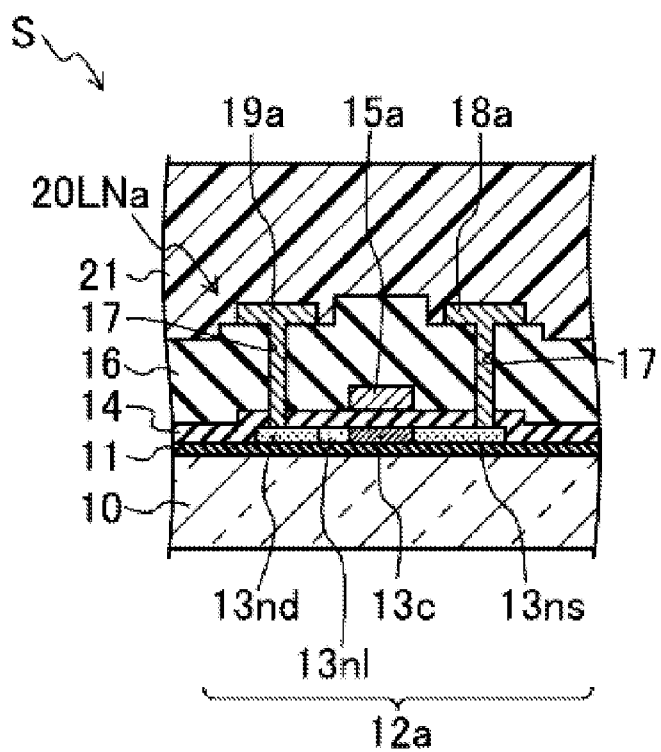
FIG. 2 is a cross-sectional view showing a cross-sectional structure along the line II-II of FIG. 1.
Figure 3:
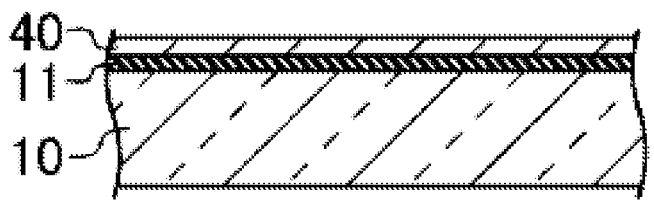
FIGS. 3(a) to 3(c) are cross-sectional views corresponding to the view of FIG. 2, illustrating a process to form a semiconductor layer in a manufacturing method for a semiconductor device of Embodiment 1.
Figure 3:
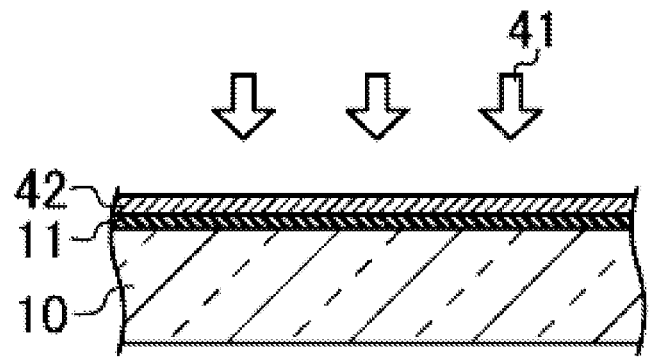
Figure 3:
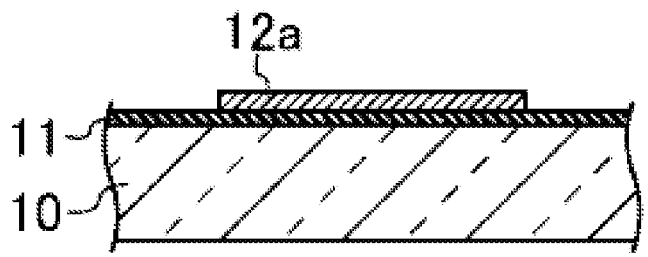

FIG. 1 is a schematic plan view of a single LDD structure n-type TFT included in a semiconductor device S according to Embodiment 1. FIG. 2 is a cross-sectional view showing a cross-sectional structure along the line II-II of FIG. 1.

As shown in FIG. 2, the semiconductor device S of the present embodiment includes an insulating substrate 10 such as a glass substrate that is a base substrate, and an n-type TFT 20LNa having a single LDD structure, which is also shown in FIG. 1, provided on the insulating substrate 10. The semiconductor device S is an active matrix substrate included in an active matrix driven liquid crystal display device, for example, and the n-type TFTs 20LNa having the single LDD structure function as the active element of a driver circuit such as a gate driver or a source driver.

The n-type TFT 20LNa having the single LDD structure has a top gate structure in which a gate electrode 15*a* is disposed on the side of a semiconductor layer 12*a* opposite to the insulating substrate 10. Also, a base insulating film 11 is disposed to cover the entire surface of the insulating substrate 10.

In other words, the n-type TFT 20LNa having the single LDD structure includes, on the insulating substrate 10, a semiconductor layer 12*a* provided on the base insulating film 11, a gate insulating film 14 provided so as to cover the semiconductor layer 12*a*, a gate electrode 15*a* provided on the gate insulating film 14 so as to correspond in position to the central portion of the semiconductor layer 12*a*, and a source electrode 18*a* and a drain electrode 19*a* (shown with the two-dot chain line in FIG. 1) connected to the semiconductor layer 12 while being separated from each other such that the gate electrode 15*a* is present therebetween.

The base insulating film 11 is formed by depositing a silicon nitride film and a silicon oxide film in this order, for example. The semiconductor layer 12*a* is made of a crystalline semiconductor such as polysilicon, for example. With this configuration, the n-type TFT 20LNa having the single LDD structure has a high carrier mobility and can be operated quickly.

In the semiconductor layer 12*a*, a channel region 13*c* is formed in a position corresponding to the gate electrode 15*a*, an n-type high-concentration impurity region 13*ns* functioning as a source region is formed on one side of the channel region 13*c* without a gap between it and the channel region 13*c*, and an n-type high-concentration impurity region 13*nd* functioning as a drain region is formed on the other side of the channel region 13*c* with a prescribed gap between it and the channel region 13*c*. An n-type low-concentration impurity region 13*nl* referred to as an LDD region is formed between the one n-type high-concentration impurity region 13*nd* functioning as a drain region in the semiconductor layer 12*a*, and the channel region 13*c*.

In the channel region 13*c*, a p-type impurity such as boron (B) is included in order to control the threshold voltage. An n-type impurity such as phosphorus (P) is included in the respective n-type high-concentration impurity regions 13*ns* and 13*nd*. In addition, n-type impurities such as phosphorus (P) are also included in the n-type low-concentration impurity region 13*nl* at a lower concentration than the n-type high-concentration impurity region 13*ns* and 13*nd*.

The gate insulating film 14 is made of silicon nitride or silicon oxide, for example. The gate electrode 15*a* is made of aluminum (Al), tantalum (Ta), titanium (Ti), molybdenum-tungsten (MoW), chromium (Cr), or the like, for example.

Also, an interlayer insulating film 16 is formed on the gate insulating film 14 so as to cover the gate electrode 15*a*. In the interlayer insulating film 16 and the gate insulating film 14, contact holes 17 penetrating the insulating films 14 and 16 and reaching the semiconductor layer 12*a* are formed in positions respectively corresponding to the pair of n-type high-concentration impurity regions 13*ns* and 13*nd* in the semiconductor layer 12*a*.

These contact holes 17 are filled with a conductive material such as aluminum (Al), tantalum (Ta), titanium (Ti), molybdenum-tungsten (MoW), or chromium (Cr), for example. The source electrode 18*a* and the drain electrode 19*a* are provided on the interlayer insulating film 16.

The source electrode 18*a* is connected to the n-type high-concentration impurity region 13*ns* functioning as the source region through one contact hole 17. On the other hand, the drain electrode 19*a* is connected to the n-type high-concentration impurity region 13*nd* functioning as the drain region through the other contact hole 17. The source electrode 18*a* and the drain electrode 19*a* are made of the same material as the above-mentioned conductive material.

The n-type TFT 20LNa having the single LDD structure described above is covered by a protective insulating film 21. The protective insulating film 21 is made of an acrylic-based organic insulating material, for example. Although not shown in the drawings, conductive parts such as electrodes and wiring lines are formed on the protective insulating film 21 as needed. The conductive parts are connected to the drain electrode 19a and the like of the TFT 20LNa through contact holes formed in the protective insulating film 21, for example.

—Manufacturing Method—

Next, one example of a manufacturing method for the semiconductor S will be described with reference to FIGS. 3(a) to 3(c) to FIGS. 10(a) to 10(c).

Figure 4:
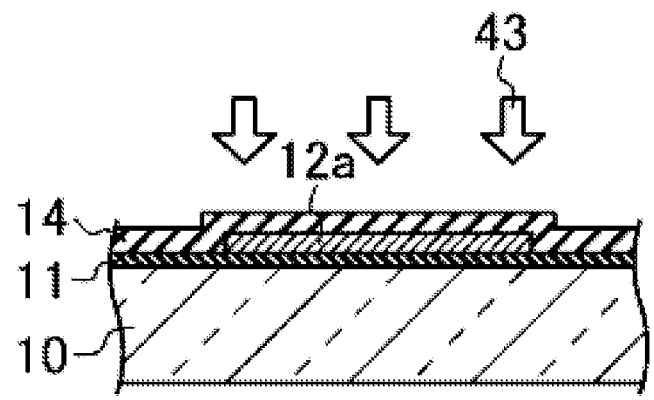
FIG. 4 is a cross-sectional view corresponding to a view of FIG. 2 showing a step of forming a gate insulating film and a step of adjusting an impurity level in the manufacturing method for a semiconductor device according to Embodiment 1.
Figure 5:
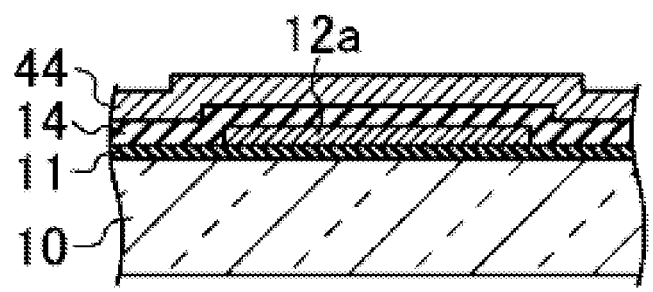
FIGS. 5(a) to 5(c) are cross-sectional views corresponding to the view of FIG. 2, illustrating the first half of a process to form gate electrodes in the manufacturing method for a semiconductor device of Embodiment 1.
Figure 5:
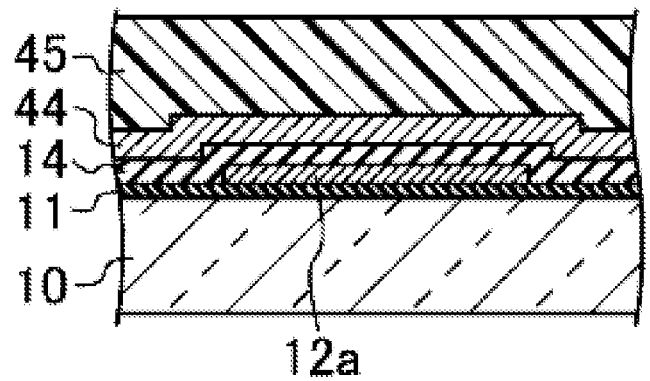
Figure 5:
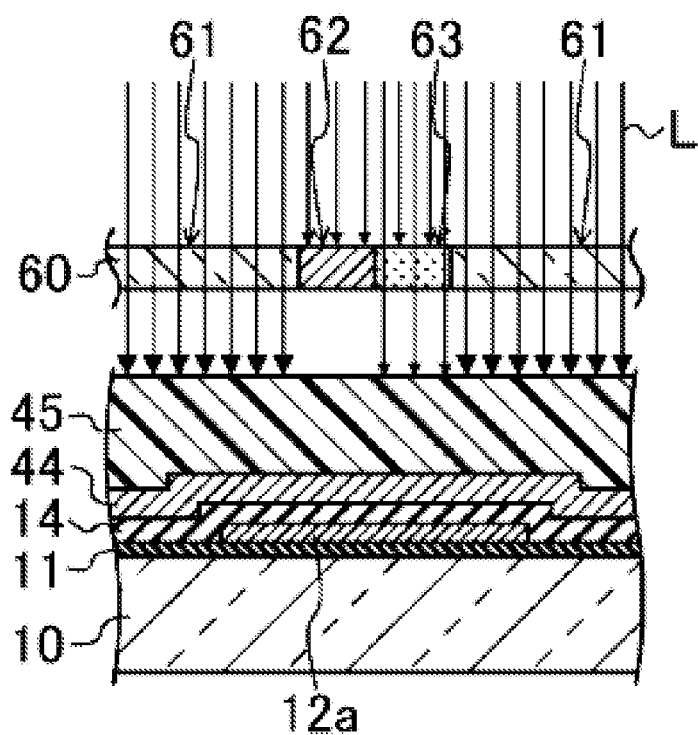
Figure 6:
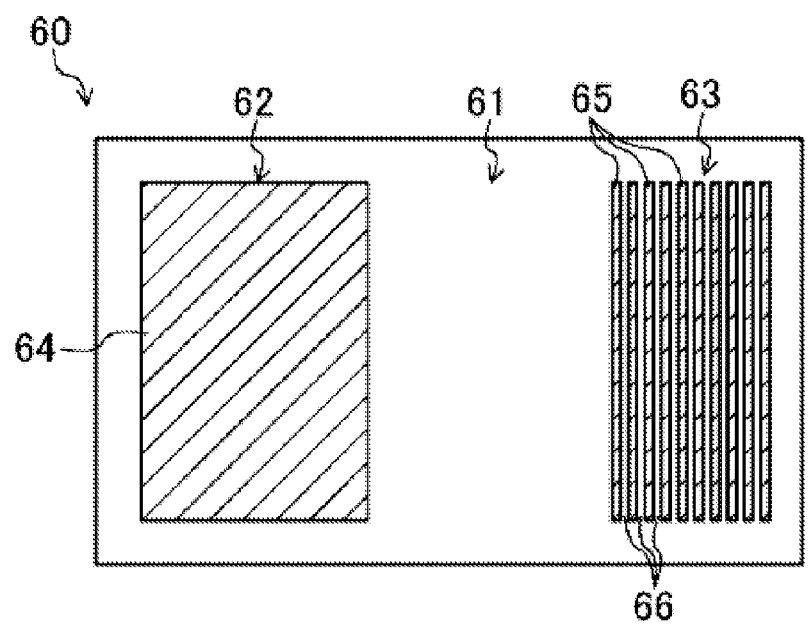
FIG. 6 is a plan view that schematically shows a configuration of a gray tone mask used in the manufacturing method for a semiconductor layer of Embodiment 1.
Figure 7:
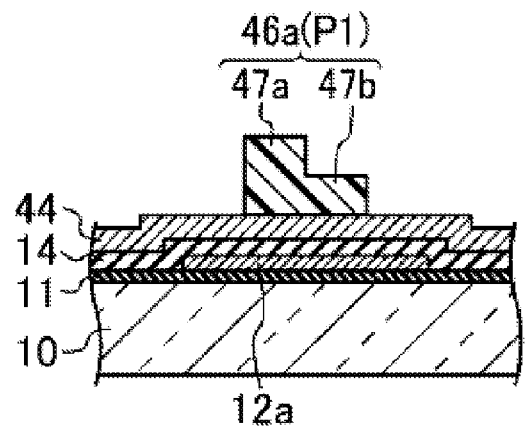
FIGS. 7(a) and 7(b) are cross-sectional views corresponding to the view of FIG. 2, illustrating the second half of the process to form gate electrodes in the manufacturing method for a semiconductor device of Embodiment 1.
Figure 7:
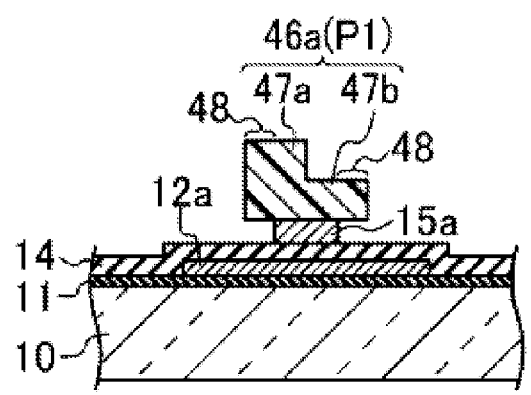
Figure 8:
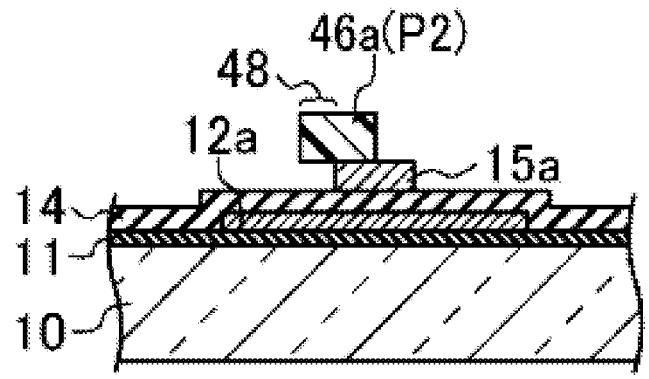
FIGS. 8(a) and 8(b) are cross-sectional views corresponding to the view of FIG. 2, illustrating a process to form n-type high-concentration impurity regions in the manufacturing method for a semiconductor device of Embodiment 1.
Figure 8:
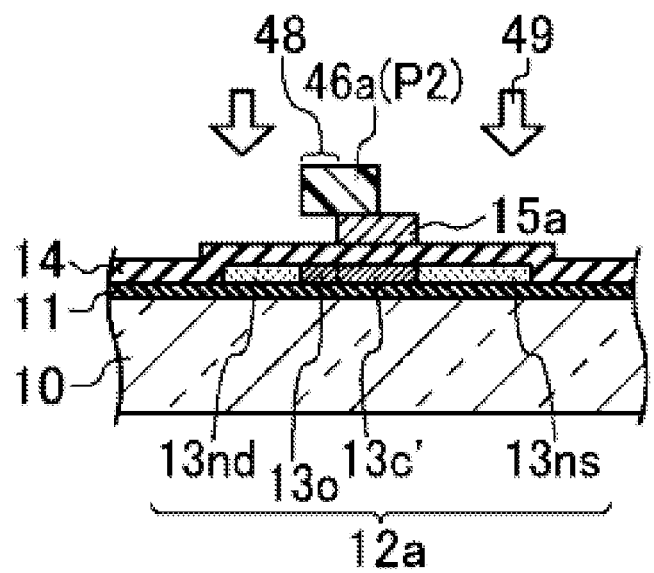
Figure 9:
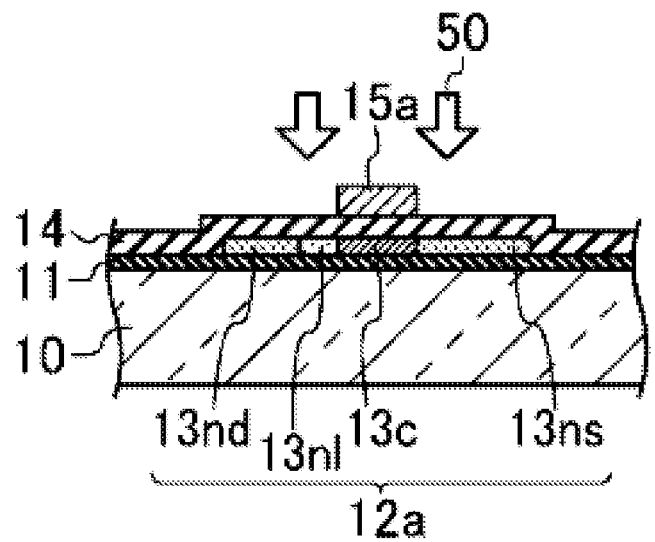
FIG. 9 is a cross-sectional view corresponding to the view of FIG. 2, illustrating a process to form n-type low-concentration impurity regions in the manufacturing method for a semiconductor device of Embodiment 1.
Figure 10:
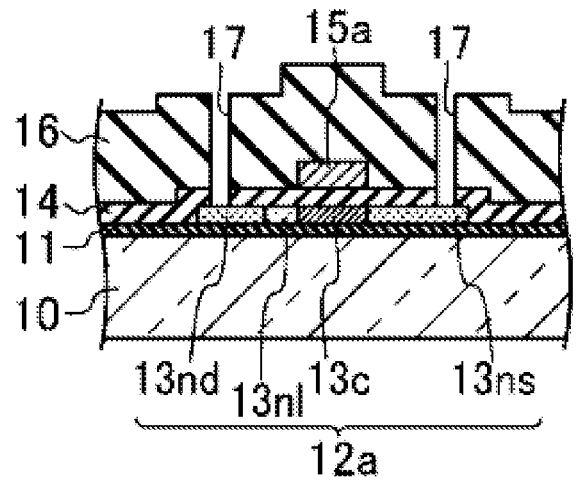
FIGS. 10(a) to 10(c) are cross-sectional views corresponding to the view of FIG. 2, illustrating respective steps after a step to form an interlayer insulating film in the manufacturing method for a semiconductor device of Embodiment 1.
Figure 10:
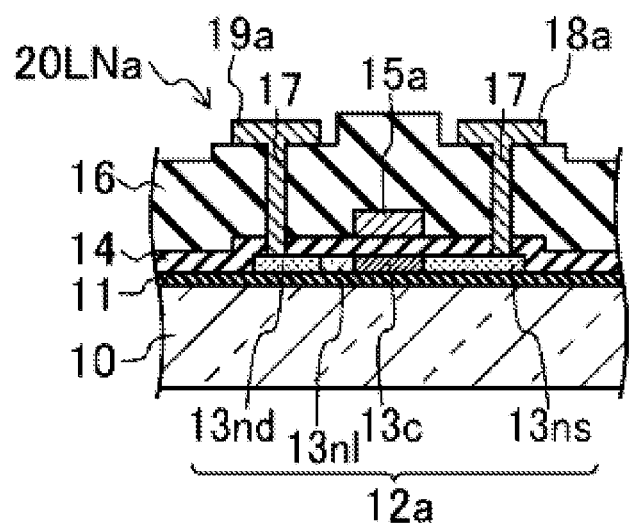
Figure 10:
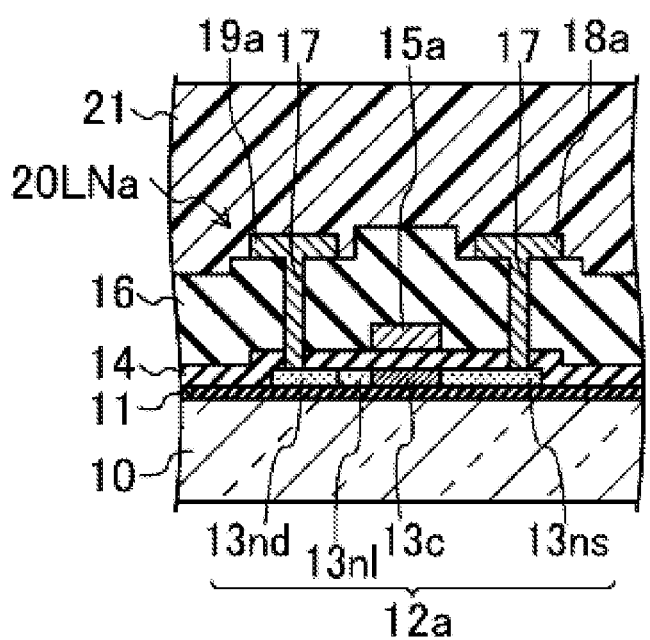

FIGS. 3(a) to 3(c) are cross-sectional views showing a semiconductor layer forming process. FIG. 4 is a cross-sectional view illustrating a gate insulating film forming process and an impurity level adjusting process. FIGS. 5(a) to 5(c) are cross-sectional views illustrating the first half of a gate electrode forming process. FIG. 6 is a schematic plan view of a gray-tone mask 60 that is used in the gate electrode forming process. FIGS. 7(a) and 7(b) are cross-sectional views illustrating the second half of the gate electrode forming process. FIGS. 8(a) and 8(b) are cross-sectional views illustrating an n-type high-concentration impurity region forming process. FIG. 9 is a cross-sectional view illustrating an n-type low-concentration impurity region forming step. FIGS. 10(a) to 10(c) are cross-sectional views showing respective processes after an interlayer insulating film forming process. FIGS. 3(a) to 3(c) to FIGS. 5(a) to 5(c) and FIGS. 7(a) and 7(b) to FIGS. 10(a) to 10(c) respectively show portions corresponding to FIG. 2.

The manufacturing method for the semiconductor device S according to the present embodiment includes a base insulating film forming process, a semiconductor layer forming process, a gate insulating film forming process, an impurity level adjusting process, a gate electrode forming process, an n-type high-concentration impurity region forming process, an n-type low concentration impurity region forming process, an interlayer insulating film forming process, a source/drain electrode forming process, and a protective insulating film forming process.

<Base Insulating Film Forming Process>

First, an insulating substrate 10 made of a glass substrate or the like that acts as a base substrate is prepared. Thereafter, by depositing a silicon nitride film and a silicon oxide film in this order by the CVD (chemical vapor deposition) method on the prepared insulating substrate 10, a base insulating film 11 made of these films is formed.

<Semiconductor Layer Forming Process>

As shown in FIG. 3(a), on the substrate where the base insulating film 11 is formed, an amorphous silicon film 40 (approximately 40 nm to 50 nm thick, for example), which is an amorphous semiconductor film, is deposited by the LPCVD (low pressure CVD) method.

Next, by radiating a laser beam 41 such as an excimer laser or a YAG (yttrium aluminum garnet) laser onto the amorphous silicon film 40, as shown in FIG. 3(b), the amorphous silicon film 40 is crystallized, forming a polysilicon film 42, which is a type of crystalline semiconductor film.

Next, by patterning the polysilicon film 42 by photolithography using a first photomask, as shown in FIG. 3(c), the semiconductor layer 12a is formed. In the present embodiment, at this point, the energy level of the semiconductor layer 12a is moved toward the donor level as a result of being affected by the base insulating film 11.

In the present embodiment, the polysilicon film 42 is obtained by crystallizing the amorphous silicon film 40 by laser irradiation, but the present invention is not limited thereto. The polysilicon film 42 may be formed by solid phase crystallization (SPC) in which the amorphous silicon film 40 is crystallized by adding a metal element such as nickel (Ni) as a catalyst element to as to promote crystallization of the amorphous silicon film 40 and then performing heat treatment thereon, for example, or by another known method.

This semiconductor layer forming process corresponds to a semiconductor layer forming step in the present invention.

<Gate Insulating Film Forming Process>

As shown in FIG. 4, on the substrate upon which the semiconductor layer 12a is formed, a silicon nitride film or a silicon oxide film (approximately 50 nm to 120 nm in thickness, for example) is formed so as to cover the semiconductor layer 12a, and this is the gate insulating film 14.

The gate insulating film forming process corresponds to a gate insulating film forming step in the present invention.

<Impurity Level Adjusting Process>

Boron (B) is implanted at a low concentration as the p-type impurity in the entire semiconductor layer 12a covered by the gate insulating film 14 by ion doping.

As a result, the impurity level of the semiconductor layer 12a is set to an acceptor level, and the depth thereof is adjusted such that the conductive characteristics of the channel region 13c to be formed later bring about a prescribed threshold voltage in the n-type TFT 20LNa included in the semiconductor layer 12a. The arrows 43 shown in FIG. 4 indicate the direction in which the boron (B) is implanted in this process.

The impurity level adjusting process does not necessarily have to be conducted, and may be conducted as necessary, taking into account the type and depth of the impurity level of the semiconductor layer 12a.

<Gate Electrode Forming Process>

As shown in FIG. 5(a), on the substrate provided with the semiconductor layer 12a having the impurity level thereof adjusted, a metal film of aluminum (Al), tantalum (Ta), titanium (Ti), molybdenum-tungsten (MoW), chromium (Cr), or the like, or a multilayer film including these is formed, for example, and this is a conductive film 44 for forming the gate electrode (conductive film forming step).

Next, as shown in FIG. 5(b), the conductive film 44 that is used to form gate electrodes is coated with a positive type photosensitive resin by the spin-coating method or the slit-coating method, thereby forming a photosensitive resin film 45 (approximately 1 μm to 2 μm in thickness, for example) (photosensitive resin film forming step).

Next, as shown in FIG. 5(c), an exposure process is conducted by using a second photomask to control an amount of exposure light that is radiated to the uncured photosensitive resin film 45. In this exposure process, a gray tone mask 60 shown in FIG. 6 that is a type of a multiple gradation mask is used as the second photomask.

As shown in FIG. 6, the gray tone mask 60 has a transmissive portion 61 that transmits light, a light-shielding portion 62 that transmits no light, and a semi-transmissive portion 63 that partially blocks light. In the light-shielding portion 62, a light-shielding film 64 is formed on the entire surface. In the semi-transmissive portion 63, a plurality of light-shielding layers 65 are arranged in a stripe pattern, and slits 66 are provided between the respective light-shielding layers 65 in a pitch that is less than or equal to the resolution of the exposure apparatus.

In the gray tone mask 60 used in the present embodiment, the light-shielding portion 62 is formed over one side (left side of FIG. 5(c)) of the region where the gate electrode is to be formed over the semiconductor layer 12a, when the gray tone mask 60 is disposed in a prescribed position to face the photosensitive resin film 45. On the other hand, the semi-transmissive portion 63 is formed over the other side a region where a gate electrode is to be formed (right side of FIG. 5(c)) above the semiconductor layer 12a when the gray tone mask 60 is disposed at a prescribed position to face the photosensitive resin film 45.

When conducting an exposure process on the photosensitive resin film 45, as shown in FIG. 5(c), the gray tone mask 60 is placed at the prescribed location so as to face the photosensitive resin film 45, and thereafter, ultraviolet light L is radiated from the side of the gray tone mask 60 opposite to the insulating substrate 10. In this way, the exposure process is conducted on the photosensitive resin film 45 through the gray tone mask 60.

Because the stripe pattern of the semi-transmissive portion 63 made of the light-shielding layers 65 is very fine, when the exposure process is conducted on the photosensitive resin film 45 through the semi-transmissive portion 63, the portion of the photosensitive resin film 45 is evenly exposed to a smaller amount of light than the transmissive portion 61 as a result of the light amount being reduced by the light-shielding layers 65, instead of being exposed to light in a stripe pattern.

As a result, in the photosensitive resin film 45, one side portion of the region in the light-shielding portion 62 corresponding to where the gate electrode is to be formed (left side of FIG. 5(c)) is completely unexposed to light, and the other side portion (right side portion of FIG. 5(c)) of the region facing the semi-transmissive portion 63 where the gate electrode is to be formed is exposed to less light than a portion facing the transmissive portion 61.

Thereafter, a developing process is conducted on the photosensitive resin film 45 that underwent the exposure process. As a result, the photosensitive resin film 45 is patterned, and as shown in FIG. 7(a), a resist layer 46a having different thicknesses on either side is formed in order to form the gate electrode (photosensitive resin film patterning step).

More specifically, the region where the gate electrode is to be formed facing the semiconductor layer 12a is provided with a thick film portion 47a (approximately 1 μm to 2 μm in thickness, for example) that is relatively thick where the drain region is to be formed and a thin film portion 47b (approximately 0.5 μm to 1 μm in thickness, for example) that is relatively thin where the source region is to be formed, and a resist layer 46a that is somewhat wider than the gate electrode 15a to be formed is provided at the region where the gate electrode is to be formed. This resist layer 46a constitutes a first resist pattern P1.

Then, with the resist layer 46a as a mask, the conductive film 44 is patterned with isotropic wet etching, and thus, as shown in FIG. 7(b), the gate electrode 15a is formed in a position corresponding to the semiconductor layer 12a (conductive film patterning step).

At this time, the etching time is adjusted, and by side etching, the conductive film 44 portion overlapping the periphery of the resist layer 46a is also removed, and the gate electrode 15a is formed narrower than the resist layer 46a, so as to be recessed towards the interior of the resist layer 46a. As a result, the resist layer 46a has overhang portions 48 that hang over both sides of the gate electrode 15a in an eave shape.

<n-Type High-Concentration Impurity Region Forming Process>

As shown in FIG. 8(a), the resist layer 46a is gradually recessed from the surface by ashing, and once the entire thin film portion 47b is removed, ashing is stopped (thin film portion removal step).

As a result, the thin film portion 47b is completely removed, and the thick film portion 47a remains in a thinned state, and an overhang portion 48 of the resist layer 46a hangs over only one side portion of the gate electrode 15a. The resist layer 46a including the thick film portion remaining at this stage constitutes a second resist pattern P2.

Next, as shown in FIG. 8(b), with the resist layer 46a and the gate electrode 15a as masks, by performing ion doping on the semiconductor layer 12a, phosphorus (P) is implanted at a high concentration as the n-type impurity (high-concentration impurity implantation step; impurity implantation step). The arrows 49 shown in FIG. 8(b) indicate a direction in which the phosphorus (P) is implanted.

As a result, on both positions of the semiconductor layer 12a corresponding to the resist layer 46a and the gate electrode 15a, n-type high-concentration impurity regions 13ns and 13nd that respectively function as the source region and the drain region are formed.

In other words, in the semiconductor layer 12a, the n-type high-concentration impurity region 13ns that functions as the source region is formed on one side of the channel region forming portion 13c' (right side of FIG. 8(b)) formed corresponding to the gate electrode 15a without a gap between the channel region forming portion 13c' and the n-type high-concentration impurity region 13ns. On the other side (left side of FIG. 8(b)) of the channel region forming portion 13c', the n-type high-concentration impurity region 13nd that functions as the drain region is formed with a gap from the channel region forming portion 13c', the gap corresponding in size to the overhang of the overhang portion 48 of the resist layer 46a. Between the n-type high-concentration impurity region 13nd functioning as the drain region and the channel region forming portion 13c' in the semiconductor layer 12a, an offset region 13o where the impurity is not implanted is formed.

<n-Type Low-Concentration Impurity Region Forming Process>

As stated above, after forming the respective n-type high-concentration impurity regions 13ns and 13nd in the semiconductor layer 12a, the remaining resist layer 46a is completely removed by a resist removal solution or ashing (resist layer removal step).

Thereafter, as shown in FIG. 9, by ion-doping, phosphorus (P) as an n-type impurity is injected at a low concentration into the semiconductor layer 12a by using the gate electrode 15a as a mask (low-concentration impurity implantation step). The arrows 50 shown in FIG. 9 indicate a direction in which the phosphorus (P) is injected in this step.

As a result, phosphorus (P) is additionally implanted in the respective n-type high-concentration impurity regions 13ns and 13nd of the semiconductor layer 12a. Additionally, phosphorus (P) is also implanted in the offset region 13o, forming an n-type low-concentration impurity region 13nl in the offset region 13o. Also, at the portion of the semiconductor layer 12a below the gate electrode 15a, a channel region 13c is formed in a self-aligned manner.

<Interlayer Insulating Film Forming Process>

On the substrate including the semiconductor layer 12a in which the channel region 13c, the n-type low-concentration impurity region 13nl, and the n-type high-concentration impurity regions 13ns and 13nd are formed, a silicon nitride film and a silicon oxide film are formed in this order by the CVD method, thus forming the interlayer insulating film 16 of a multilayer film including the aforementioned films.

The interlayer insulating film 16 and the gate insulating film 14 are patterned by photolithography using a third photomask, and as shown in FIG. 10(a), contact holes 17 reaching the respective pair of n-type high-concentration impurity regions 13ns and 13nd in the semiconductor layer 12a are formed in the insulating films 14 and 16.

<Source/Drain Electrode Forming Process>

On the substrate upon which the interlayer insulating film 16 is formed, a metal film of aluminum (Al), tantalum (Ta), titanium (Ti), molybdenum-tungsten (MoW), chromium (Cr), or the like or a multilayer film including these, for example, is formed into conductive films to be used as the source electrode 18a and the drain electrode 19a by sputtering.

As shown in FIG. 10(b), by patterning these conductive films by photolithography using a fourth photomask, the source electrode 18a and the drain electrode 19a are formed.

<Protective Insulating Film Forming Process>

The substrate on which the source electrode 18a and drain electrode 19a are formed is coated with an acrylic organic insulating resin by a spin-coating method or a slit-coating method, thereby forming an insulating film.

Thereafter, by patterning the uncured insulating film through an exposure process using a fifth photomask and then a developing process, as shown in FIG. 10(c), a protective insulating film 21 is formed. If, at this time, conductive portions are formed on the protective insulating film 21, contact holes are formed in the protective insulating film 21 in order to establish contact or the like between the drain electrode 19a of the single LDD structure n-type TFT 20LNa and the conductive portions.

Thereafter, as necessary, conductive portions such as electrodes and wiring lines for establishing connection with the TFT 20LNa through the contact holes previously formed by photolithography using a sixth photomask are formed on the substrate upon which the protective insulating film 21 is formed.

By performing the respective processes, a semiconductor device S including single LDD structure n-type TFTs 20LNa can be manufactured.

—Effects of Embodiment 1—

According to Embodiment 1, with one photomask (gray tone mask 60), two resist patterns P1 and P2 are formed. In other words, a first resist pattern P1 made of the resist layer 46a having a thick film portion 47a and a thin film portion 47b in the gate electrode forming step and the n-type high-concentration impurity region forming step, and a second resist pattern P2 made of the resist layer 46a only in the thick film portion that was thinned in the n-type low-concentration impurity region forming step are formed. The first resist pattern P1 is used as a mask for the gate electrode 15a, and the second resist pattern P2 is used as a mask in the position where the low-concentration impurity region 13nl for implanting the impurity in the semiconductor layer 12a is formed. Thus, only one photomask is necessary for the resist layer 46a for forming the gate electrode 15a and the resist layer 46a for implanting the impurity in the semiconductor layer 12a.

The main cause of variation in the line width of the low-concentration impurity region 13nl becomes variation in the line width of the gate electrode 15a due to side etching, and thus, other factors that have a great impact on the line width of the low-concentration impurity region 13nl disappear. Therefore, it is possible to mitigate variation in line width of the low-concentration impurity region 13nl. The impurity is implanted at a high concentration in the semiconductor layer 12a only through the gate insulating film 14, and thus, variation in sheet resistance of the low-concentration impurity region 13nl can be mitigated compared to when implantation of the impurity at a high concentration is performed through the gate electrode as disclosed in Patent Document 2. As a result, it is possible to minimize factors resulting in variation in TFT characteristics, thus stably producing single LDD structure n-type TFTs 20LNa with excellent characteristics.

Thus, it is possible to stably produce single LDD structure n-type TFTs 20LNa having excellent characteristics, and it is possible to manufacture the semiconductor device S having the n-type TFTs 20LNa at a low cost by using a small number of photomasks and reducing the number of steps.

Modification Example of Embodiment 1

Figure 11:
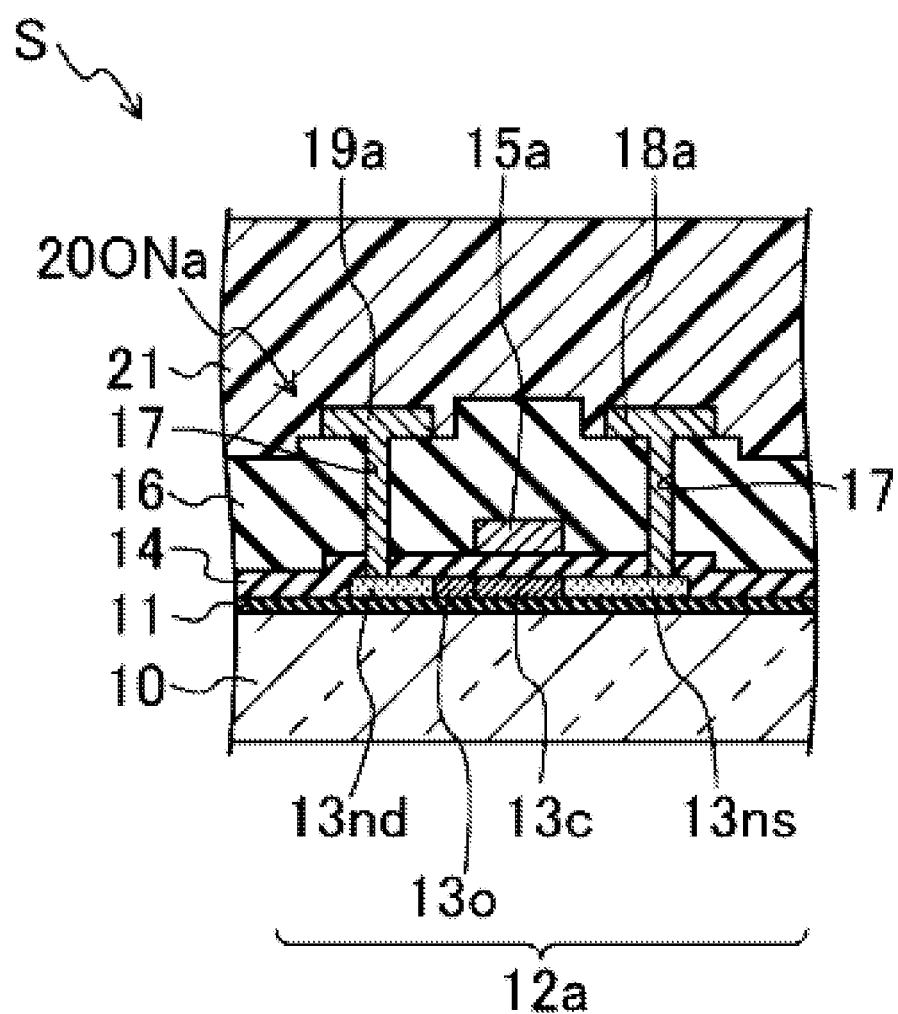
FIG. 11 shows a cross-sectional view illustrating a cross-sectional structure of a TFT of a single offset structure included in a semiconductor device according to a modification example of Embodiment 1.
Figure 12:
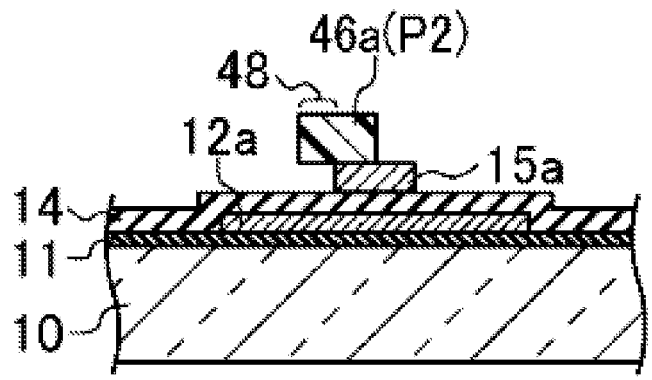
FIGS. 12(a) to 12(c) are cross-sectional views corresponding to the view of FIG. 11, illustrating a process to form n-type high-concentration impurity regions in a manufacturing method for a semiconductor device of the modification example of Embodiment 1.
Figure 12:
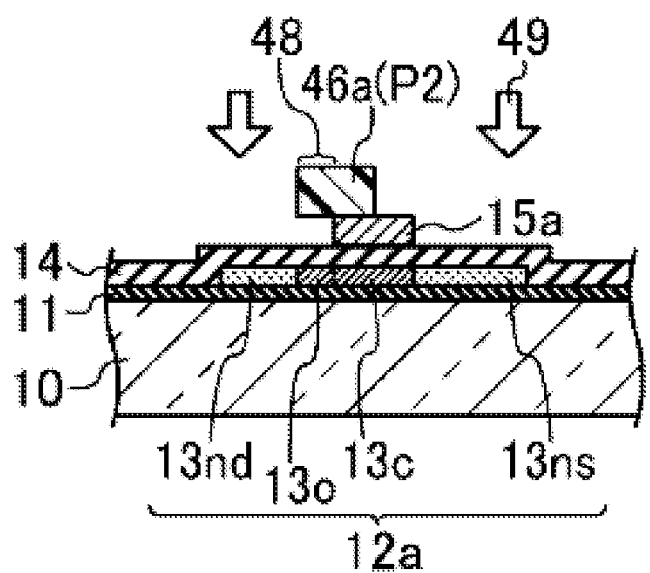
Figure 12:
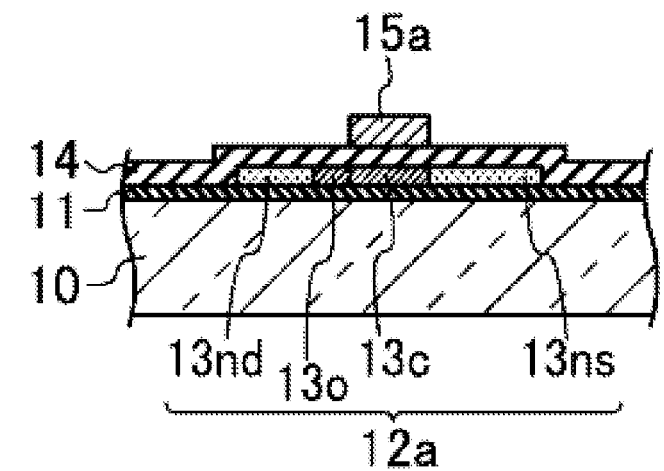
Figure 13:
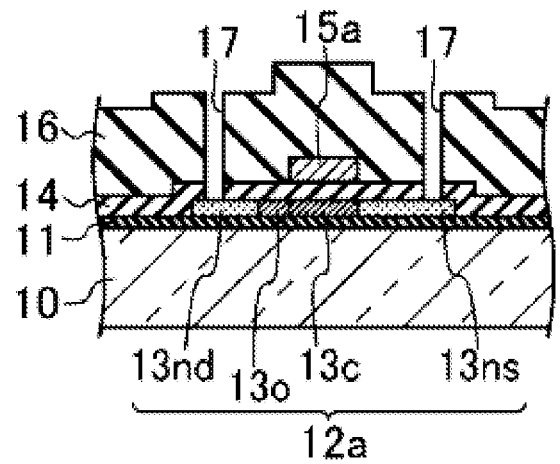
FIGS. 13(a) to 13(c) are cross-sectional views illustrating respective steps after a step to form an interlayer insulating film in the manufacturing method for a semiconductor device of a modification example of Embodiment 1.
Figure 13:
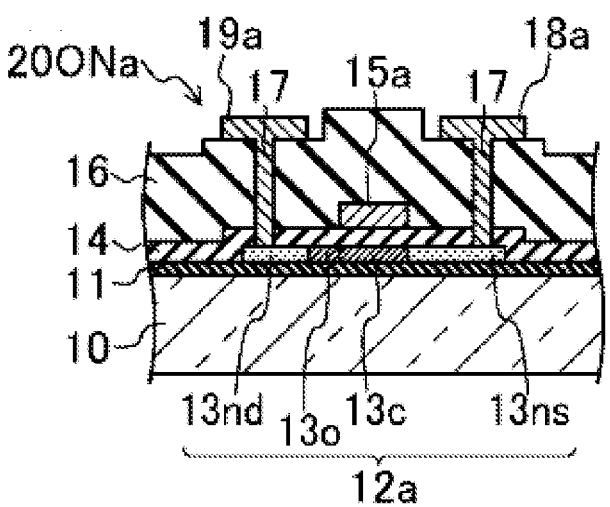
Figure 13:
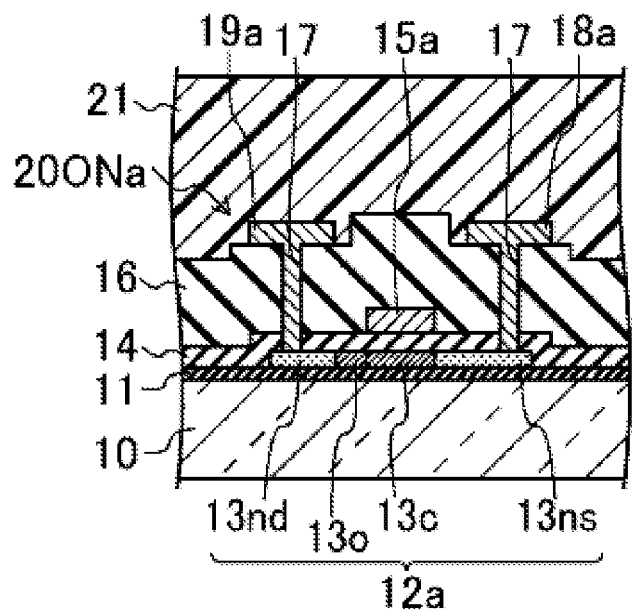

FIG. 11 is a cross-sectional view showing a cross-sectional structure of a single offset structure n-type TFT 20ONa included in a semiconductor device S of the present modification example.

The semiconductor device S of the present modification example includes a single offset structure n-type TFT 20ONa instead of a single LDD structure n-type TFT 20LNa. The single offset structure TFT 20ONa has the same top gate structure as the single LDD structure n-type TFT 20LNa.

In a portion of the semiconductor layer 12a corresponding to a gate electrode 15a, a channel region 13c is formed, as in Embodiment 1. Additionally, n-type high-concentration impurity regions 13ns and 13nd functioning respectively as the source region and the drain region are formed on both sides of the channel region 13c. An offset region 13o is formed instead of an n-type low-concentration impurity region 13nl between one n-type high-concentration impurity region 13nd functioning as the drain region and the channel region 13c in the semiconductor layer 12a. A p-type impurity such as boron (B) is included in the offset region 13o, as in the channel region 13c, having the same impurity concentration as the channel region 13c.

—Manufacturing Method—

A manufacturing method for a semiconductor device S including a single offset structure n-type TFT 20ONa as described above will be described as an example with reference to FIGS. 12(a) to 12(c) to FIGS. 13(a) to 13(c).

FIGS. 12(a) to 12(c) are cross-sectional views illustrating an n-type high-concentration impurity region forming process. FIGS. 13(a) to 13(c) are cross-sectional views showing respective processes after an interlayer insulating film forming process. FIGS. 12(a) to 12(c) and FIGS. 13(a) to 13(c) respectively show portions corresponding to FIG. 11.

The manufacturing method for the semiconductor device S according to the present modification example includes a base insulating film forming process, a semiconductor layer forming process, a gate insulating film forming process, an impurity level adjusting process, a gate electrode forming process, an n-type high-concentration impurity region forming process, an interlayer insulating film forming process, a source/drain electrode forming process, and a protective insulating film forming process, and does not include an n-type low concentration impurity region forming process.

Because the base insulating film forming process, the semiconductor layer forming process, the gate insulating film forming process, the impurity level adjusting process, and the gate electrode forming process are similar to those in Embodiment 1 above, detailed descriptions thereof are omitted.

<n-Type High-Concentration Impurity Region Forming Process>

As shown in FIG. 12(a), the resist layer 46a is gradually recessed from the surface by ashing after the gate electrode 15a is formed in the gate electrode forming process, and once the entire thin film portion 47b is removed, ashing is stopped (thin film portion removal step).

As a result, the thin film portion 47b is completely removed, and the thick film portion 47a remains in a thinned state, and an overhang portion 48 of the resist layer 26a hangs over only one side portion of the gate electrode 15a. The resist layer 46a remaining at this stage including the thick film portion constitutes a second resist pattern P2.

Next, as shown in FIG. 12(b), with the resist layer 46a and the gate electrode 15a as masks, by performing ion doping on the semiconductor layer 12a, phosphorus (P) is implanted at a high concentration as the n-type impurity (impurity implantation step).

As a result, on both positions of the semiconductor layer 12a corresponding to the resist layer 46a and the gate electrode 15a, n-type high-concentration impurity regions 13ns and 13nd that respectively function as the source region and the drain region are formed. At this time, the n-type high-concentration impurity region 13nd functioning as the drain region is formed with a gap from the position corresponding to the gate electrode 15a, the gap being equivalent in width to the overhang of the overhang portion 48 of the resist layer 46a. In addition, the channel region 13c is formed in the position of the semiconductor layer 12a corresponding to the gate electrode 15a, and the offset region 13o is formed between the channel region 13c and the n-type high-concentration impurity region 13nd functioning as the drain region.

Thereafter, as shown in FIG. 12(c), the remaining resist layer 46a is completely removed by a resist removal solution, ashing, or the like.

<Respective Processes after Interlayer Insulating Film Forming Process>

After the n-type high-concentration impurity region forming process, in a manner similar to Embodiment 1 above, as shown in FIGS. 13(a) to 13(c), the interlayer insulating film forming process, the source/drain electrode forming process, and the protective insulating film forming process are conducted in this order.

As described above, the semiconductor device S including the single offset structure TFTs 20ONa can be manufactured without implanting impurities in the offset region 13o of the semiconductor layer 12a in the respective steps after forming the n-type high-concentration impurity regions 13ns and 13nd.

—Effects of Modification Example of Embodiment 1—

According to this modification example, it is possible to attain effects similar to Embodiment 1, and impurity implantation (low-concentration impurity implantation step) to the offset region 13o of the semiconductor layer 12a is unnecessary, and thus, compared to a case in which a single LDD structure n-type TFT 20LNa is formed as in Embodiment 1, it is possible to reduce the number of steps to an excellent degree and to manufacture the semiconductor device S more inexpensively.

Embodiment 2

Figure 14:
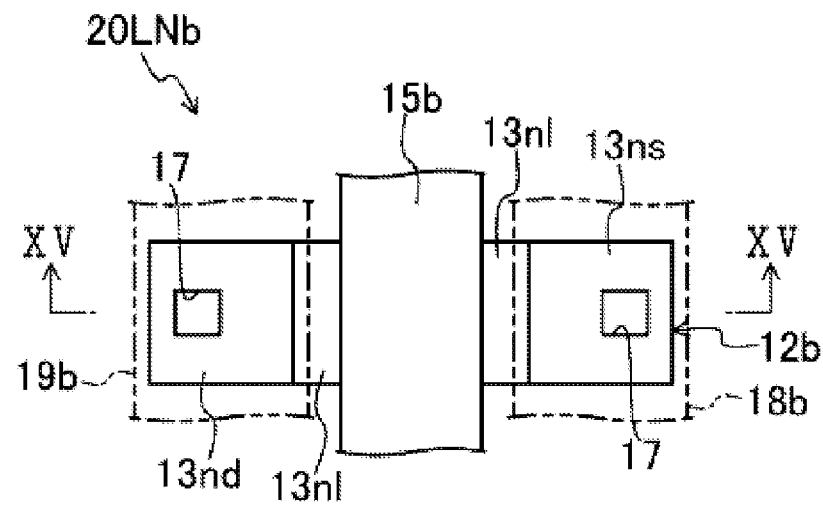
FIG. 14 is a plan view that schematically shows a double LDD structure TFT included in a semiconductor device of Embodiment 2.
Figure 15:
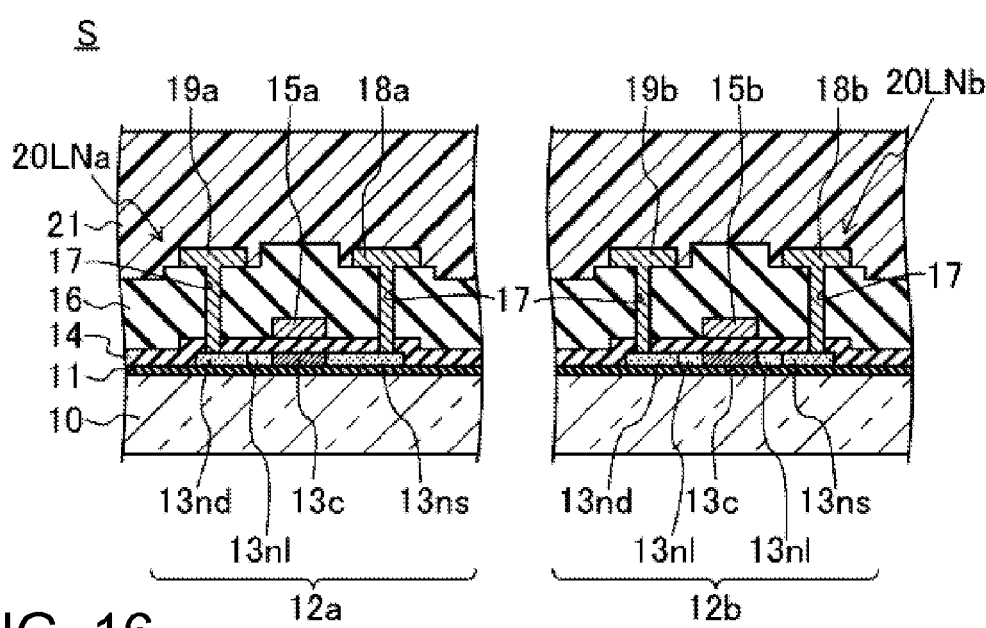
FIG. 15 shows cross-sectional views in order from the left side of the page showing cross-sectional structures of a single LDD structure TFT and a double LDD structure TFT included in the semiconductor device of Embodiment 2.

FIG. 14 is a schematic plan view showing a double LDD structure n-type TFT 20LNb included in a semiconductor device S of Embodiment 2. FIG. 15 is a cross-sectional view showing in order from the left side of the page the cross-sectional structures of a single LDD structure n-type TFT 20LNa and a double LDD structure n-type TFT 20LNb. In FIG. 15, the cross-sectional view of the double LDD structure n-type TFT 20LNb shows a cross-section structure of FIG. 14 along the line XV-XV. In the embodiments below, the same configurations as those in FIGS. 1 to 13(a) to 13(c) are given the same reference characters and the same descriptions as those in Embodiment 1 above, and detailed descriptions thereof are omitted.

As shown in FIG. 15, the semiconductor device S of the present embodiment, in addition to the single LDD structure TFTs 20LNa, also has double LDD structure TFTs 20LNb on the insulating substrate 10.

The single LDD structure n-type TFT 20LNa has the same structure as the n-type TFT 20LNa of the same structure described in Embodiment 1, and includes a first semiconductor layer 12a corresponding to the above-mentioned semiconductor layer 12a.

As shown in FIGS. 14 and 15, the double LDD structure n-type TFT 20LNb has the same top gate structure as the single LDD structure n-type TFT 20LNa. The double LDD structure n-type TFT 20LNb includes, on the insulating substrate 10, a second semiconductor layer 12b provided on a base insulating film 11, a gate insulating film 14 provided so as to cover the second semiconductor layer 12b, a gate electrode 15b provided on the gate insulating film 14 so as to correspond in position to the center of the second semiconductor layer 12b, and a source electrode 18b and a drain electrode 19b (shown with the two-dot chain lines in FIG. 14) connected to the second semiconductor layer 12b separated from each other with the gate electrode 15b therebetween.

The second semiconductor layer 12b is made of the same crystalline semiconductor as the first semiconductor layer 12a, such as polysilicon. In the second semiconductor layer 12b, a channel region 13c is formed in a position corresponding to the gate electrode 15a, and a pair of n-type high-concentration impurity regions 13ns and 13nd, which respectively function as the source region and the drain region, are formed on both sides of the channel region 13c at a prescribed gap from the channel region 13c. In the second semiconductor layer 12b, n-type low-concentration impurity regions 13nl are provided respectively between the channel region 13c, and the n-type high-concentration impurity regions 13ns and 13nd.

As in the first semiconductor layer 12a, an n-type impurity such as phosphorus (P) or a p-type impurity such as boron (B) is included in the channel region 13c, the n-type low-concentration impurity regions 13nl and the n-type high-concentration impurity regions 13ns and 13nd of the second semiconductor layer 12b.

The gate insulating film 14 is made of the same film for the single LDD structure n-type TFT and the double LDD structure n-type TFT 20LNb. The gate electrode 15b of the double LDD structure n-type TFT 20LNb is made of the same material as the gate electrode 15a of the single LDD structure n-type TFT 20LNa. The source electrode 18b and the drain electrode 19b of the double LDD structure n-type TFT 20LNb are also made of the same material as the source electrode 18a and the drain electrode 19a of the single LDD structure n-type TFT 20LNa.

—Manufacturing Method—

Next, one example of a manufacturing method for a semiconductor device S including the single LDD structure TFT 20LNa and the double LDD structure TFT 20LNb described above will be described with reference to FIGS. 16 to 22(a) to 22(c).

Figure 16:
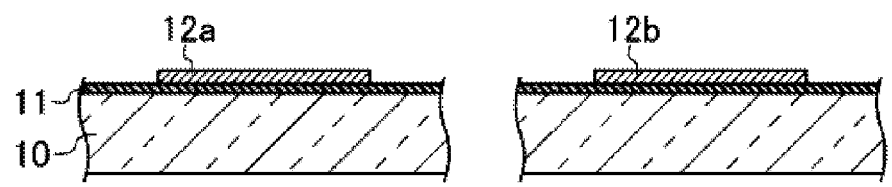
FIG. 16 shows cross-sectional views corresponding to the respective views of FIG. 15, illustrating a process to form a semiconductor layer in a manufacturing method for a semiconductor device of Embodiment 2.
Figure 17:
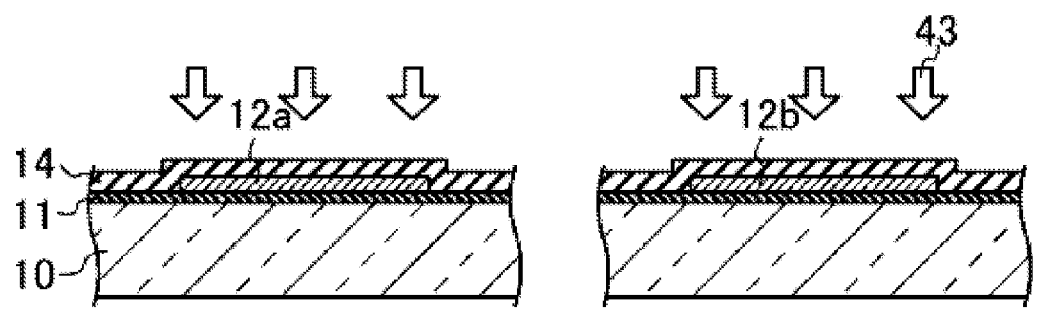
FIG. 17 shows cross-sectional views corresponding to the respective views of FIG. 15 showing a step of forming a gate insulating film and a step of adjusting an impurity level in the manufacturing method for a semiconductor device according to Embodiment 2.
Figure 18:
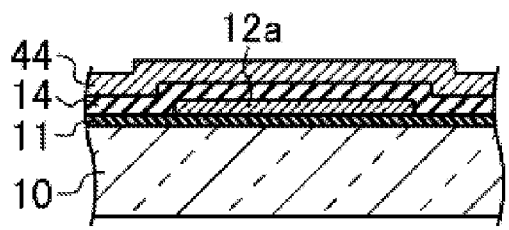
FIGS. 18(a) to 18(c) are cross-sectional views corresponding to the respective views of FIG. 15, illustrating the first half of a process to form gate electrodes in the manufacturing method for a semiconductor device of Embodiment 2.
Figure 18:
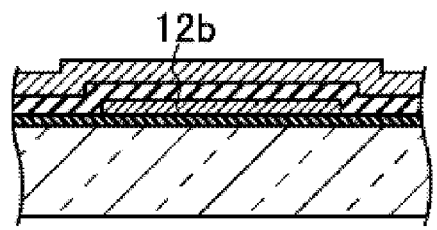
Figure 18:
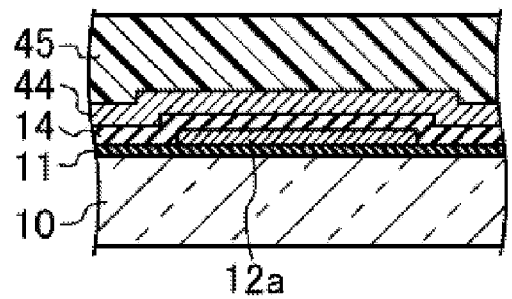
Figure 18:
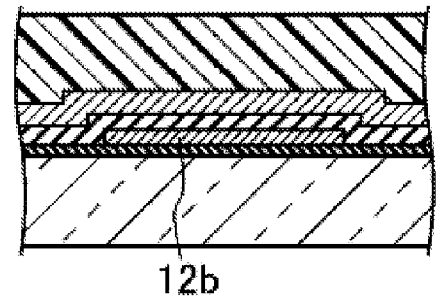
Figure 18:
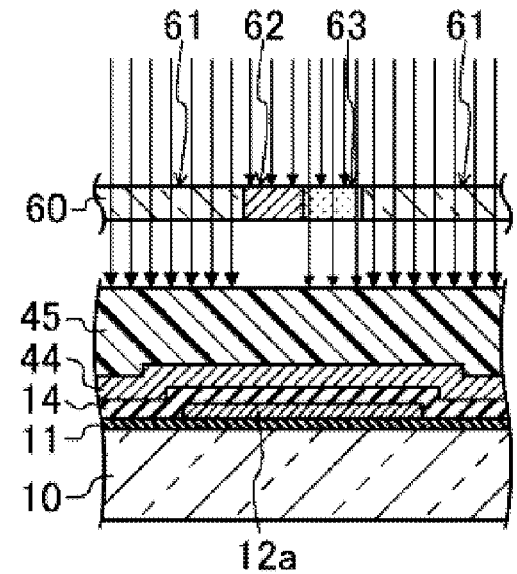
Figure 18:
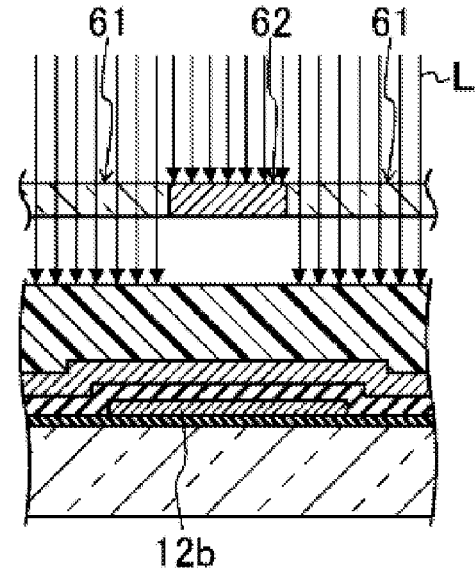
Figure 19:
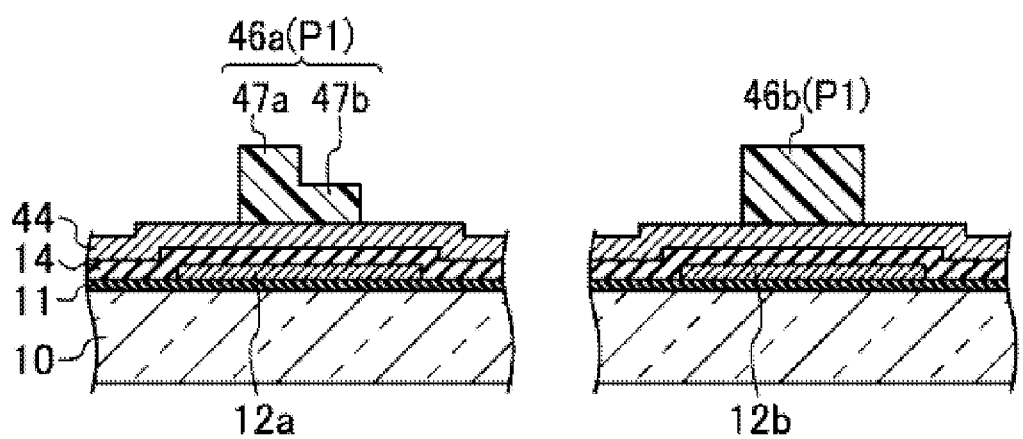
FIGS. 19(a) and 19(b) are cross-sectional views corresponding to the respective views of FIG. 15, illustrating the second half of the process to form gate electrodes in the manufacturing method for a semiconductor device of Embodiment 2.
Figure 19:
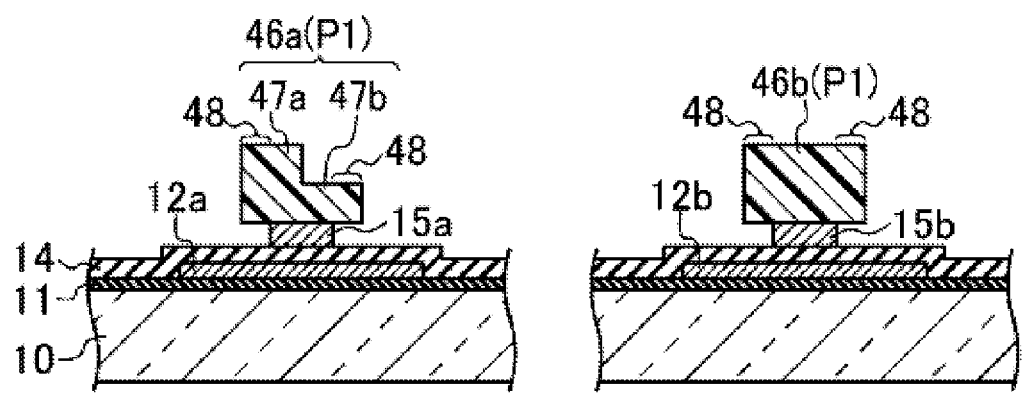
Figure 20:
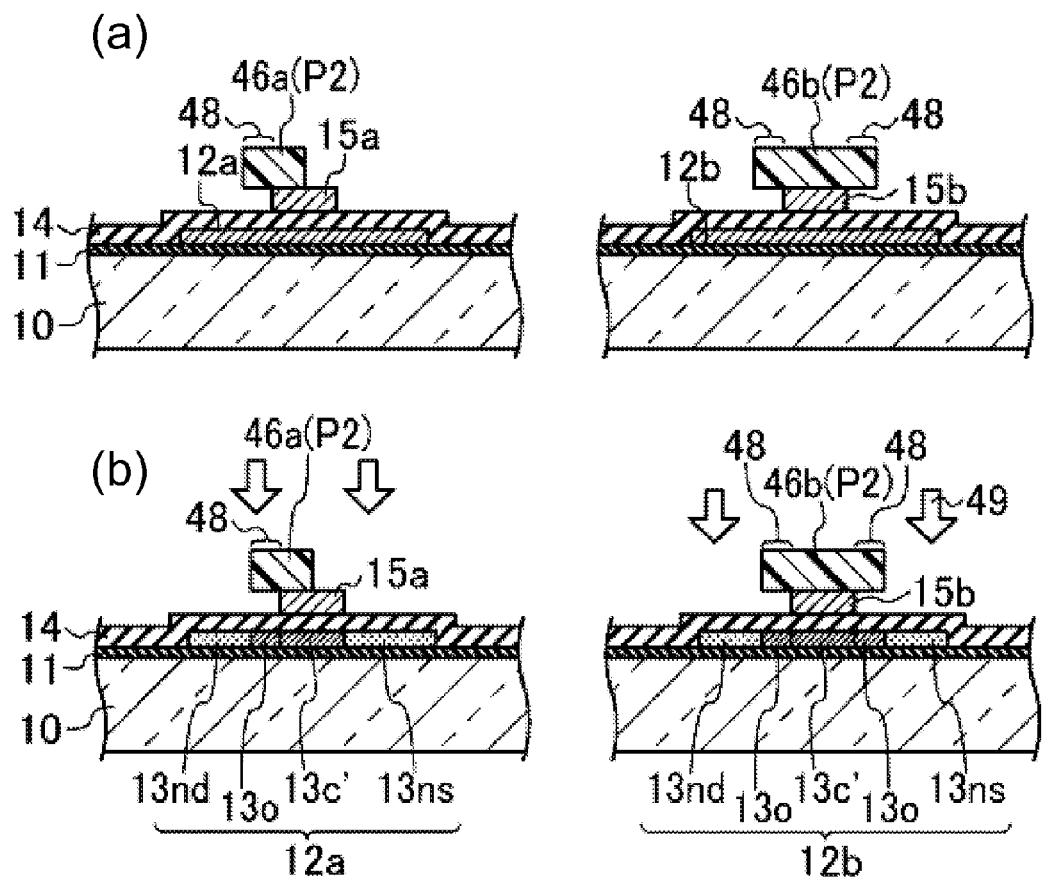
FIGS. 20(a) and 20(b) are cross-sectional views corresponding to the respective views of FIG. 15, illustrating a process to form n-type high-concentration impurity regions in the manufacturing method for a semiconductor device of Embodiment 2.
Figure 21:
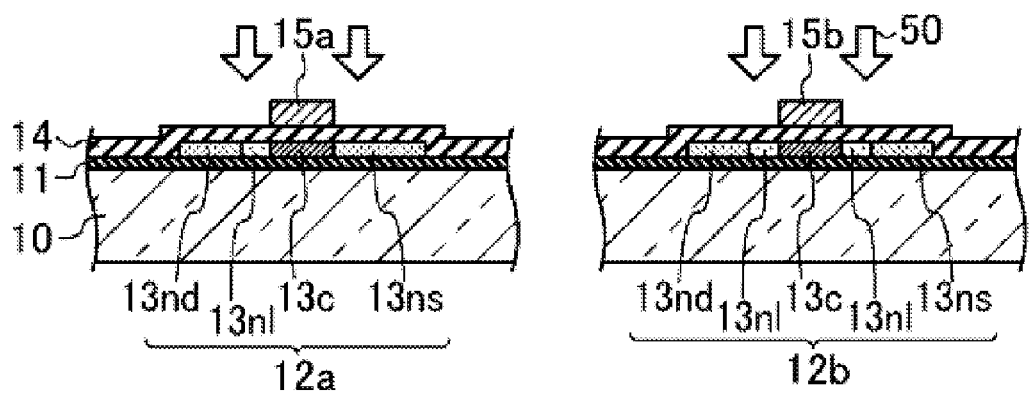
FIG. 21 shows cross-sectional views corresponding to the respective views of FIG. 15, illustrating a process to form n-type low-concentration impurity regions in the manufacturing method for a semiconductor device of Embodiment 2.
Figure 22:
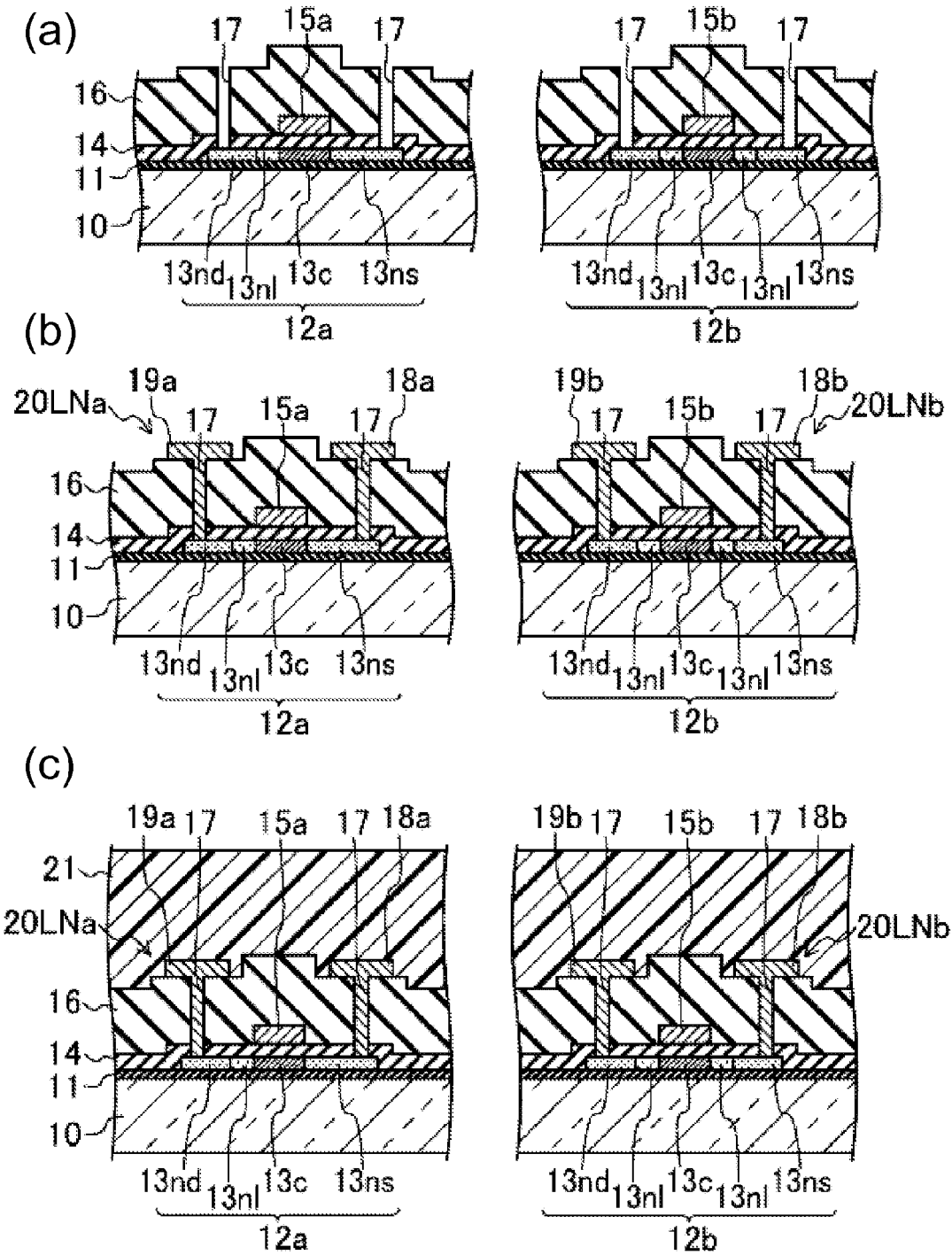
FIGS. 22(a) to 22(c) are cross-sectional views corresponding to the respective views of FIG. 15, illustrating respective steps after a step to form an interlayer insulating film in the manufacturing method for a semiconductor device of Embodiment 2.

FIG. 16 shows cross-sectional views of a semiconductor layer forming process. FIG. 17 is a cross-sectional view illustrating a gate insulating film forming step and an impurity level adjusting step. FIGS. 18 and 19 are cross-sectional views showing a gate electrode forming process. FIG. 20 shows cross-sectional views illustrating an n-type high-concentration impurity region forming process. FIG. 21 shows cross-sectional views illustrating an n-type low-concentration impurity region forming step. FIGS. 22(a) to 22(c) are cross-sectional views showing respective processes after an interlayer insulating film forming process. FIGS. 16 to 22(a) to 22(c) respectively show corresponding portions of FIG. 15.

The manufacturing method for the semiconductor device S according to the present embodiment includes a base insulating film forming process, a semiconductor layer forming process, a gate insulating film forming process, an impurity level adjusting process, a gate electrode forming process, an n-type high-concentration impurity region forming process, an n-type low concentration impurity region forming process, an interlayer insulating film forming process, a source/drain electrode forming process, and a protective insulating film forming process.

The base insulating film forming process is similar to that in Embodiment 1, and therefore, detailed descriptions thereof are omitted.

<Semiconductor Layer Forming Process>

After the polysilicon film 42 is formed as in Embodiment 1, the polysilicon film 42 is patterned by photolithography using a first photomask, and thus, as shown in FIG. 16, the first semiconductor layer 12a and the second semiconductor layer 12b are formed (semiconductor layer forming step). In the present embodiment also, at this point, the energy level of the first semiconductor layer 12a and the second semiconductor layer 12b is moved toward the donor level as a result of being affected by the base insulating film 11.

<Gate Insulating Film Forming Process>

On the substrate upon which the first semiconductor layer 12a and the second semiconductor layer 12b are formed, in a similar manner to Embodiment 1, as shown in FIG. 17, the gate insulating film 14 is formed (gate insulating film forming step).

<Impurity Level Adjusting Process>

The entire first semiconductor layer 12a and second semiconductor layer 12b covered by the gate insulating film 14 are doped with boron (B) as a p-type impurity at a low concentration, in a similar manner to Embodiment 1 above.

In this manner, the impurity level of the first semiconductor layer 12a and the second semiconductor layer 12b is set to the acceptor level, and the depth thereof is adjusted such that the prescribed threshold voltages of the n-type TFTs 20LNa and 20LNb that include the respective semiconductor layers 12a and 12b are achieved by the conductive characteristics of the channel regions 13c that will be formed later.

The impurity level adjusting process does not necessarily have to be conducted, and may be conducted as necessary, taking into account the type and depth of the impurity level of the first semiconductor layer 12a and the second semiconductor layer 12b.

<Gate Electrode Forming Process>

As shown in FIG. 18(a), on the substrate including the first semiconductor layers 12a and the second semiconductor layers 12b having the impurity levels thereof adjusted, the conductive film 44 for forming the gate electrode is formed in a manner similar to Embodiment 1 (conductive film forming step).

Next, as shown in FIG. 18(b), the conductive film 44 that is used to form gate electrodes is coated with a positive type photosensitive resin in a manner similar to Embodiment 1 above, thereby forming a photosensitive resin film 45 (approximately 1 μm to 2 μm in thickness, for example) (photosensitive resin film forming step).

Next, as shown in FIG. 18(c), an exposure process is conducted by using a second photomask to control an amount of exposure light that is radiated to the uncured photosensitive resin film 45. In this exposure process, a gray tone mask 60 shown in FIG. 6 that is a type of a multiple gradation mask is used as the second photomask.

In the gray tone mask 60 used in the present embodiment, the light-shielding portion 62 is formed on one side (left side of FIG. 18(c)) of the region where the gate electrode is to be formed over the first semiconductor layer 12a, and on the region where the gate electrode is to be formed over the second semiconductor layer 12b, when the gray tone mask 60 is disposed in a prescribed position opposite to the photosensitive resin film 45. On the other hand, the semi-transmissive portion 63 is formed to cover a region on the side opposite to where a gate electrode is to be formed (right side of FIG. 18(c)) above the first semiconductor layer 12a when the gray tone mask 60 is disposed at a prescribed position to face the photosensitive resin film 45.

When conducting an exposure process on the photosensitive resin film 45, as shown in FIG. 18(c), the gray tone mask 60 is placed at the prescribed location so as to face the photosensitive resin film 45, and thereafter, ultraviolet light L is radiated from the side of the gray tone mask 60 opposite to the insulating substrate 10. In this way, the exposure process is conducted on the photosensitive resin film 45 through the gray tone mask 60.

As a result, in the photosensitive resin 45, one side portion (left portion in FIG. 18(c)) of a formation region of the gate electrode 15a corresponding in position to the first semiconductor layer 12a, which corresponds in position to the light-shielding part 62, and the entire formation region of the gate electrode 15b corresponding in position to the second semiconductor layer 12c are both completely unexposed to light, and the other side portion of the formation region of the gate electrode 15a corresponding in position to the first semiconductor layer 12a, which is the portion corresponding in position to the semi-transmissive portion 63, is exposed to less light than a position facing the transmissive portion 61.

Thereafter, a developing process is performed on the photosensitive resin film 45 that has been exposed (photosensitive resin film patterning step). As a result, the photosensitive resin film 45 is patterned, and as shown in FIG. 19(a), a first resist layer 46a, which is a resist layer similar to that of Embodiment 1, is formed in order to form the gate electrode corresponding in position to the first semiconductor layer 12a, and a second resist layer 46b having an even thickness is formed in order to form the gate electrode corresponding in position to the second semiconductor layer 12b.

More specifically, in the gate electrode formation region in the position corresponding to the first semiconductor layer 12a, a first resist layer 46a having a thick film portion 47a on the side corresponding to where the drain region is to be formed and a thin film portion 47b on the side corresponding to where the source region is to be formed is formed, the first resist layer 46a being somewhat wider than the gate electrode 15a to be formed. Also, in the gate electrode formation region over the second semiconductor layer 12b, the second resist layer 46b is formed with an even thickness that is approximately the same as the thick film portion 47a and somewhat wider than the gate electrode 15b to be formed. The first resist layer 46a and second resist layer 46b constitute a first resist pattern P1.

Next, by patterning the conductive film 44 by isotropic wet-etching that uses the first resist layer 46a and the second resist layer 46b as masks, as shown in FIG. 19(b), the gate electrodes 15a and 15b are respectively formed above the first semiconductor layer 12a and above the second semiconductor layer 12b (conductive film patterning step).

At this time, by adjusting the etching time and performing side etching, the conductive film 44 portions overlapping the periphery of the first resist layer 46a and the second resist layer 46b are also removed, causing the respective gate electrodes 15a and 15b to be recessed towards the interior of the respective resist layers 46a and 46b, and are consequently narrower than the first resist layer 46a and the second resist layer 46b, respectively. As a result, the first resist layer 46a and the second resist layer 46b each have overhang portions 48 that overhang the respective sides of the gate electrode 15a or 15b in an eave-like shape.

<n-Type High-Concentration Impurity Region Forming Process>

The first resist layer 46a and the second resist layer 46b are removed gradually from the surface by ashing, and as shown in FIG. 20(a), the ashing is stopped once the entire thin film portion 47b is removed (thin film portion removal step).

As a result, in the first resist layer 46a, the thin film portion 47b is completely removed and the thick film portion 47a is thinned and left remaining, which causes the overhang portion 48 to hang over only one side of the gate electrode 15a. Also, the entire second resist layer 46b is thinned and left remaining. The first resist layer 46a and second resist layer 46b remaining at this stage constitute a second resist pattern P2.

Next, as shown in FIG. 20(b), by ion-doping, phosphorus (P) as an n-type impurity is implanted at a high concentration into the first semiconductor layer 12a by using the first resist layer 46a constituted of the thinned thick film portion and the gate electrode 15a as masks, and into the second semiconductor layer 12b by using the thinned second resist layer 46b as a mask (impurity implantation step; high-concentration impurity implantation step).

As a result, in the first semiconductor layer 12a, an n-type high-concentration impurity region 13ns functioning as a source region is formed on one side (right side in FIG. 20(b)) of the channel region formation portion 13c' corresponding in position with the gate electrode 15a without a gap between the channel region formation portion 13c' and the n-type high concentration impurity region 13ns. On the other side (left side of FIG. 17(b)) of the channel region formation portion 13c', an n-type high-concentration impurity region 13nd functioning as a drain region is formed with a gap between the channel region formation portion 13c' and the n-type high-concentration impurity region 13nd, the gap corresponding in width to the overhang portion 48 that hangs over from the first resist layer 46a. Then, between the n-type high-concentration impurity region 13nd functioning as the drain region in the first semiconductor layer 12a and the channel region formation portion 13c', an offset region 13o to which no impurity is implanted is formed.

On the other hand, in the second semiconductor layer, n-type high-concentration impurity regions 13ns and 13nd that function respectively as a source region and a drain region are formed on both sides of the channel region formation portion 13c' formed in a position corresponding to the gate electrode 15b, with respective gaps being formed between the channel region formation portion 13c' and the n-type high-concentration impurity regions 13ns and 13nd, the gaps corresponding in width to the overhang portions 48 that hang over from the second resist layer 46b. Between the channel region forming portion 13c' in the second semiconductor layer 12b and the respective n-type high-concentration impurity regions 13ns and 13nd, offset regions 13o that are not doped with an impurity are formed.

<n-Type Low-Concentration Impurity Region Forming Process>

After forming the n-type high-concentration impurity regions 13ns and 13nd in the first semiconductor layer 12a and the second semiconductor layer 12b as described above, the remaining first resist layer 46a and second resist layer 46b are completely removed by a resist removal solution, ashing, or the like (resist layer removal step).

Thereafter, as shown in FIG. 21, by ion-doping, phosphorus (P) as an n-type impurity is implanted at a low concentration into the first semiconductor layer 12a and the second semiconductor layer 12b by using the gate electrodes 15a and 15b as masks (low-concentration impurity implantation step).

As a result, phosphorus (P) is additionally implanted into the respective n-type high-concentration impurity regions 13ns and 13nd of the first semiconductor layer 12a and the second semiconductor layer 12b. Also, phosphorus (P) is implanted into the respective offset regions 13o in the first semiconductor layer 12a and second semiconductor layer 12b, thereby forming n-type low-concentration impurity regions 13nl in the respective offset regions 13o. A channel region 13c is formed in a self-aligned manner in each of the first semiconductor layer 12a and the second semiconductor layer 12b in positions corresponding to the gate electrodes 15a and 15b.

<Respective Processes after Interlayer Insulating Film Forming Process>

After the n-type low-concentration impurity region forming process, in a manner similar to Embodiment 1 above, as shown in FIGS. 22(a) to 22(c), the interlayer insulating film forming process, the source/drain electrode forming process, and the protective insulating film forming process are conducted in this order.

By performing the respective processes above, it is possible to manufacture a semiconductor device S including single LDD structure TFTs 20LNa and double LDD structure TFTs 20LNb.

—Effects of Embodiment 2—

According to Embodiment 2, it is possible to attain effects similar to Embodiment 1, and both single LDD structure TFTs 20LNa and double LDD structure TFTs 20LNb can be formed on the same substrate 10. With a combination of TFTs 20LNa and 20LNb of both types of LDD structures, the number of types of circuits that it is possible to form is greatly increased, and it is possible to increase the design flexibility of circuits. Also, by appropriately applying the n-type TFTs 20LNa and 20LNb having different types of LDD structures in circuits depending on the desired characteristics, it is possible to attain a semiconductor device S having excellent performance.

Modification Example of Embodiment 2

Figure 23:
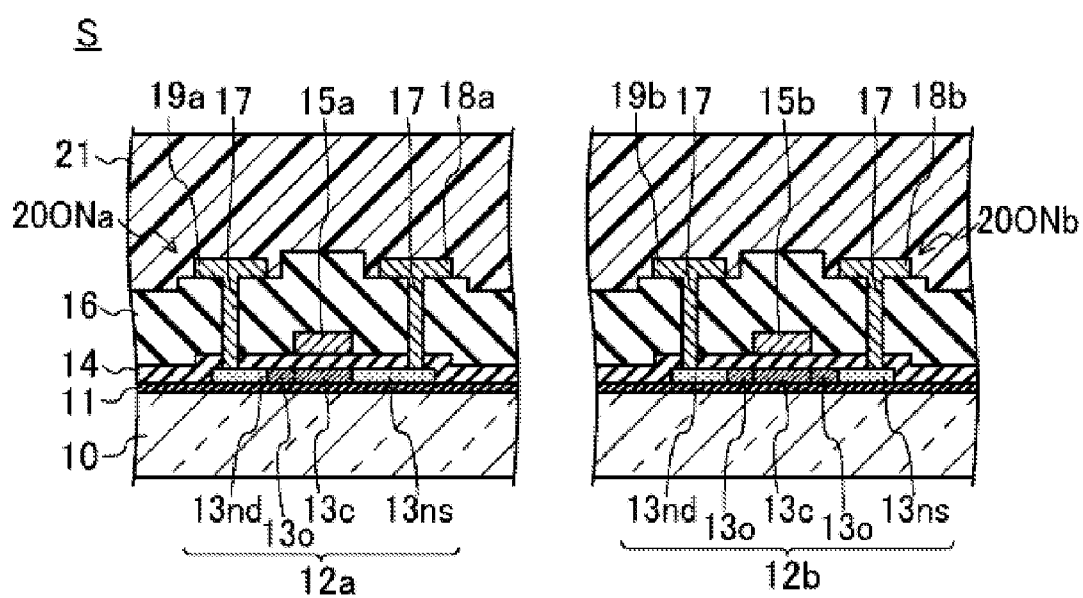
FIG. 23 shows cross-sectional views in order from the left side of the page showing cross-sectional structures of a single offset structure TFT and a double offset structure TFT (offset structure having offset regions on both sides of the channel region) included in the semiconductor device of a modification example of Embodiment 2.
Figure 24:
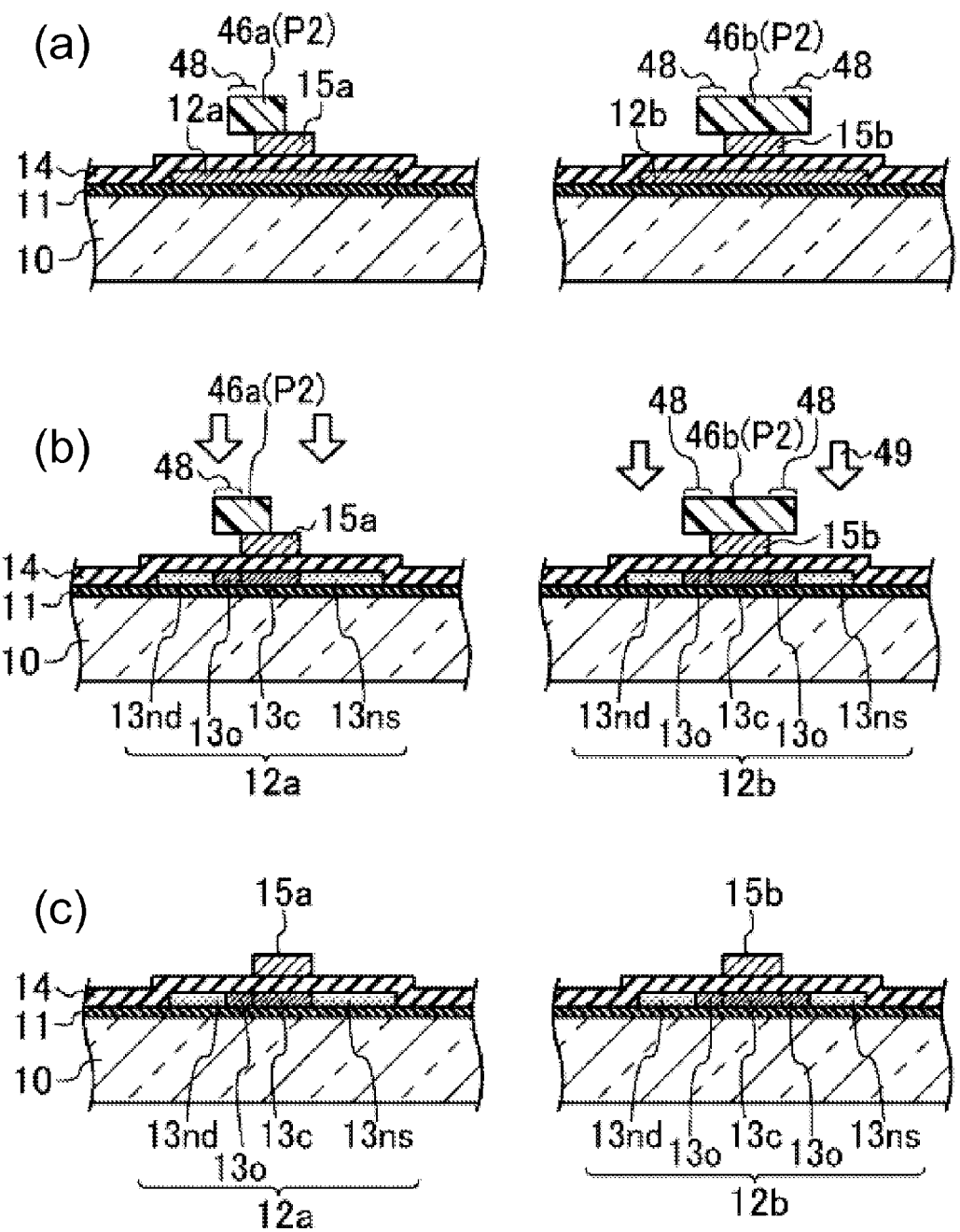
FIGS. 24(a) to 24(c) are cross-sectional views corresponding to the respective views of FIG. 23, illustrating a process to form n-type high-concentration impurity regions in a manufacturing method for an active matrix substrate of the modification example of Embodiment 2.
Figure 25:
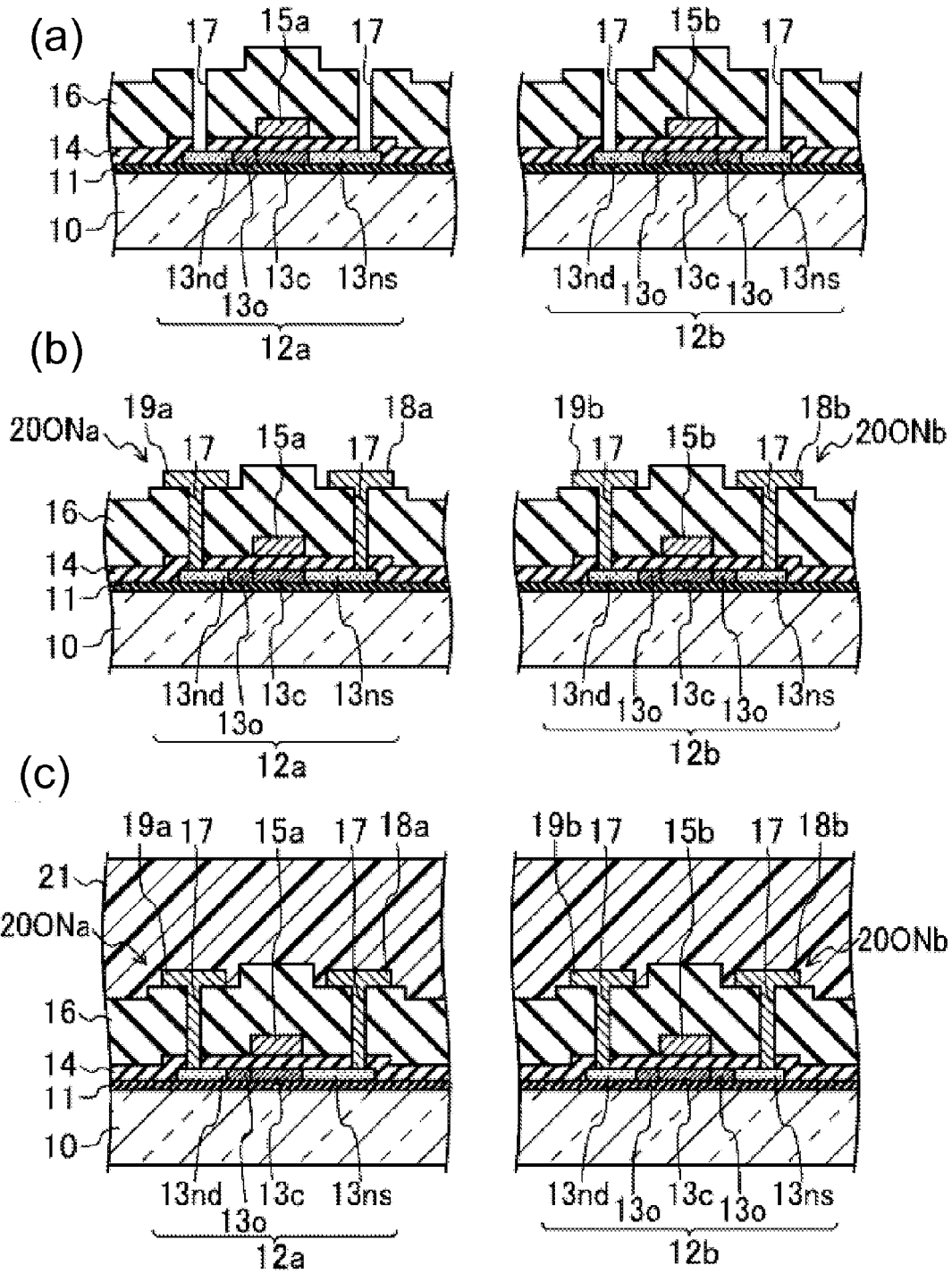
FIGS. 25(a) to 25(c) are cross-sectional views corresponding to the respective views of FIG. 23, illustrating respective steps after a step to form an interlayer insulating film in the manufacturing method for a semiconductor device of a modification example of Embodiment 2.

FIG. 23 shows cross-sectional views in order from the left side of the page of the cross-sectional structures of a single offset structure n-type TFT 20ONa and a double LDD structure n-type TFT 20ONb included in a semiconductor device S according to the present modification example.

As shown in FIG. 23, the semiconductor device S of the present modification example includes, on an insulating substrate 10, a single offset structure n-type TFT 20ONa instead of the single LDD structure n-type TFT 20LNa, and a double LDD structure n-type TFT 20ONb instead of the double LDD structure n-type TFT 20LNb.

The single offset structure n-type TFT 20ONa has the same configuration as the TFT 20ONa having the same structure described in the modification example of Embodiment 1, and includes a first semiconductor layer 12a corresponding to the semiconductor layer 12a. The double offset structure n-type TFT 20ONb has the same top gate structure as the double LDD structure n-type TFT 20LNb, and includes a second semiconductor layer 12b.

As in Embodiment 2, in the second semiconductor layer 12b, a channel region 13c is formed corresponding in position to the gate electrode 15b, and n-type high-concentration impurity regions 13ns and 13nd functioning respectively as a source region and a drain region are formed at a prescribed gap from the channel region 13c on both sides thereof. Between the channel region 13c and the respective n-type high-concentration impurity regions 13ns and 13nd in the second semiconductor layer 12b, offset regions 13o having the same impurity concentration as the channel region 13c are formed instead of the n-type low concentration impurity regions 13nl.

—Manufacturing Method—

A manufacturing method for a semiconductor device S including a single offset structure n-type TFT 20ONa and a double offset structure n-type TFT 20ONb as described above will be described as an example with reference to FIGS. 24(a) to 24(c) to FIGS. 25(a) to 25(c).

FIGS. 24(a) to 24(c) are cross-sectional views illustrating an n-type high-concentration impurity region forming process. FIGS. 25(a) to 25(c) are cross-sectional views showing respective processes after an interlayer insulating film forming process. FIGS. 24(a) to 24(c) and FIGS. 25(a) to 25(c) respectively show portions corresponding to FIG. 23.

The manufacturing method for the semiconductor device S according to the present modification example includes a base insulating film forming process, a semiconductor layer forming process, a gate insulating film forming process, an impurity level adjusting process, a gate electrode forming process, an n-type high-concentration impurity region forming process, an interlayer insulating film forming process, a source/drain electrode forming process, and a protective insulating film forming process, but does not include a low concentration impurity region forming process.

Because the base insulating film forming process, the semiconductor layer forming process, the gate insulating film forming process, the impurity level adjusting process, and the gate electrode forming process are similar to those in Embodiment 1 above, detailed descriptions thereof are omitted.

<n-Type High-Concentration Impurity Region Forming Process>

After the gate electrode forming process in which gate electrodes 15a and 15b are formed, the first resist layer 46a and the second resist layer 46b are gradually removed from the surface by ashing, and as shown in FIG. 24(a), the ashing is stopped once the entire thin film portion 47b is removed (thin film portion removal step).

As a result, in the first resist layer 46a, the thin film portion 47b is completely removed and the thick film portion 47a is thinned, which causes the overhang portion 48 to hang over only one side of the gate electrode 26a. Also, the entire second resist layer 46b is thinned and left remaining. The remaining first resist layer 46a and second resist layer 46b constitute a second resist pattern P2.

Next, as shown in FIG. 24(b), by ion-doping, phosphorus (P) as an n-type impurity is implanted at a high concentration into the first semiconductor layer 12a by using the first resist layer 46a constituted of the thinned thick film portion and the gate electrode 15a as masks, and into the second semiconductor layer 12b by using the thinned second resist layer 46b as a mask (impurity implantation step).

As a result, on both sides of the position in the first semiconductor layer 12a corresponding to the first resist layer 46a and the gate electrode 15a, n-type high-concentration impurity regions 13ns and 13nd functioning respectively as the source region and the drain region are formed. At this time, the n-type high-concentration impurity region 13nd functioning as the drain region is formed with a gap from the position corresponding to the gate electrode 15a, the gap corresponding in width to the overhang portion 48 that hangs over from the first resist layer 46a. In addition, the channel region 13c is formed in the position of the first semiconductor layer 12a corresponding to the gate electrode 15a, and the offset region 13o is formed between the channel region 13c and the n-type high-concentration impurity region 13nd functioning as the drain region.

On the other hand, on both sides of a portion of the second semiconductor layer 12b below the second resist layer 46b, n-type high-concentration impurity regions 13ns and 13nd, which function as a source region and a drain region, are formed. At this time, the n-type high-concentration impurity regions 13ns and 13nd are formed with gaps from the position corresponding to the gate electrode, the gaps corresponding in width to the overhang portions 48 that hang over from the second resist layer 46b. Additionally, the channel region 13c is formed in the position corresponding to the gate electrode 15b of the second semiconductor layer 12b, and offset regions 13o are formed between the channel region 13c and the respective n-type high-concentration impurity regions 13ns and 13nd.

Thereafter, as shown in FIG. 24(c), the remaining first resist layer 46a and second resist layer 46b are completely removed by a resist removal solution, ashing, or the like.

<Respective Processes after Interlayer Insulating Film Forming Process>

After the n-type high-concentration impurity region forming process, in a manner similar to Embodiment 1 above, as shown in FIGS. 25(a) to 25(c), the interlayer insulating film forming process, the source/drain electrode forming process, and the protective insulating film forming process are conducted in this order.

As described above, it is possible to manufacture a semiconductor device S having the single offset structure TFTs 20ONa and the double offset structure TFTs 20ONb without also implanting impurities in the respective offset regions 13o of the first semiconductor layer 12a and the second semiconductor layer 12b in a step after forming the n-type high-concentration impurity regions 13ns and 13nd, —Effects of Modification Example of Embodiment 2—

According to this modification example, it is possible to attain effects similar to those of Embodiment 2, and it is unnecessary to implant impurities to the respective offset regions 13o of the first semiconductor layer 12a and the second semiconductor layer 12b (low-concentration impurity implantation step), and thus, compared to a case in which the single LDD structure n-type TFT 20LNa and the double LDD structure TFT 20LNb are formed as in Embodiment 2, it is possible to reduce the number of steps in an excellent manner and to manufacture the semiconductor device S at a lower cost.

Embodiment 3

Figure 26:
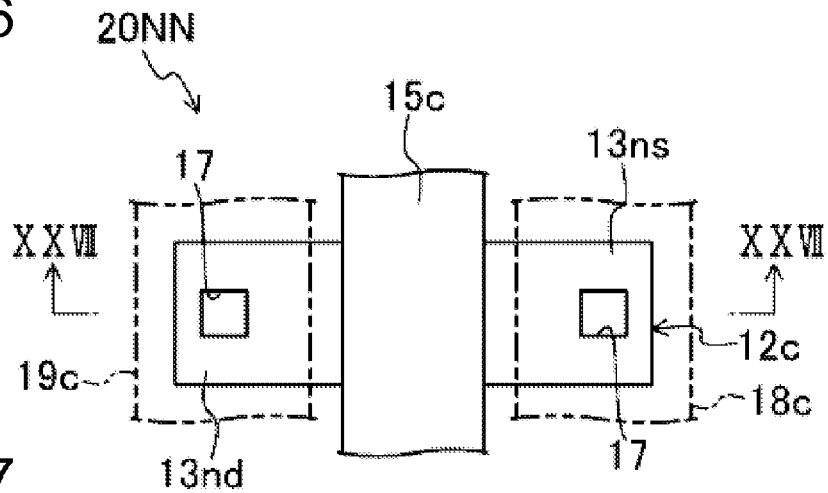
FIG. 26 is a plan view that schematically shows a normal structure n-type TFT included in a semiconductor device of Embodiment 3.
Figure 27:
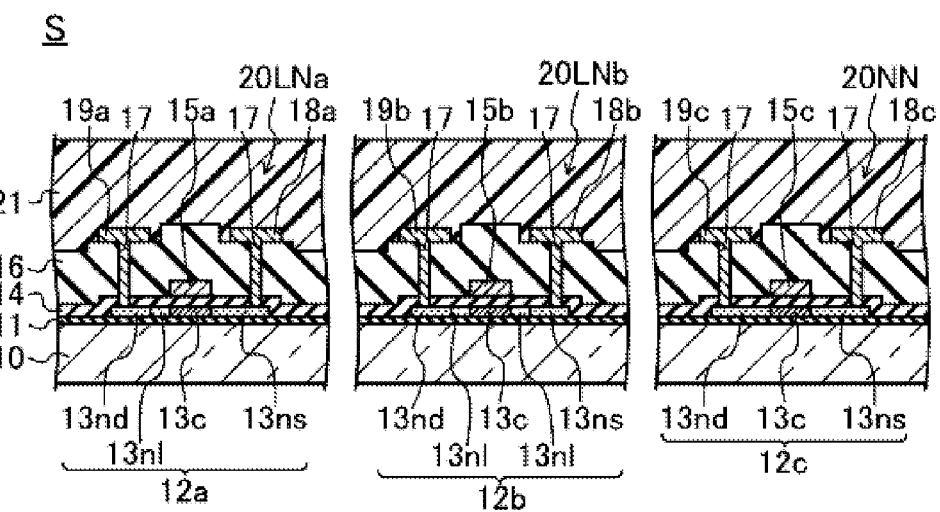
FIG. 27 shows cross-sectional views in order from the left side of the page showing cross-sectional structures of a single LDD structure n-type TFT, a double LDD structure n-type TFT, and a normal structure n-type TFT included in the semiconductor device of Embodiment 3.

FIG. 26 is a schematic plan view showing a normal structure n-type TFT 20NN included in a semiconductor device S of Embodiment 3. FIG. 27 shows cross-sectional views in order from the left side of the page of cross-sectional structures of a single LDD structure n-type TFT 20LNa, a double LDD structure TFT 20LNb, and a normal structure n-type TFT 20NN. In FIG. 27, the cross-sectional view of the normal structure n-type TFT 20NN shows the cross-sectional structure along the line XXVII-XXVII of FIG. 26. In the embodiments below, the same configurations as those in FIGS. 14 to 25(*a*) to 25(*c*) are also given the same reference characters as those in Embodiment 2 above, and detailed descriptions thereof are omitted.

As shown in FIG. 27, the semiconductor device S of the present embodiment includes, on an insulating substrate 10, normal structure n-type TFTs 20NN that have neither the low-concentration impurity regions 13*nl* nor the offset regions 13*o* in the semiconductor layer 12*c*, in addition to single LDD structure n-type TFTs 20LNa and double LDD structure n-type TFTs 20LNb.

The single LDD structure n-type TFT 20LNa has the same structure as the n-type TFT 20LNa having the same structure described in Embodiment 1, and includes a first semiconductor layer 12*a* corresponding to the semiconductor layer 12*a*. The double LDD structure n-type TFT 20LNb has the same configuration as the n-type TFT 20LNb with the same structure described in Embodiment 2, and includes a third semiconductor layer 12*b* corresponding to the second semiconductor layer 12*b*.

As shown in FIGS. 26 and 27, the normal structure n-type TFT 20NN has the same top gate structure as the other n-type TFTs 20LNa and 20LNb, and includes, on the insulating substrate 10, a second semiconductor layer 12*c* provided on a base insulating film 11, a gate insulating film 14 provided so as to cover the second semiconductor layer 12*c*, a gate electrode 15*c* provided on the gate insulating film 14 so as to overlap the central portion of the second semiconductor layer 12*c*, and a source electrode 18*c* and a drain electrode 19*c* (shown with the two-dot chain lines in FIG. 26), with the gate electrode 15*c* therebetween, being connected to the second semiconductor layer 12*c* while being separated from each other.

The second semiconductor layer 12*c* is made of the same crystalline semiconductor such as polysilicon as the first semiconductor layer 12*a* and the third semiconductor layer 12*b*. In the second semiconductor layer 12*c*, a channel region 13*c* is formed in a position corresponding to the gate electrode 15*a*, and a pair of n-type high-concentration impurity regions 13*ns* and 13*nd*, which respectively function as the source region and the drain region, are formed on both sides of the channel region 13*c* without a gap from the channel region 13*c*.

In the channel region 13*c* and the respective n-type high-concentration impurity regions 13*ns* and 13*nd* of the second semiconductor layer 12*c*, impurities similar to the first semiconductor layer 12*a* and the third semiconductor layer 12*b*, or in other words, an n-type impurity such as phosphorus (P) or a p-type impurity such as boron (B) is included.

For the gate insulating film 14, a film shared between the single LDD structure n-type TFT, the double LDD structure n-type TFT 20LNb, and the normal structure n-type TFT 20NN is used. The gate electrode 15*c* of the normal structure n-type TFT 20NN is made of the same material as the gate electrodes 15*a* and 15*b* of both LDD structure n-type TFTs 20LNa and 20LNb. Also, the source electrode 18*c* and the drain electrode 19*c* of the normal structure n-type TFTs 20NN are made of the same material as the source electrodes 18*a* and 18*b* and the drain electrodes 19*a* and 19*b* of both LDD structure n-type TFTs 20LNa and 20LNb.

—Manufacturing Method—

Next, one example of a manufacturing method for a semiconductor device S including the single LDD structure TFT 20LNa, the double LDD structure TFT 20LNb, and the normal structure n-type TFT 20NN described above will be described with reference to FIGS. 28 to 34(*a*) to 34(*c*).

Figure 28:
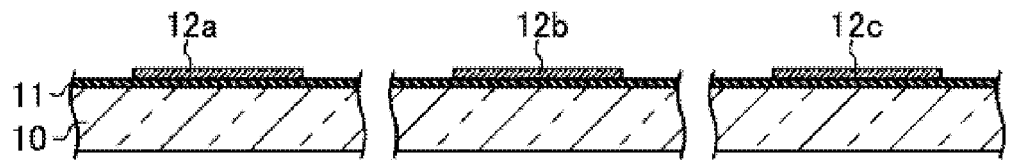
FIG. 28 shows cross-sectional views corresponding to the respective views of FIG. 27, illustrating a process to form a semiconductor layer in a manufacturing method for a semiconductor device of Embodiment 3.
Figure 29:
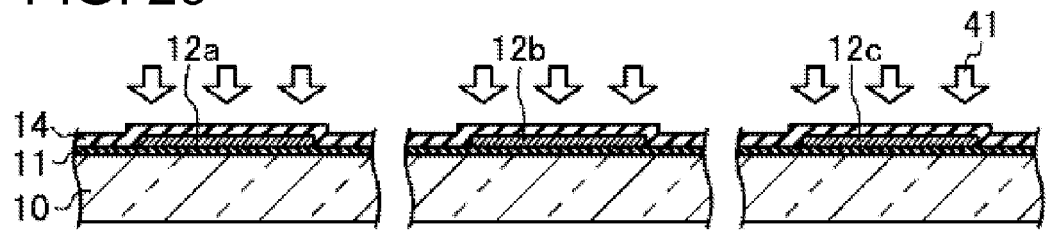
FIG. 29 shows cross-sectional views corresponding to the respective views of FIG. 27 showing a step of forming a gate insulating film and a step of adjusting an impurity level in the manufacturing method for a semiconductor device according to Embodiment 3.
Figure 30:
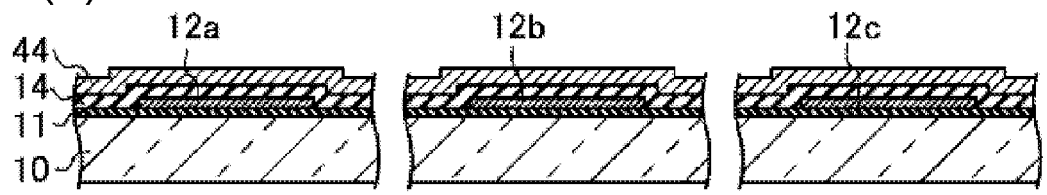
FIGS. 30(a) to 30(c) are cross-sectional views corresponding to the respective views of FIG. 27, illustrating the first half of a process to form gate electrodes in the manufacturing method for a semiconductor device of Embodiment 3.
Figure 30:
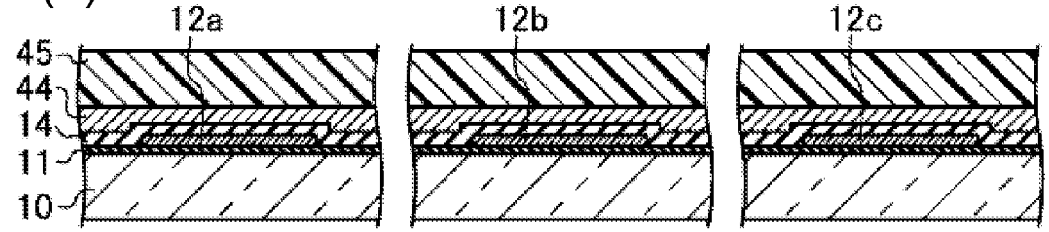
Figure 30:
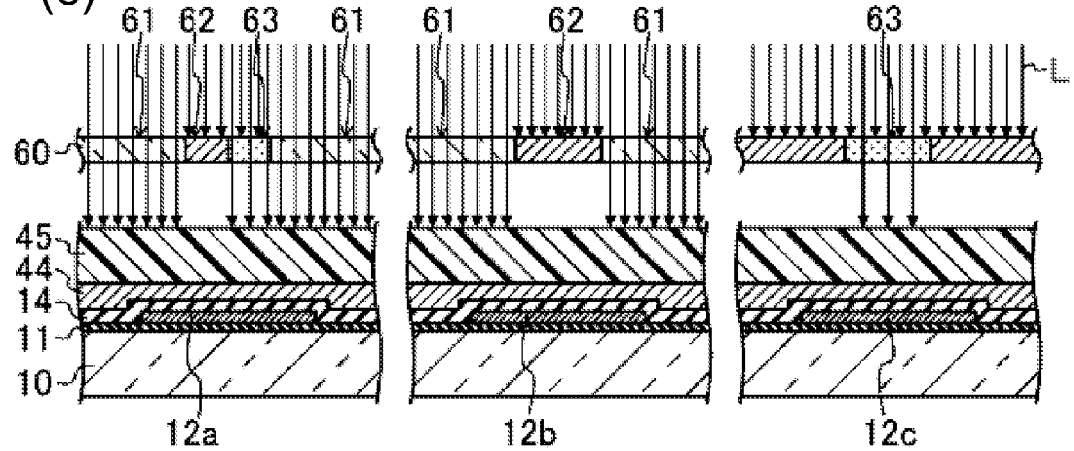
Figure 31:
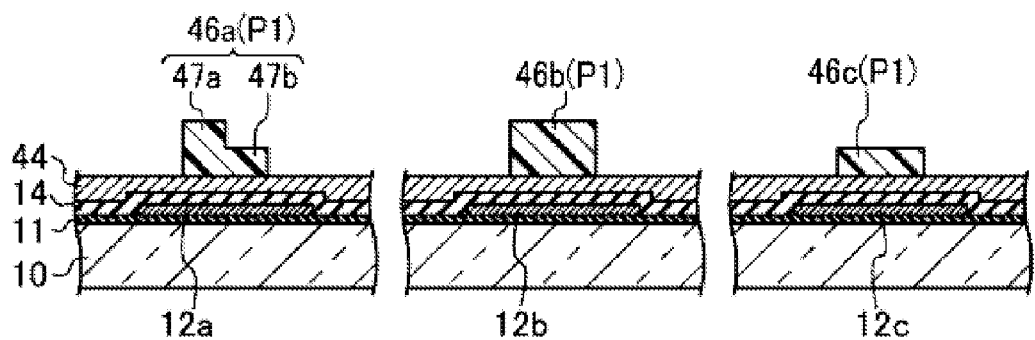
FIGS. 31(a) and 31(b) are cross-sectional views corresponding to the respective views of FIG. 27, illustrating the second half of the process to form gate electrodes in the manufacturing method for a semiconductor device of Embodiment 3.
Figure 31:
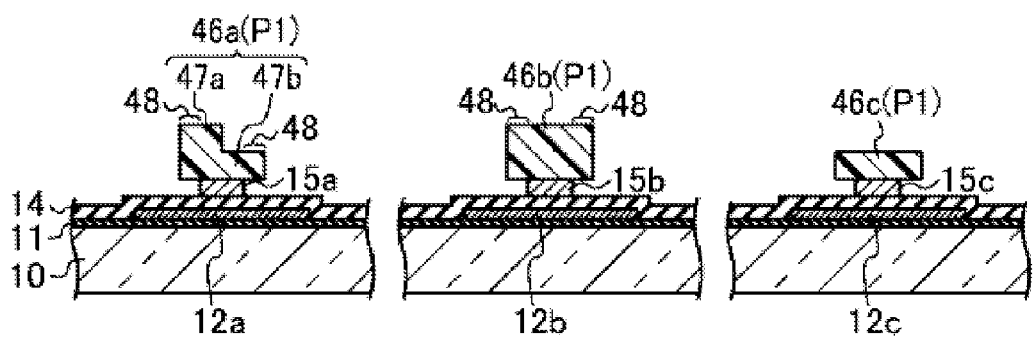
Figure 32:
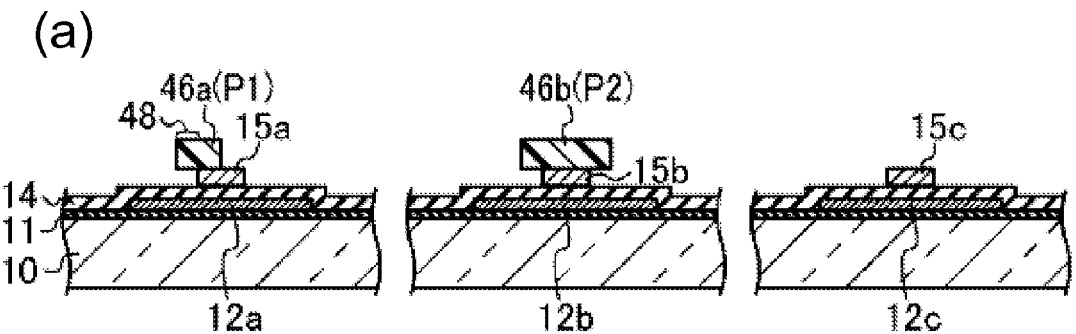
FIGS. 32(a) and 32(b) are cross-sectional views corresponding to the respective views of FIG. 27, illustrating a process to form n-type high-concentration impurity regions in the manufacturing method for a semiconductor device of Embodiment 3.
Figure 33:
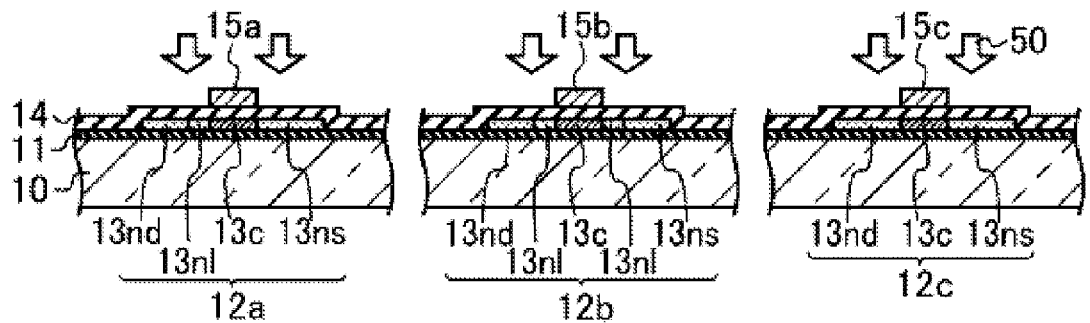
FIG. 33 shows cross-sectional views corresponding to the respective views of FIG. 27, illustrating a process to form n-type low-concentration impurity regions in the manufacturing method for a semiconductor device of Embodiment 3.
Figure 34:
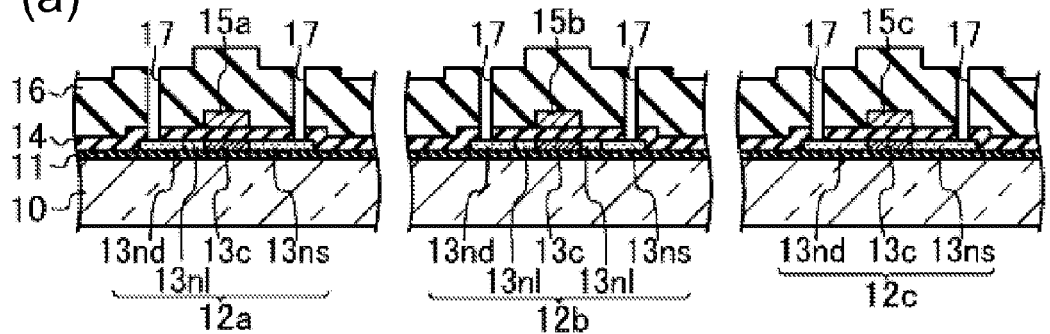
FIGS. 34(a) to 34(c) are cross-sectional views corresponding to the respective view of FIG. 27, illustrating respective steps after a step to form an interlayer insulating film in the manufacturing method for a semiconductor device of Embodiment 3.
Figure 34:
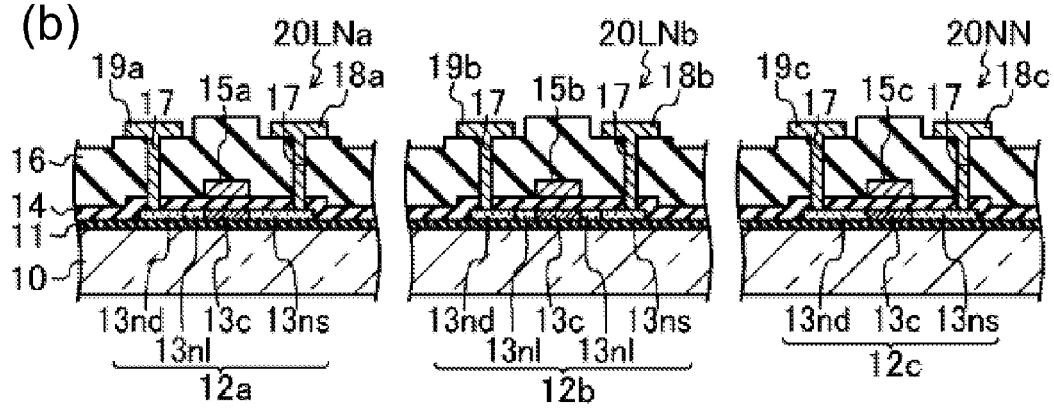
Figure 34:
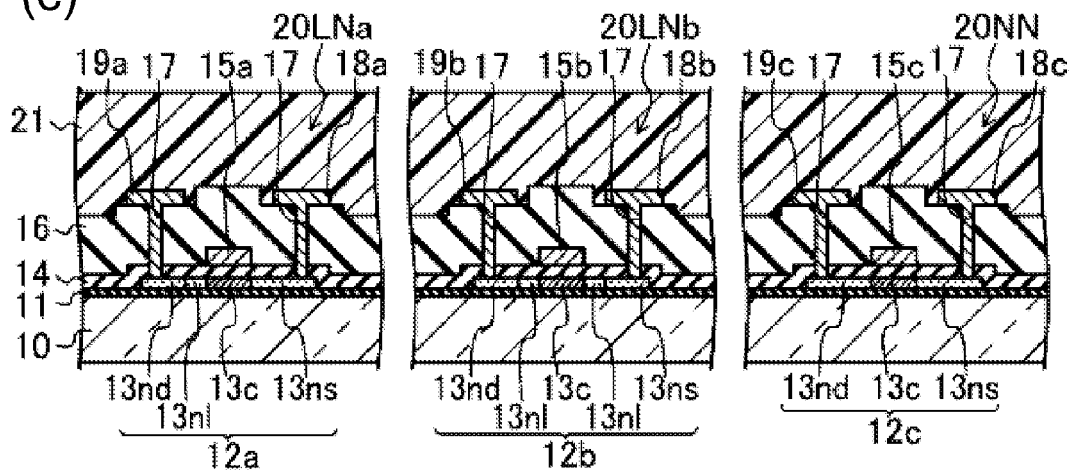

FIG. 28 shows cross-sectional views of a semiconductor layer forming process. FIG. 29 is a cross-sectional view illustrating a gate insulating film forming step and an impurity level adjusting step. FIGS. 30(*a*) to 30(*c*) and FIGS. 31(*a*) and 31(*b*) are cross-sectional views showing a gate electrode forming step. FIGS. 32(*a*) and 32(*b*) are cross-sectional views illustrating an n-type high-concentration impurity region forming process. FIG. 33 shows cross-sectional views illustrating an n-type low-concentration impurity region forming step. FIGS. 34(*a*) to 34(*c*) are cross-sectional views showing respective processes after an interlayer insulating film forming process. FIGS. 28 to 34(*a*) to 34(*c*) respectively show corresponding portions of FIG. 27.

The manufacturing method for the semiconductor device S according to the present embodiment includes a base insulating film forming process, a semiconductor layer forming process, a gate insulating film forming process, an impurity level adjusting process, a gate electrode forming process, an n-type high-concentration impurity region forming process, an n-type low concentration impurity region forming process, an interlayer insulating film forming process, a source/drain electrode forming process, and a protective insulating film forming process.

The base insulating film forming process is similar to that in Embodiment 1, and therefore, detailed description thereof is omitted.

<Semiconductor Layer Forming Process>

After forming the polysilicon film 42 in a manner similar to Embodiment 1, by patterning the polysilicon film 42 by photolithography using a first photomask, as shown in FIG. 28, the first semiconductor layer 12*a*, the second semiconductor layer 12*c*, and the third semiconductor layer 12*b* are formed (semiconductor layer forming step). In the present embodiment also, at this point, the energy level of the first semiconductor layer 12*a*, the second semiconductor layer 12*c*, and the third semiconductor layer 12*b* are moved toward the donor level as a result of being affected by the base insulating film 11.

<Gate Insulating Film Forming Process>

On the substrate upon which the first semiconductor layer 12*a*, the second semiconductor layer 12*c*, and the third semiconductor layer 12*b* are formed, in a similar manner to Embodiment 1, as shown in FIG. 29, the gate insulating film 14 is formed (gate insulating film forming step).

<Impurity Level Adjusting Process>

The entire first semiconductor layer 12*a*, the second semiconductor layer 12*c*, and the third semiconductor layer 12*b* covered by the gate insulating film 14 are doped with boron (B) as a p-type impurity at a low concentration, in a manner similar to Embodiment 1 above.

As a result, the impurity level in the first semiconductor layer 12*a*, the second semiconductor layer 12*c*, and the third semiconductor layer 12*b* is set to the acceptor level, and the depth thereof is adjusted such that the conductive characteristics of the channel region 13*c* to be formed later bring about a prescribed threshold voltage to the n-type TFTs 20LNa, 20LNb, and 20NN included in the respective semiconductor layers 12*a*, 12*b*, and 12*c*.

The impurity level adjusting process does not necessarily have to be conducted, and may be conducted as necessary, taking into account the type and depth of the impurity level of the first semiconductor layer 12a, the second semiconductor layer 12c, and the third semiconductor layer 12b.

<Gate Electrode Forming Process>

As shown in FIG. 30(a), on the substrate including the first semiconductor layers 12a, the second semiconductor layers 12c, and the third semiconductor layers 12b having the impurity levels thereof adjusted, the conductive film 44 for forming the gate electrode is formed in a manner similar to Embodiment 1 (conductive film forming step).

Next, as shown in FIG. 30(b), the conductive film 44 that is used to form gate electrodes is coated with a positive type photosensitive resin in a manner similar to Embodiment 1 above, thereby forming a photosensitive resin film 45 (approximately 1 μm to 2 μm in thickness, for example) (photosensitive resin film forming step).

Next, as shown in FIG. 30(c), an exposure process is conducted by using a second photomask to control an amount of exposure light that is radiated to the uncured photosensitive resin film 45. In this exposure process, a gray tone mask 60 shown in FIG. 6 that is a type of a multiple gradation mask is used as the second photomask.

In the gray tone mask 60 used in the present embodiment, the light-shielding portion 62 is formed on one side (left side of FIG. 30(c)) of the region where the gate electrode is to be formed over the first semiconductor layer 12a and over the region where the gate electrode is to be formed over the third semiconductor layer 12b, when the gray tone mask 60 is disposed in a prescribed position facing the photosensitive resin film 45. On the other hand, the semi-transmissive portion 63 is formed over the other side (right side of FIG. 30(c)) of the region where the gate electrode is to be formed above the first semiconductor layer 12a and over the region where the gate electrode is to be formed above the second semiconductor layer 12c, when the gray tone mask 60 is disposed at a prescribed position to face the photosensitive resin film 45 in the same manner.

When conducting an exposure process on the photosensitive resin film 45, as shown in FIG. 30(c), the gray tone mask 60 is placed at the prescribed location so as to face the photosensitive resin film 45, and thereafter, ultraviolet light L is radiated from the side of the gray tone mask 60 opposite to the insulating substrate 10. In this way, the exposure process is conducted on the photosensitive resin film 45 through the gray tone mask 60.

As a result, in the photosensitive resin 45, one side portion (left portion in FIG. 30(c)) of the region where the gate electrode is to be formed over the first semiconductor layer 12a, which corresponds in position to the light-shielding part 62, and the entire region where the gate electrode is to be formed over the third semiconductor layer 12b are both completely unexposed to light, and the other side portion (right side portion of FIG. 30(c)) of the formation region of the gate electrode corresponding in position to the first semiconductor layer 12a, which is the portion corresponding in position to the semi-transmissive portion 63, and the region where the gate electrode is to be formed over the second semiconductor layer 12c are exposed to less light than a position facing the transmissive portion 61.

Thereafter, a developing process is performed on the photosensitive resin film 45 that has been exposed (photosensitive resin film patterning step). As a result, the photosensitive resin film 45 is patterned, and as shown in FIG. 31(a), a first resist layer 46a, which is a resist layer similar to that of Embodiment 1, is formed in order to form the gate electrode over the first semiconductor layer 12a, a second resist layer 46c having an even thickness and being relatively thin is formed in order to form the gate electrode over the second semiconductor layer 12c, and a third resist layer 46b having an even thickness and being relatively thick is formed in order to form the gate electrode over the third semiconductor layer 12b.

More specifically, in the region where the gate electrode is to be formed over the first semiconductor layer 12a, a first resist layer 46a having a thick film portion 47a in the side where the drain region is to be formed and a thin film portion 47b in the side where the source region is to be formed is formed, the first resist layer 46a being somewhat wider than the gate electrode 15a to be formed. The second resist layer 46c, which has an even thickness that is approximately the same as the thin film portion 47b and somewhat wider than the gate electrode 15c to be formed, is formed in the gate electrode formation region in a position corresponding to the second semiconductor layer 12c. Also, in the gate electrode formation region in the position corresponding to the third semiconductor layer 12b, the third resist layer 46b is formed having an even thickness that is approximately the same as the thick film portion 47a and somewhat wider than the gate electrode 15b to be formed. The first resist layer 46a, the second resist layer 46c, and the third resist layer 46b constitute a first resist pattern P1.

Next, by patterning the conductive film 44 by isotropic wet-etching that uses the first resist layer 46a, the second resist layer 46c, and the third resist layer 46b as masks, as shown in FIG. 31(b), the gate electrodes 15a, 15b, and 15c are respectively formed above the first semiconductor layer 12a, the second semiconductor layer 12c, and above the third semiconductor layer 12b (conductive film patterning step).

At this time by adjusting the etching time and performing side etching, the conductive film 44 portions overlapping the periphery of the first resist layer 46a, the second resist layer 46c, and the third resist layer 46b are also removed, causing the respective gate electrodes 15a, 15b, and 15c to be recessed towards the interior of the respective resist layers 46a, 46b, and 46c, and are consequently narrower than the first resist layer 46a, the second resist layer 46c, and the third resist layer 46b, respectively. As a result, the first resist layer 46a, the second resist layer 46c, and the third resist layer 46b each have overhang portions 48 that overhang both of the respective sides of the gate electrodes 15a, 15b, and 15c in an eave-like shape.

<n-Type High-Concentration Impurity Region Forming Process>

The first resist layer 46a, the second resist layer 46c, and the third resist layer 46b are removed gradually from the surface by ashing, and as shown in FIG. 32(a), the ashing is stopped once the entire thin film portion 47b and the entire second resist layer 46c are removed (thin film portion removal step).

As a result, in the first resist layer 46a, the thin film portion 47b is completely removed and the thick film portion 47a is thinned, which causes the overhang portion 48 to hang over only one side of the gate electrode 15a. The entire second resist layer 46c is completely removed. Also, the entire third resist layer 46b is thinned and left remaining. The first resist layer 46a and third resist layer 46b remaining at this stage constitute a second resist pattern P2.

Next, as shown in FIG. 32(b), phosphorus (P) as an n-type impurity is respectively implanted at a high concentration by ion doping to the first semiconductor layer 12a with the first resist layer 46a including the thinned thick film portion and the gate electrode 15a as masks, to the second semiconductor layer 12c with the gate electrode 15c as a mask, and to the third semiconductor layer 12b with the thinned third resist layer 46b as a mask (impurity implantation step; high concentration impurity implantation step).

As a result, in the first semiconductor layer 12a, the n-type high-concentration impurity region 13ns functioning as the source region is formed on one side (right side in FIG. 32(b)) of the channel region formation portion 13c' corresponding in position to the gate electrode 15a without forming a gap between the n-type high-concentration impurity region 13ns and the channel region formation portion 13c'. Also, in the first semiconductor layer 12a, the n-type high-concentration impurity region 13nd functioning as the drain region is formed on the other side (left side in FIG. 32(b)) of the channel region formation portion 13c' while forming a gap between the n-type high concentration impurity region 13nd and the channel region formation portion 13c', the gap corresponding in width to the overhanging portion of the overhang portion 48 of the first resist layer 46a. Then, between the n-type high-concentration impurity region 13nd functioning as the drain region in the first semiconductor layer 12a and the channel region formation portion 13c', an offset region 13o to which no impurity is implanted is formed.

On the other hand, in the second semiconductor layer 12c, the n-type high-concentration impurity regions 13ns and 13nd functioning respectively as the source region and the drain region are formed on both sides of the portion corresponding in position to the gate electrode 15c without a gap between the high-concentration impurity regions 13ns and 13nd and the portion corresponding in position to the gate electrode 15c. Then, in the portion of the second semiconductor layer 12c below the gate electrode 15c, a channel region 13c is formed in a self-aligned manner.

In the third semiconductor layer 12b, the n-type high-concentration impurity regions 13ns and 13nd are formed with gaps between the n-type high-concentration impurity regions 13ns and 13nd and both sides of the channel region formation portion 13c' corresponding in position to the gate electrode 15b, the gaps corresponding in width to the overhanging portions of the overhang portion 48 of the third resist layer 46b. Between the channel region forming portion 13c' in the third semiconductor layer 12b and the respective n-type high-concentration impurity regions 13ns and 13nd, offset regions 13o that are not doped with an impurity are formed.

<n-Type Low-Concentration Impurity Region Forming Process>

As described above, after forming the respective n-type high-concentration impurity regions 13ns and 13nd in the first semiconductor layer 12a, the second semiconductor layer 12c, and the third semiconductor 12b, the remaining first resist layer 46a and the third resist layer 46b are removed by a resist removal solution, by ashing, or the like (resist layer removal step).

Thereafter, as shown in FIG. 33, by ion-doping, phosphorus (P) as an n-type impurity is implanted at a low concentration into the first semiconductor layer 12a, the second semiconductor layer 12c, and the third semiconductor layer 12b by using the gate electrodes 15a, 15b, and 15c as masks (low-concentration impurity implantation step).

As a result, phosphorus (P) is additionally implanted into the respective n-type high-concentration impurity regions 13ns and 13nd of the first semiconductor layer 12a, the second semiconductor layer 12c, and the third semiconductor layer 12b. Also, phosphorus (P) is implanted into the respective offset regions 13o in the first semiconductor layer 12a and third semiconductor layer 12b, thereby forming n-type low-concentration impurity regions 13nl in the respective offset regions 13o. A channel region 13c is formed in a self-aligned manner in each of the first semiconductor layer 12a and the third semiconductor layer 12b in positions corresponding to the gate electrodes 15a and 15b.

<Respective Processes after Interlayer Insulating Film Forming Process>

After the n-type low-concentration impurity region forming process, in a manner similar to Embodiment 1 above, as shown in FIGS. 34(a) to 34(c), the interlayer insulating film forming process, the source/drain electrode forming process, and the protective insulating film forming process are conducted in this order.

By performing the respective processes above, it is possible to manufacture a semiconductor device S including single LDD structure TFTs 20LNa, a double LDD structure TFTs 20LNb, and normal structure n-type TFTs 20NN.

—Effects of Embodiment 3—

According to Embodiment 3, it is possible to attain effects similar to Embodiment 1, and single LDD structure TFTs 20LNa, double LDD structure TFTs 20LNb, and normal structure n-type TFTs 20NN are formed together on the same substrate 10. By the combination of both LDD structure TFTs 20LNa and 20LNb, and the normal structure n-type TFTs 20NN, the number of possible types of circuits that can be formed is greater than in Embodiment 2 due to the addition of the normal structure n-type TFT, and thus, the design flexibility of the circuits is even greater. Also, by appropriately applying the n-type TFTs 20LNa, 20LNb, and 20NN of different structures as circuits depending on the desired characteristics, it is possible to attain a semiconductor device S having excellent performance.

Modification Example of Embodiment 3

Figure 35:
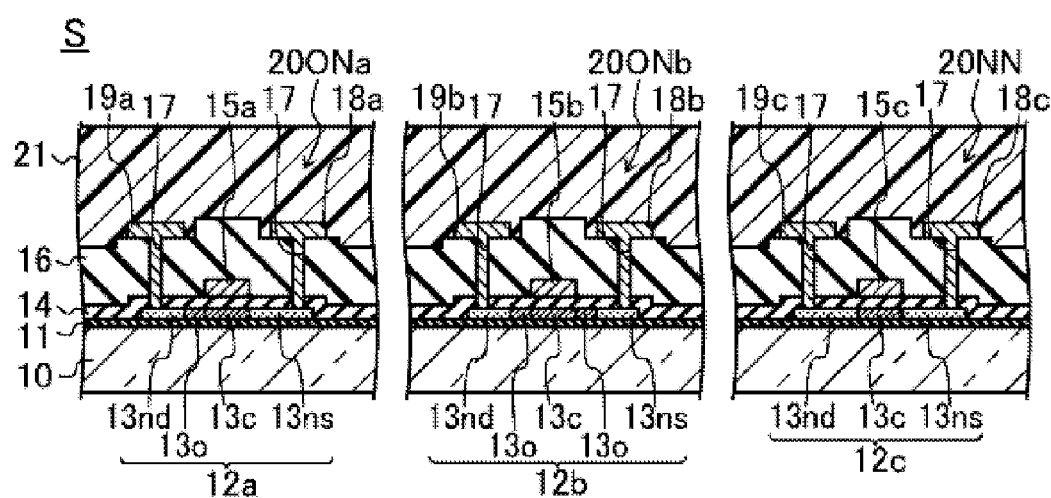
FIG. 35 shows cross-sectional views in order from the left side of the page showing cross-sectional structures of a single offset structure n-type TFT, a double offset structure n-type TFT, and a normal structure n-type TFT included in a semiconductor device of a modification example of Embodiment 3.
Figure 36:
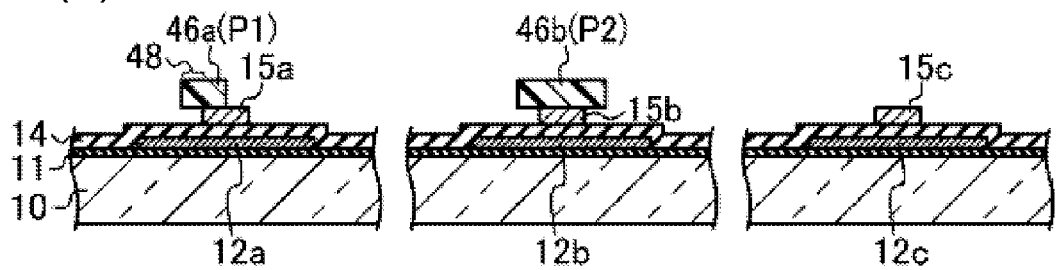
FIGS. 36(a) to 36(c) are cross-sectional views corresponding to the respective views of FIG. 35, illustrating a process to form n-type high-concentration impurity regions in a manufacturing method for a semiconductor device of the modification example of Embodiment 3.
Figure 36:
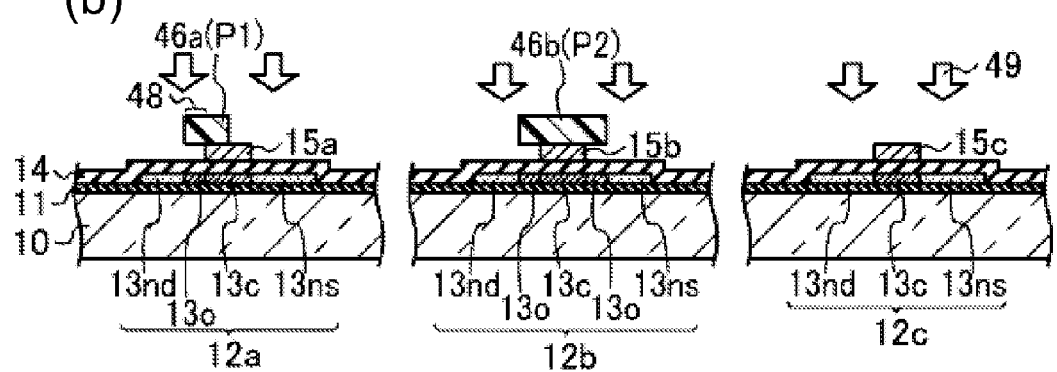
Figure 36:
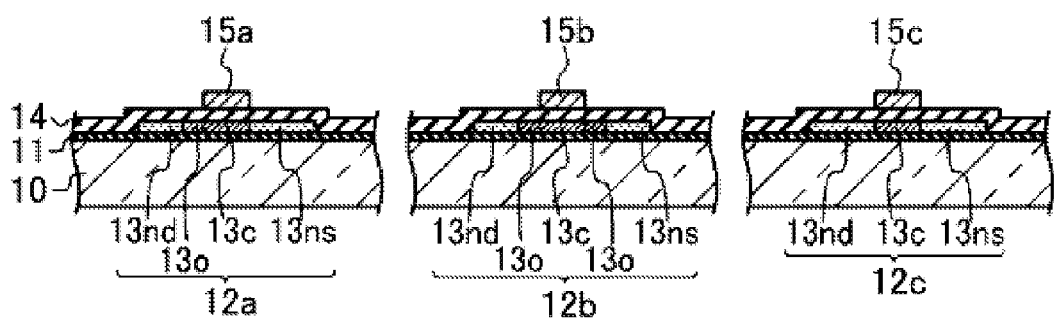
Figure 37:
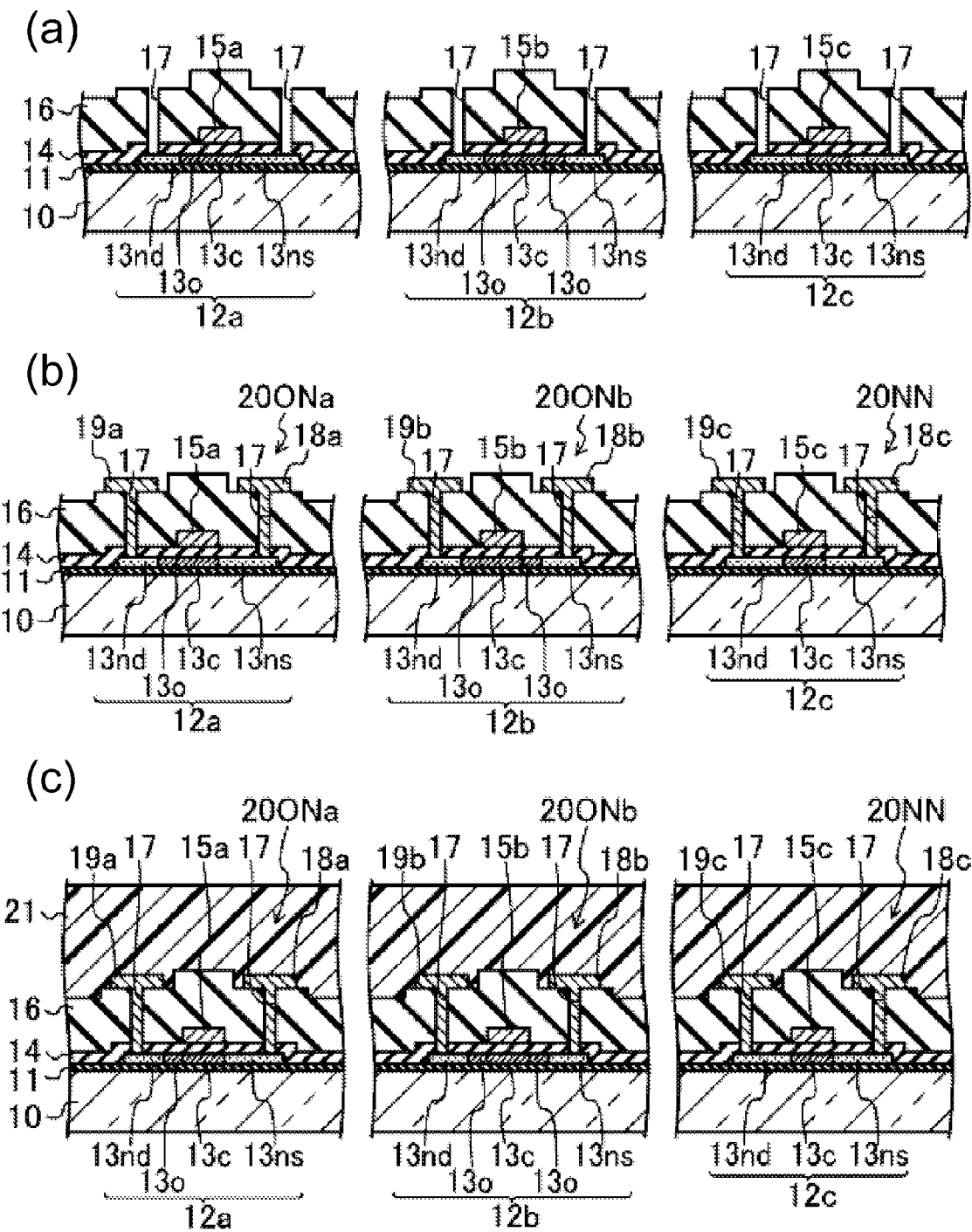
FIGS. 37(a) to 37(c) are cross-sectional views corresponding to the respective views of FIG. 35, illustrating respective steps after a step to form an interlayer insulating film in the manufacturing method for a semiconductor device of a modification example of Embodiment 3.

FIG. 35 shows respective cross-sectional views from the left side of the page of a single offset structure n-type TFT 20ONa, a double offset structure n-type TFT 20ONb, and a normal structure n-type TFT 20NN included in a semiconductor device S according to the present modification example.

As shown in FIG. 35, the semiconductor device S of the present modification example includes a single offset structure n-type TFT 20ONa instead of the single LDD structure n-type TFT 20LNa, and a double offset structure n-type TFT 20ONb instead of the double LDD structure n-type TFT 20LNb.

The single offset structure TFT 20ONa has the same structure as the TFT 20ONa of the same structure described in the modification example of Embodiment 1. The double offset structure n-type TFT 20ONb has the same structure as the n-type TFT 20ONb of the same structure described in the modification example of Embodiment 2.

—Manufacturing Method—

A manufacturing method for a semiconductor device S including a single offset structure n-type TFT 20ONa, a double offset structure TFT 20ONb, and a normal structure n-type TFT 20NN as described above will be described as an example with reference to FIGS. 36(a) to 36(c) to FIGS. 37(a) to 37(c).

FIGS. 36(a) to 36(c) are cross-sectional views illustrating an n-type high-concentration impurity region forming process. FIGS. 37(a) to 37(c) are cross-sectional views showing respective processes after an interlayer insulating film forming process. FIGS. 36(a) to 36(c) and FIGS. 37(a) to 37(c) respectively show portions corresponding to FIG. 35.

The manufacturing method for the semiconductor device S according to the present modification example includes a base insulating film forming process, a semiconductor layer forming process, a gate insulating film forming process, an impurity level adjusting process, a gate electrode forming process, an n-type high-concentration impurity region forming process, an interlayer insulating film forming process, a source/drain electrode forming process, and a protective insulating film forming process, but does not include a low concentration impurity region forming process.

Because the base insulating film forming process, the semiconductor layer forming process, the gate insulating film forming process, the impurity level adjusting process, and the gate electrode forming process are similar to those in Embodiment 1 above, the detailed descriptions thereof are omitted.

<n-Type High-Concentration Impurity Region Forming Process>

After forming the respective gate electrodes 15a, 15b, and 15c in the gate electrode forming process, the first resist layer 46a, the second resist layer 46c, and the third resist layer 46b are gradually removed from the front surface by ashing, and as shown in FIG. 36(a), ashing is stopped when the thin film portion 47b and the second resist layer 46c are completely removed (thin film removal step).

As a result, in the first resist layer 46a, the thin film portion 47b is completely removed and the thick film portion 47a is thinned and left remaining, which causes the overhang portion 48 to hang over only one side of the gate electrode 15a. The entire second resist layer 46c is completely removed. Also, the entire third resist layer 46b is thinned and left remaining. The first resist layer 46a and third resist layer 46b remaining at this stage constitute a second resist pattern P2.

Next, as shown in FIG. 36(b), phosphorus (P) as an n-type impurity is respectively implanted at a high concentration by ion doping to the first semiconductor layer 12a with the first resist layer 46a including the thinned thick film portion and the gate electrode 15a as masks, to the second semiconductor layer 12c with the gate electrode 15c as a mask, and to the third semiconductor layer 12b with the thinned third resist layer 46b as a mask (impurity implantation step).

As a result, on both sides of the position in the first semiconductor layer 12a corresponding to the first resist layer 46a and the gate electrode 15a, n-type high-concentration impurity regions 13ns and 13nd functioning respectively as the source region and the drain region are formed. At this time, the n-type high-concentration impurity region 13nd functioning as the drain region is formed with a gap from the position corresponding to the gate electrode 15a, the gap corresponding in width to the overhang portion 48 that hangs over from the first resist layer 46a. In addition, the channel region 13c is formed in the position of the first semiconductor layer 12a corresponding to the gate electrode 15a, and the offset region 13o is formed between the channel region 13c and the n-type high-concentration impurity region 13nd functioning as the drain region.

On the other hand, in the second semiconductor layer 12c, the n-type high-concentration impurity regions 13ns and 13nd functioning respectively as the source region and the drain region are formed on both sides of the portion corresponding in position to the gate electrode 15c without a gap between the high-concentration impurity regions 13ns and 13ndf and the portion corresponding in position to the gate electrode 15c. Then, in the portion of the second semiconductor layer 12c below the gate electrode 15c, a channel region 13c is formed in a self-aligned manner.

Also, on both sides of a portion of the third semiconductor layer 12b below the third resist layer 46b, n-type high-concentration impurity regions 13ns and 13nd, which function as a source region and a drain region, are formed. At this time, the n-type high-concentration impurity regions 13ns and 13nd are formed with gaps from the position corresponding to the gate electrode, the gaps corresponding in width to the overhang portions 48 that hang over from the third resist layer 46b. Additionally, the channel region 13c is formed in the position corresponding to the gate electrode 15b of the third semiconductor layer 12b, and offset regions 13o are formed between the channel region 13c and the respective n-type high-concentration impurity regions 13ns and 13nd.

Thereafter, as shown in FIG. 36(c), the remaining first resist layer 46a and third resist layer 46b are removed by a resist removal solution, ashing, or the like.

<Respective Processes after Interlayer Insulating Film Forming Process>

After the n-type high-concentration impurity region forming process, in a manner similar to Embodiment 1 above, as shown in FIGS. 37(a) to 37(c), the interlayer insulating film forming process, the source/drain electrode forming process, and the protective insulating film forming process are conducted in this order.

In the manner described above, it is possible to manufacture the semiconductor device S including the single offset structure n-type TFT 20ONa, the double offset structure n-type TFT 20ONb, and the normal structure n-type TFT 20NN without implanting impurities into the respective offset regions 13o of the first semiconductor layer 12a and the third semiconductor layer 12b in the steps after the n-type high-concentration impurity regions 13ns and 13nd are formed.

—Effects of Modification Example of Embodiment 3—

According to this modification example, it is possible to attain effects similar to Embodiment 3 without the need for impurity implantation (low-concentration impurity implanting step) in the respective offset regions 13o of the first semiconductor layer 12a and the third semiconductor layer 12b, and thus, compared to Embodiment 3 in which the single LDD structure n-type TFT 20LNa and the double LDD structure TFT 20LNb are formed, the number of steps can be reduced in an excellent manner, thus allowing a less expensive semiconductor device S to be manufactured.

Embodiment 4

Figure 38:
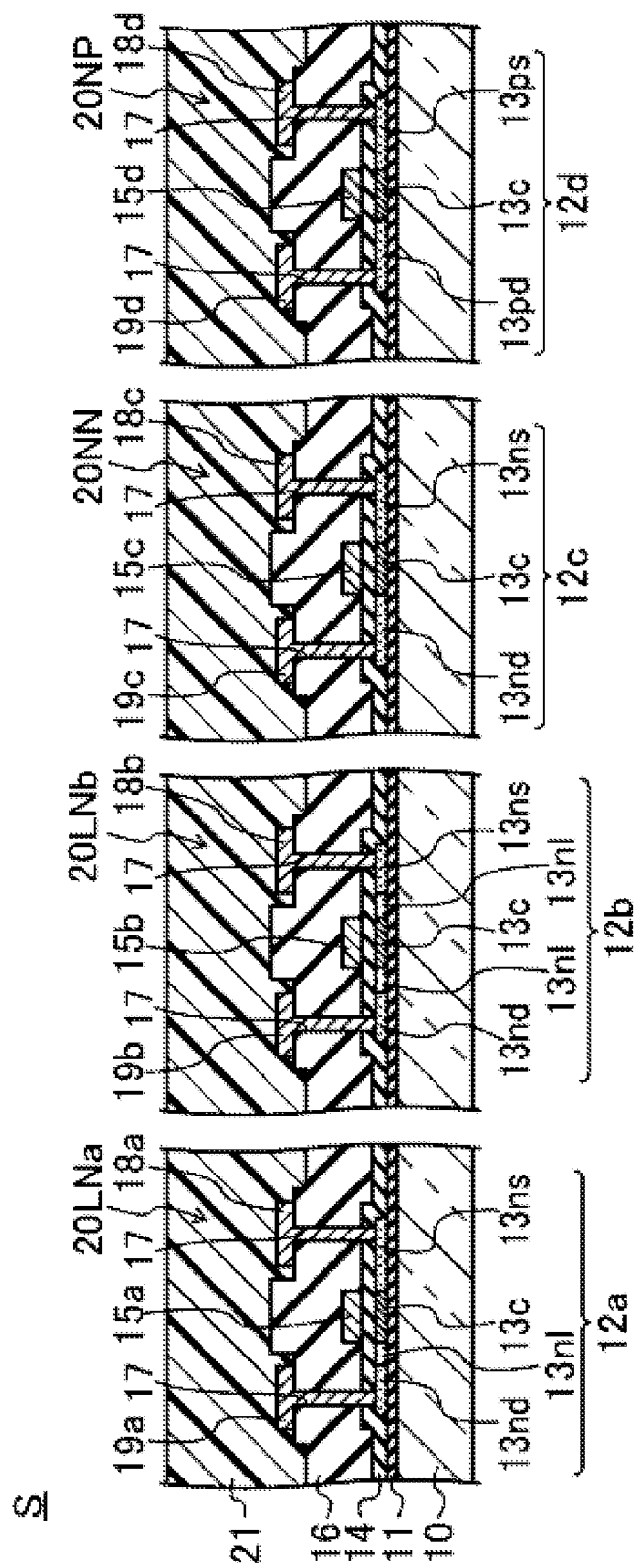
FIG. 38 shows cross-sectional views in order from the left side of the page showing cross-sectional structures of a single LDD structure n-type TFT, a double LDD structure n-type TFT, a normal structure n-type TFT, and a normal structure p-type TFT included in a semiconductor device of Embodiment 4.

FIG. 38 shows respective cross-sectional views in order from the left side of the page of cross-section structures of a single LDD structure n-type TFT 20LNa, a double LDD structure n-type TFT 20LNb, a normal structure n-type TFT 20NN and a p-type TFT 20NP included in a semiconductor device S of Embodiment 4. In the embodiments below, the same configurations as those in FIGS. 26 to 37(a) to 37(c) are also given the same reference characters and the same descriptions as those in Embodiment 3 above, and detailed descriptions thereof are omitted.

As shown in FIG. 38, the semiconductor device S of the present embodiment includes single LDD structure n-type TFTs 20LNa, double LDD structure n-type TFTs 20LNb, normal structure n-type TFTs 20NN, and normal structure p-type TFTs 20NP on an insulating substrate 10.

The single LDD structure n-type TFT 20LNa has the same structure as the TFT 20LNa of the same structure described in Embodiment 1, and includes a first semiconductor layer 12a corresponding to the semiconductor layer 12a. The double LDD structure n-type TFT 20LNb has the same structure as the n-type TFT 20LNb with the same structure described in Embodiment 2, and includes a third semiconductor layer 12b corresponding to the second semiconductor layer 12b. The normal structure n-type TFT 20NN has the same structure as the n-type TFT 20NN with the same structure described in Embodiment 3, and includes a fourth semiconductor layer 12c corresponding to the second semiconductor layer 12c.

As shown in FIG. 38, the normal structure p-type TFT 20NP has a top gate structure similar to the other TFTs 20LNa, 20LNb, and 20NN, and includes, on the insulating substrate 10, a second semiconductor layer 12d provided on a base insulating film 11, a gate insulating film 14 provided so as to cover the second semiconductor layer 12d, a gate electrode 15d provided overlapping a central portion of the second semiconductor layer 12d across the gate insulating film 14, and a source electrode 18d and a drain electrode 19d connected to the second semiconductor layer 12d while being separated from each other and having the gate electrode 15d therebetween.

The second semiconductor layer 12d is made of the same crystalline semiconductor such as polysilicon as the first semiconductor layer 12a, the third semiconductor layer 12b, and the fourth semiconductor layer 12c. In the second semiconductor layer 12d, the channel region 13c corresponding in position to the gate electrode 15d has formed on both sides thereof a pair of p-type high-concentration impurity regions 13ps and 13pd functioning respectively as a source region and a drain region without any gap between the p-type high-concentration impurity regions 13ps and 13pd and the channel region 13c.

The channel region 13c of the second semiconductor layer 12d includes an n-type impurity such as phosphorus (P) to control the threshold voltage. The respective p-type high-concentration impurity regions 13ps and 13pd include a p-type impurity such as boron (B).

For the gate insulating film 14 a common film is used among both LDD structure n-type TFTs 20LNa and 20LNb, the normal structure n-type TFTs 20NN and the normal structure p-type TFTs 20NP. The gate electrode 15d of the normal structure p-type TFT 20NP is made of the same material as the gate electrodes 15a, 15b, and 15c of both LDD structure n-type TFTs 20LNa and 20LNb, and the normal structure n-type TFT 20NN. The source electrode 18d and the drain electrode 19d of the normal structure p-type TFT 20NP are also made of the same material as the source electrodes 18a, 18b, and 18c, and the drain electrodes 19a, 19b, and 19c of both LDD structure n-type TFTs 20LNa and 20LNb, and the normal structure n-type TFTs 20NN.

—Manufacturing Method—

Next, one example of a manufacturing method for a semiconductor device S including the single LDD structure TFT 20LNa, the double LDD structure TFT 20LNb, and the normal structure n-type TFT 20NN and p-type TFT 20PN described above will be described with reference to FIGS. 39 to 49(a) and 49(b).

Figure 39:
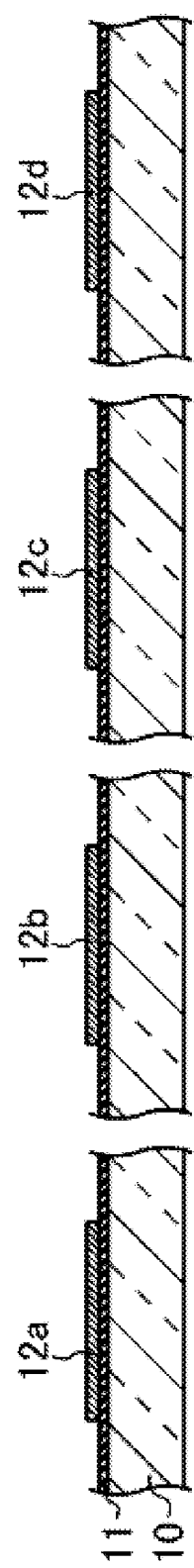
FIG. 39 shows cross-sectional views corresponding to the respective views of FIG. 38, illustrating a process to form a semiconductor layer in a manufacturing method for a semiconductor device of Embodiment 4.
Figure 40:
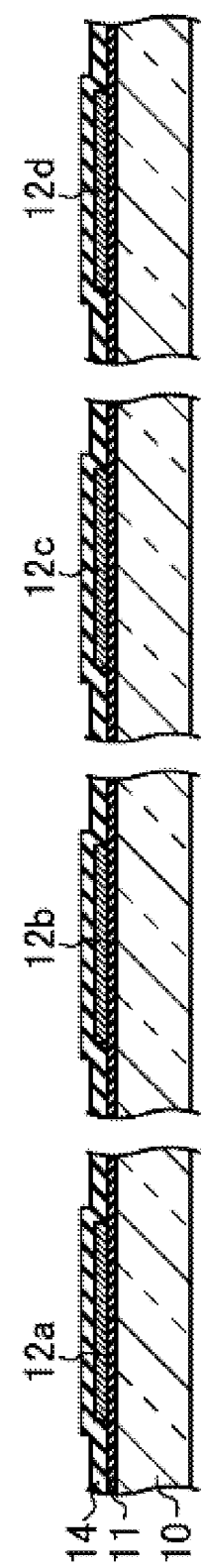
FIG. 40 shows cross-sectional views corresponding to the respective views of FIG. 38 showing a step of forming a gate insulating film in the manufacturing method for a semiconductor device according to Embodiment 4.
Figure 41:
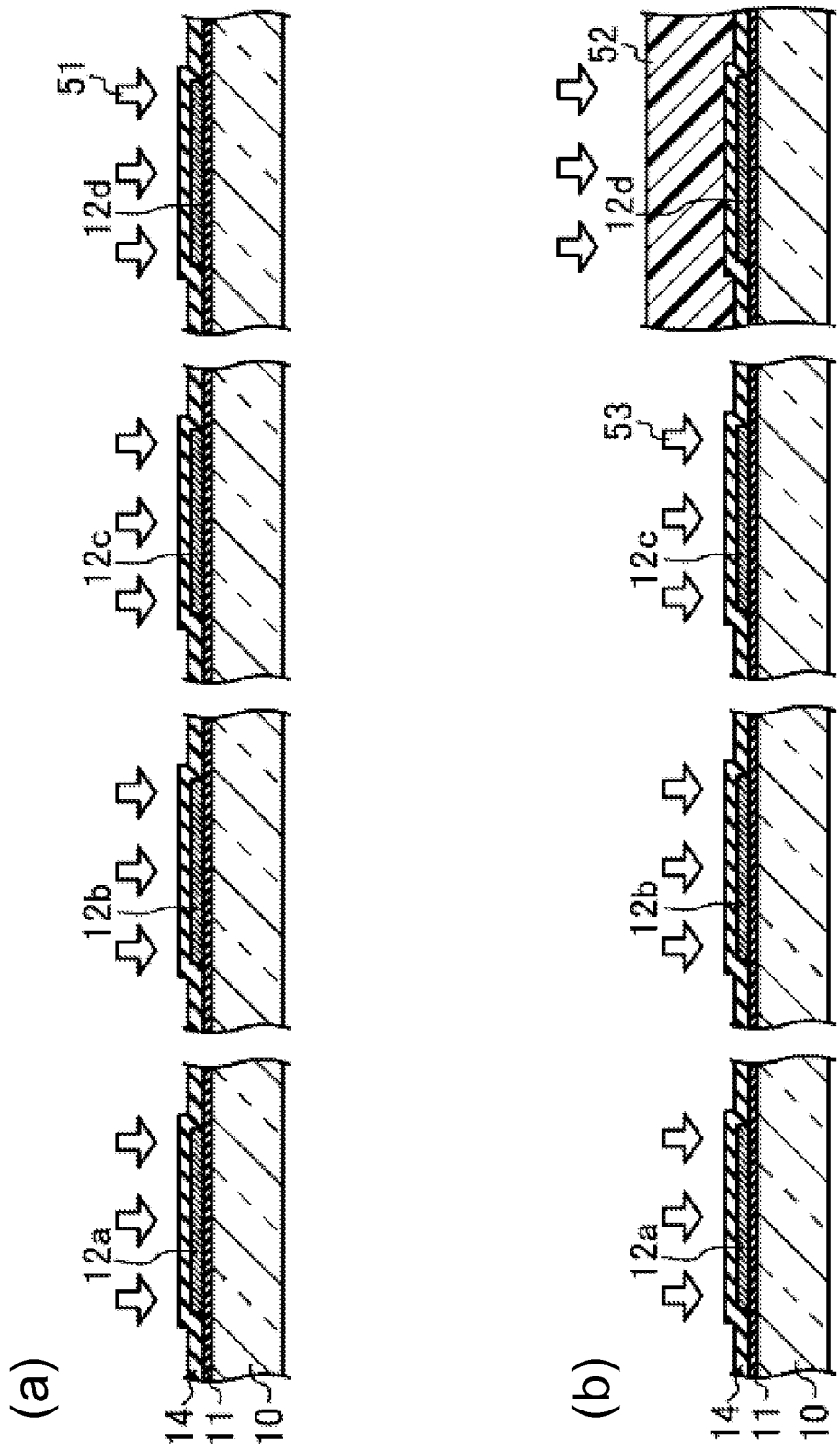
FIGS. 41(a) and 41(b) are cross-sectional views corresponding to the respective views of FIG. 38, illustrating a conductive type adjusting process in the manufacturing method for a semiconductor device of Embodiment 4.
Figure 42:
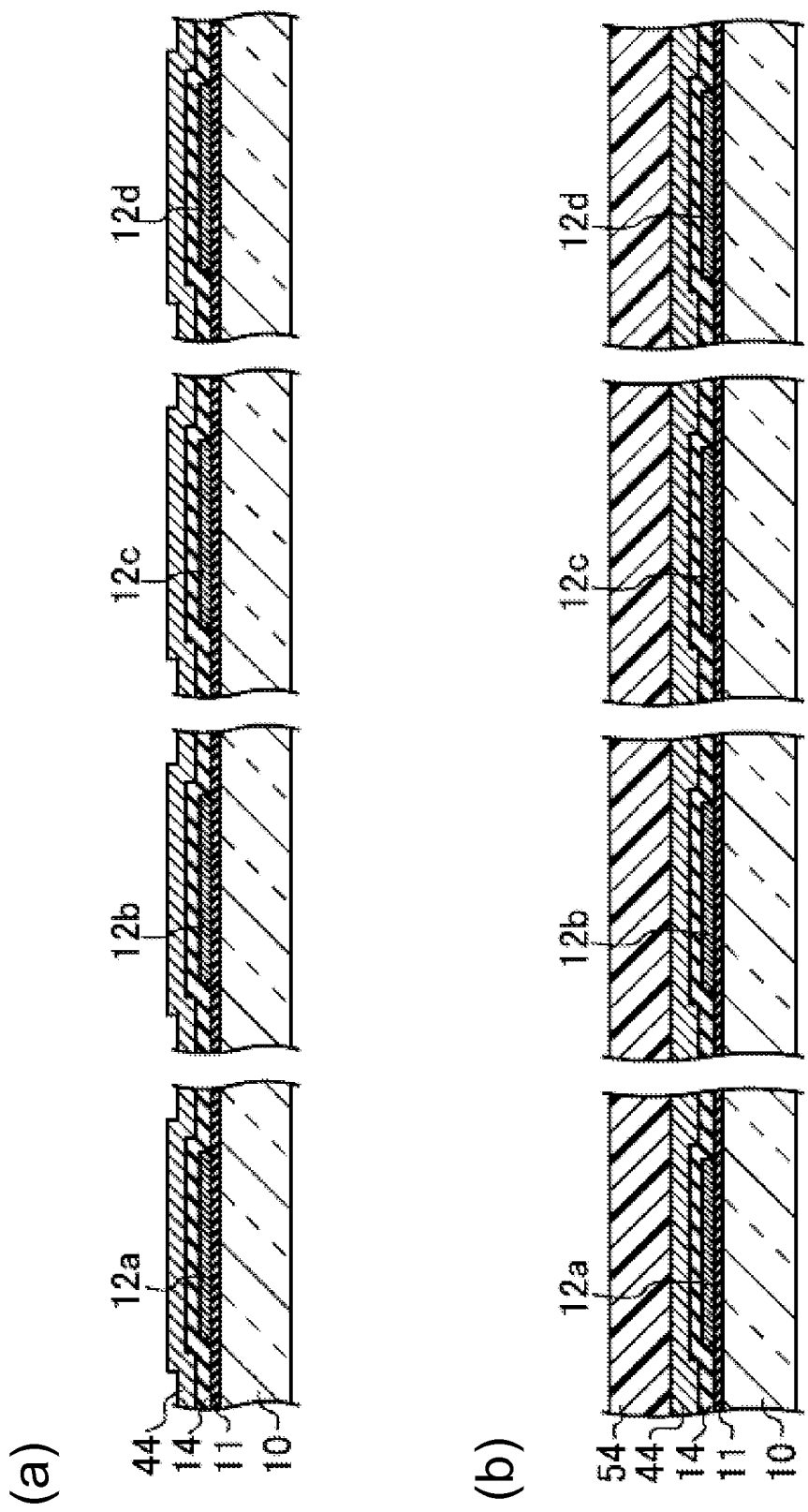
FIGS. 42(a) and 42(b) are cross-sectional views corresponding to the respective views of FIG. 38, illustrating the first half of a first gate electrode forming process in the manufacturing method for a semiconductor device of Embodiment 4.
Figure 43:
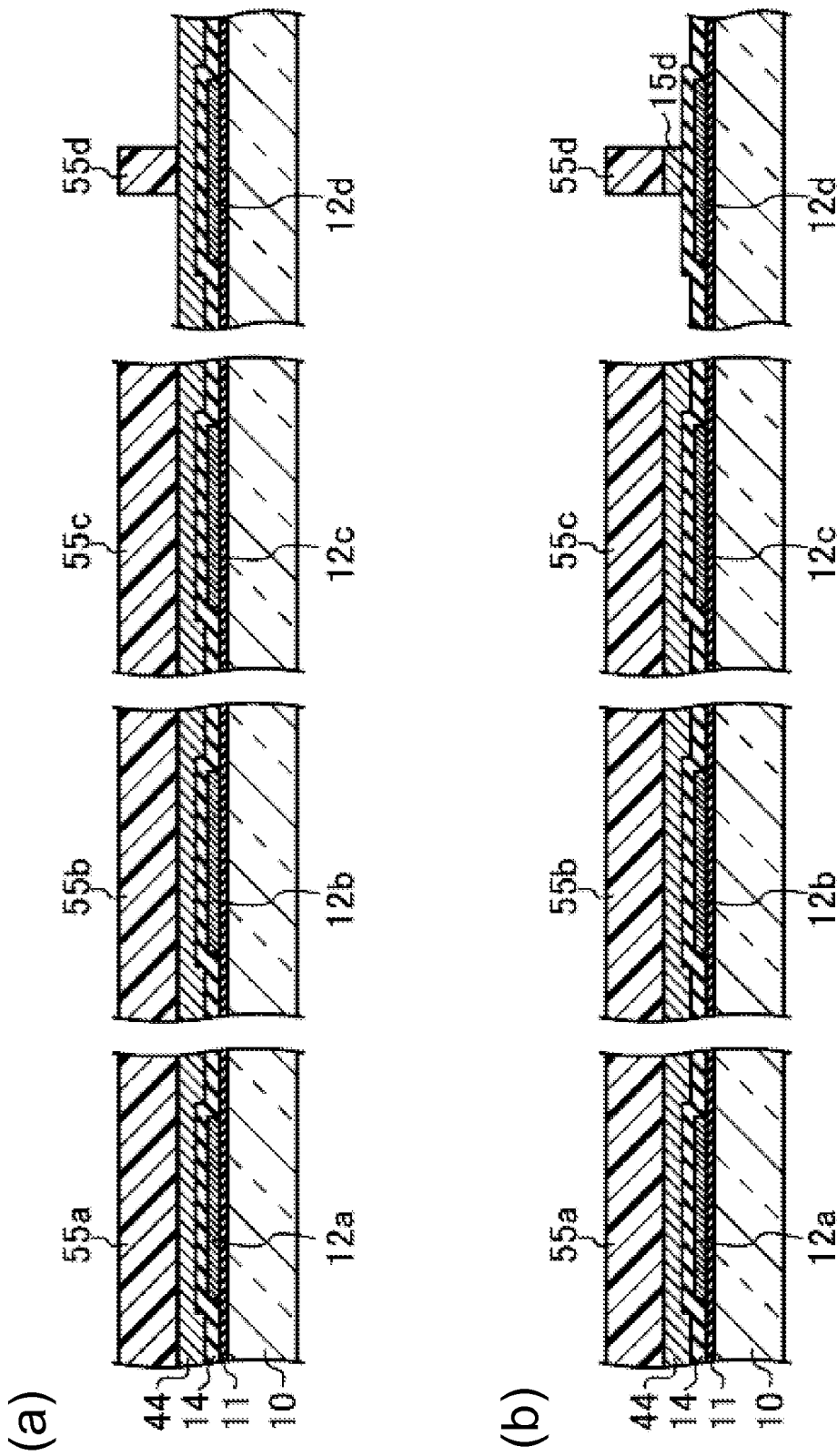
FIGS. 43(a) and 43(b) are cross-sectional views corresponding to the respective views of FIG. 38, illustrating the second half of a first gate electrode forming process in the manufacturing method for a semiconductor device of Embodiment 4.
Figure 44:
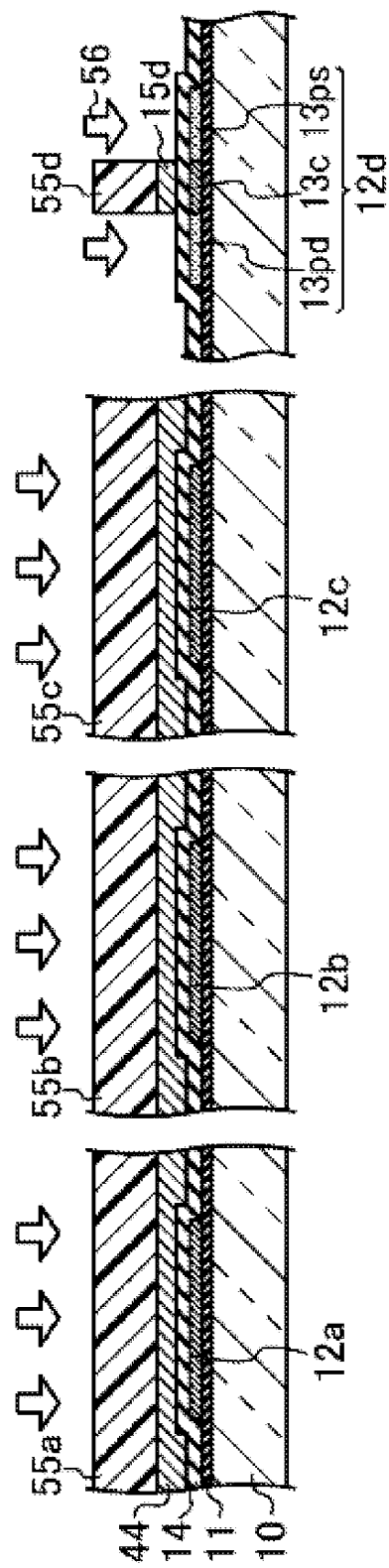
FIG. 44 shows cross-sectional views corresponding to the respective views of FIG. 38, illustrating a process to form p-type high-concentration impurity regions in the manufacturing method for a semiconductor device of Embodiment 4.
Figure 45:
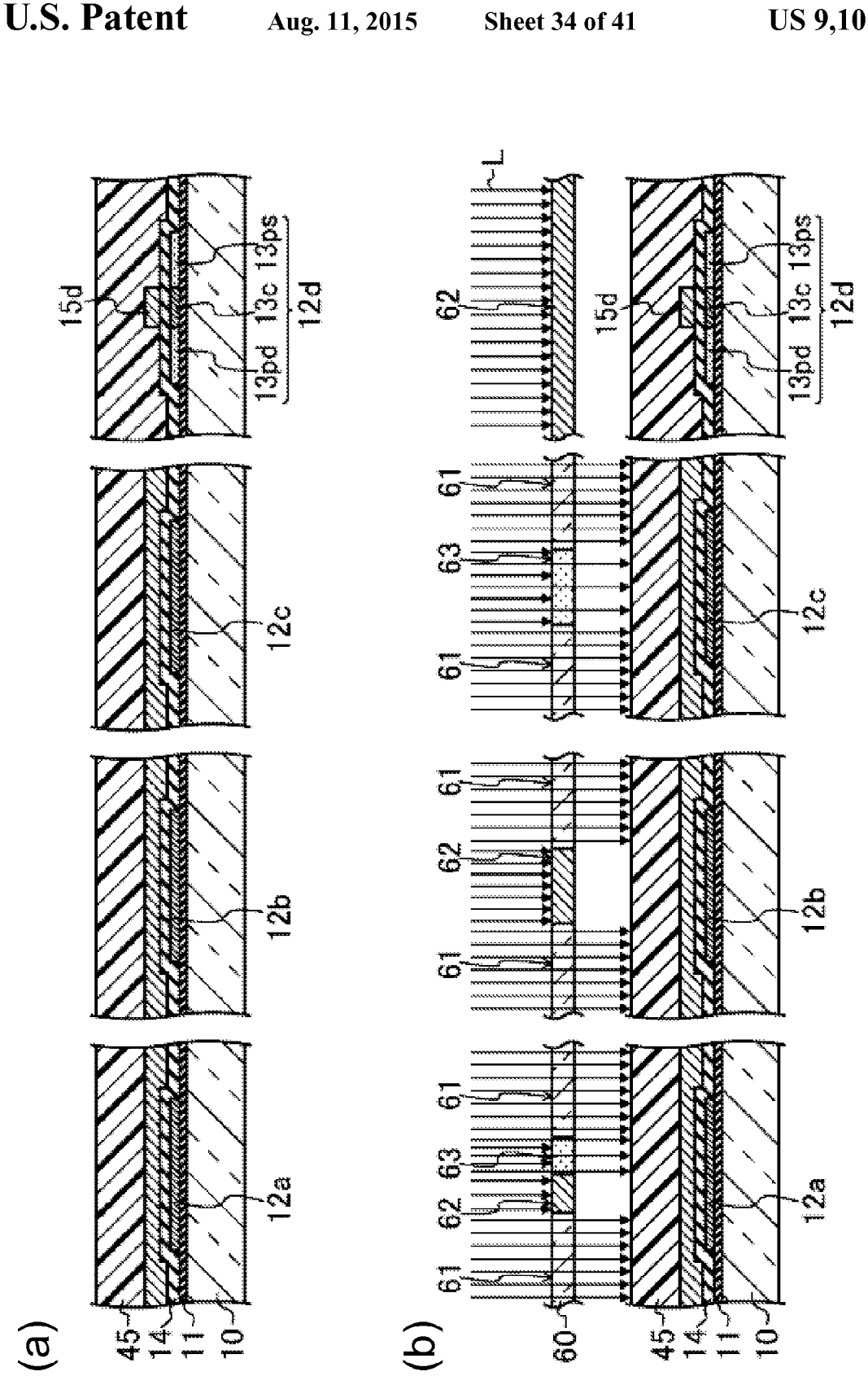
FIGS. 45(*a*) and 45(*b*) are cross-sectional views corresponding to the respective views of FIG. 38, illustrating the first half of a second gate electrode forming process in the manufacturing method for a semiconductor device of Embodiment 4.
Figure 46:
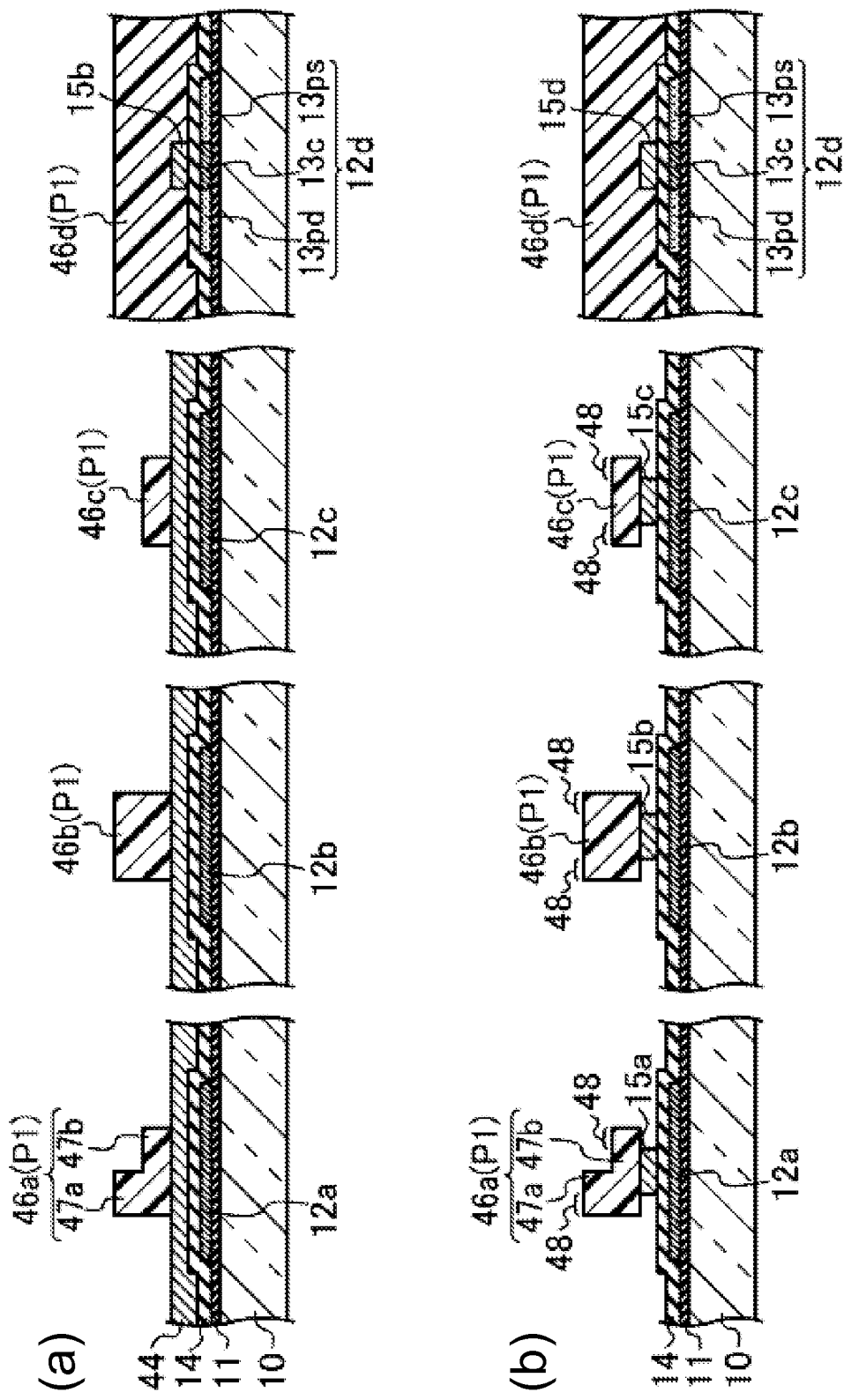
FIGS. 46(*a*) and 46(*b*) are cross-sectional views corresponding to the respective views of FIG. 38, illustrating the second half of a second gate electrode forming process in the manufacturing method for a semiconductor device of Embodiment 4.
Figure 47:
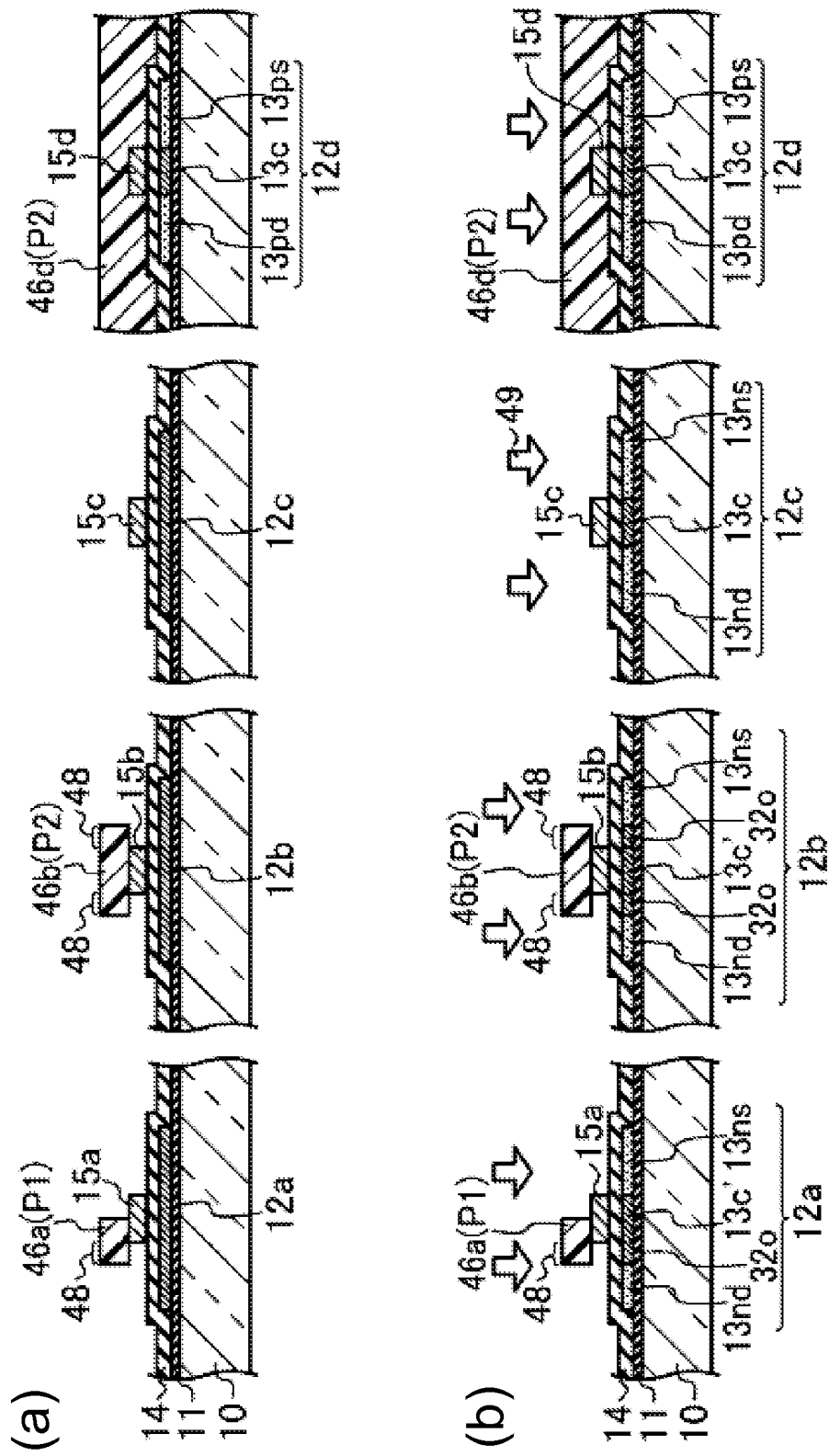
FIGS. 47(*a*) and 47(*b*) are cross-sectional views corresponding to the respective views of FIG. 38, illustrating a process to form n-type high-concentration impurity regions in the manufacturing method for a semiconductor device of Embodiment 4.
Figure 48:
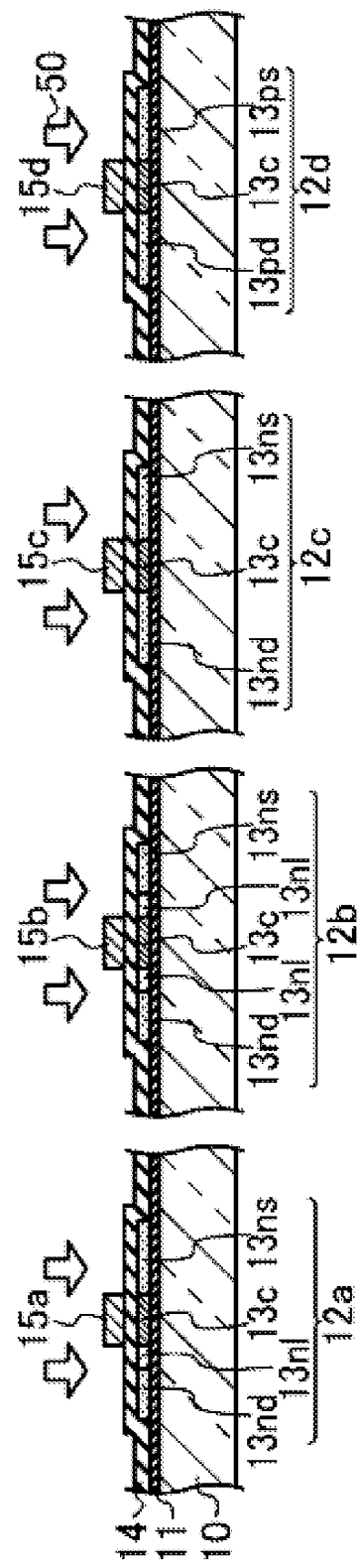
FIG. 48 shows cross-sectional views corresponding to the respective views of FIG. 38, illustrating a process to form n-type low-concentration impurity regions in the manufacturing method for a semiconductor device of Embodiment 4.
Figure 49:
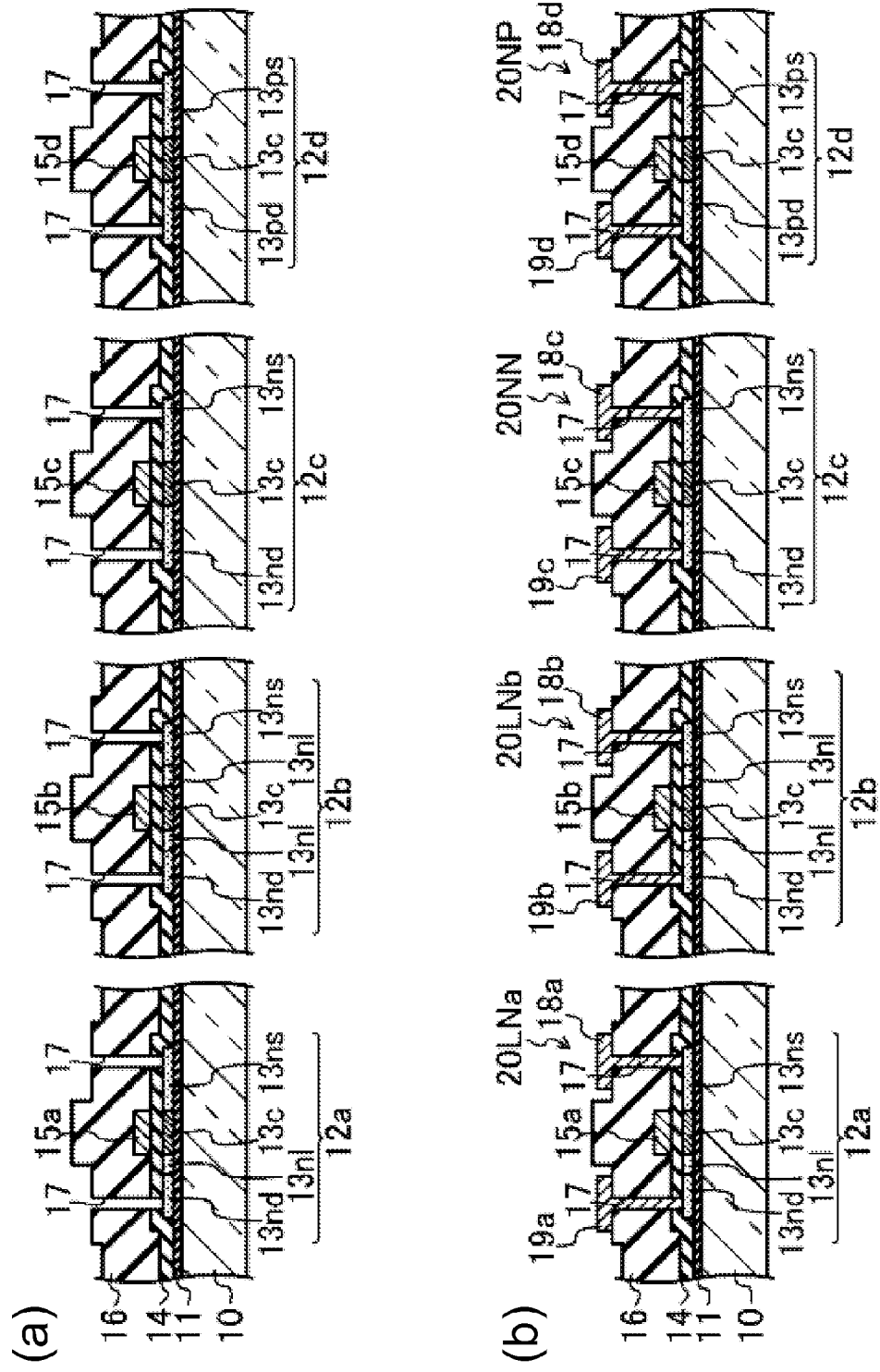
FIGS. 49(*a*) and 49(*b*) are cross-sectional views corresponding to the respective view of FIG. 38, illustrating respective steps after a step to form an interlayer insulating film in the manufacturing method for a semiconductor device of Embodiment 4.

FIG. 39 shows cross-sectional views of a semiconductor layer forming process. FIG. 40 is a cross-sectional view illustrating a gate insulating film forming step and an impurity level adjusting step. FIGS. 41(a) and 41(b) are cross-sectional views showing a conductive type adjusting process. FIGS. 42(a) and 42(b) and FIGS. 43(a) and 43(b) are cross-sectional views showing a first gate electrode forming step. FIG. 44 shows cross-sectional views illustrating a p-type high-concentration impurity region forming process. FIGS. 45(a) and 45(b) and FIGS. 46(a) and 46(b) are cross-sectional views showing a second gate electrode forming step. FIGS. 47(a) and 47(b) are cross-sectional views illustrating an n-type high-concentration impurity region forming process. FIG. 48 shows cross-sectional views illustrating an n-type low-concentration impurity region forming step. FIGS. 49(a) to 49(c) are cross-sectional views showing respective processes after an interlayer insulating film forming process. FIGS. 39 to 49(a) and 49(c) respectively show corresponding portions of FIG. 38.

The manufacturing method for the semiconductor device S of the present embodiment includes a base insulating film forming process, a semiconductor layer forming process, a gate insulating film forming process, a conductive type adjusting process, a first gate electrode forming process, a p-type high-concentration impurity region forming process, a second gate electrode forming process, an n-type high-concentration impurity region forming process, an n-type low-concentration impurity region forming process, an interlayer insulating film forming process, a source/drain electrode forming process, and a protective insulating film forming process.

The base insulating film forming process is similar to that in Embodiment 1, and therefore, detailed descriptions thereof are omitted.

<Semiconductor Layer Forming Process>

After the polysilicon film 42 is formed in a manner similar to Embodiment 1, the polysilicon film 42 is patterned by photolithography using a first photomask, and thus, as shown in FIG. 39, the first semiconductor layer 12a, the second semiconductor layer 12d, the third semiconductor layer 12b, and the fourth semiconductor layer 12c are formed (semiconductor layer forming step). In the present embodiment also, at this point, the energy level of the first semiconductor layer 12a, the second semiconductor layer 12d, the third semiconductor layer 12b, and the fourth semiconductor layer 12c are moved toward the donor level as a result of being affected by the base insulating film 11.

<Gate Insulating Film Forming Process>

On the substrate upon which the first semiconductor layer 12a, the second semiconductor layer 12d, the third semiconductor layer 12b, and the fourth semiconductor layer 12c are formed, in a similar manner to Embodiment 1, as shown in FIG. 40, the gate insulating film 14 is formed (gate insulating film forming step).

<Conductive Type Adjusting Process>

The conductive type adjusting process adjusts the concentration of impurities included in the first semiconductor layer 12a, the second semiconductor layer 12d, the third semiconductor layer 12b, and the fourth semiconductor layer 12c such that the first semiconductor layer 12a, the third semiconductor layer 12b, and the fourth semiconductor layer 12c have a p-type conductivity, which is a first conductivity type, and such that the second semiconductor layer 12d has an n-type conductivity, which is a second conductivity type.

For example, first, as shown in FIG. 41(a), boron (B) is implanted at a low concentration as a p-type impurity by ion doping into the entirety of the first semiconductor layer 12a, the second semiconductor layer 12d, the third semiconductor layer 12b, and the fourth semiconductor layer 12c covered by the gate insulating film 14. The arrows 51 shown in FIG. 41(a) indicate the direction in which the boron (B) is implanted in this process.

In this manner, the depth of the donor level of the second semiconductor layer 12d is adjusted such that the prescribed threshold voltage of the p-type TFT 20NP that includes the second semiconductor layer 12d is achieved by the conductive characteristics of the channel region 13c that will be formed later.

Next, the gate insulating film 14 is coated with a photosensitive resin by a spin-coating method, thereby forming a photosensitive resin film. Thereafter, by patterning this photosensitive resin film by using the second photomask, as shown in FIG. 41(b), a resist layer 52 that covers a portion above the second semiconductor layer 12d of the p-type TFT 20NP is formed.

Next, boron (B) as a p-type impurity is injected again into the entire first semiconductor layer 12a, third semiconductor layer 12b, and fourth semiconductor layer 12c by ion-doping, using the resist layer 52 as a mask. The arrows 53 shown in FIG. 41(b) indicate the direction in which the boron (B) is implanted in this step.

As a result, the impurity level of the first semiconductor layer 12a, the third semiconductor layer 12b, and the fourth semiconductor layer 12c is set to the acceptor level, and the depth thereof is adjusted such that the conductivity characteristics of the channel regions 13c formed later bring about a prescribed threshold voltage to the TFTs 20LNa, 20LNb, and 20NN constituted of the respective semiconductor layers 12a, 12b, and 12c.

The first boron (B) implantation into the second semiconductor layer 12b of the p-type TFT 20NP does not necessarily have to be performed, and may be performed as necessary, taking into account the depth of the donor level of the second semiconductor layer 12b of the p-type TFT 20NP.

This conductive type adjusting process corresponds to a conductive type adjusting step in the present invention.

<First Gate Electrode Forming Process>

As shown in FIG. 42(a), on the substrate including the first semiconductor layers 12a, the second semiconductor layers 12d, the third semiconductor layers 12b, and the fourth semiconductor layers 12c having the conductive type thereof adjusted, the conductive film 44 for forming the gate electrode is formed in a manner similar to Embodiment 1 (conductive film forming step).

Next, as shown in FIG. 42(b), the conductive film 44 that is used to form gate electrodes is coated with a positive type photosensitive resin by spin-coating or slit-coating, thereby forming a first photosensitive resin film 54 (approximately 1 μm to 2 μm in thickness, for example) (first photosensitive resin film forming step).

Next, by controlling the amount of light to which the uncured first photosensitive resin film 54 is exposed using the third photomask and then performing developing thereon after exposure, the first photosensitive resin film 54 is patterned, and as shown in FIG. 43(a), a resist layer (first resist layer) 55a is formed over the entire first semiconductor layer 12a, a resist layer (second resist layer) 55d is formed over the gate electrode formation region in the second semiconductor layer 12d, a resist layer 55b is formed over the third semiconductor layer 12b, and a resist layer 55c is formed over the entire fourth semiconductor layer 12c (first photosensitive resin patterning step).

With these resist layers 55a, 55d, 55b, and 55c as masks, the conductive film 44 is patterned by dry etching, which has high anisotropy, and thus, as shown in FIG. 43(b), the gate electrode 15d is formed over the second semiconductor layer 12d (first conductive film patterning step).

<p-Type High-Concentration Impurity Region Forming Process>

After the gate electrode 15d is formed in the first gate electrode forming step, as shown in FIG. 44, boron (B) as a p-type impurity is implanted at a high concentration by ion doping in the third semiconductor layer 12c with the resist layers 55a, 55d, 55b, and 55c as masks (first conductivity type impurity implantation step). The arrows 56 shown in FIG. 44 indicate the direction in which the boron (B) is implanted in this step.

As a result, p-type high concentration impurity regions 13ph functioning respectively as the source region and the drain region are formed on both sides of the position corresponding to the gate electrode 15d in the second semiconductor layer 12d. Then, in the portion of the second semiconductor layer 12d below the gate electrode 15d, a channel region 13c is formed in a self-aligned manner.

Thereafter, the resist layers 55a, 55d, 55b, and 55c are removed by a resist removal solution, ashing, or the like (first and second resist layers removal step).

<Second Gate Electrode Forming Process>

On the conductive film 44 for forming the gate electrode left over from forming the gate electrode 15d in the manner above, as shown in FIG. 45(a), a positive-type photosensitive resin is coated, thus forming a second photosensitive resin film 45 (approximately 1 μm to 2 μm in thickness, for example) in a manner similar to Embodiment 1 (second photosensitive resin film forming step).

Next, as shown in FIG. 45(b), an exposure process is conducted by using a fourth photomask to control an amount of exposure light that is radiated to the uncured second photosensitive resin film 45. In this exposure process, a gray tone mask 60 shown in FIG. 6 that is a type of a multiple gradation mask is used as the fourth photomask.

If the gray tone mask 60 used in the present embodiment is disposed at a prescribed position facing the second photosensitive resin film 45, the light-shielding portion 62 is formed over one side (left side of FIG. 45(b)) of the region where the gate electrode is to be formed in the first semiconductor layer 12a, over the entire second semiconductor layer 12d, and over the gate electrode formation region in the third semiconductor layer 12b. On the other hand, the semi-transmissive portion 63 is formed over a region over the other side of the region where the gate electrode is to be formed (right side of FIG. 45(b)) above the first semiconductor layer 12a and over the region where the gate electrode is to be formed corresponding in position to the fourth semiconductor layer 12c, when the gray tone mask 60 is disposed at a prescribed position to face the second photosensitive resin film 45.

When performing exposure on the second photosensitive resin film 45, as shown in FIG. 45(b), the gray tone mask 60 is disposed at a prescribed position facing the second photosensitive resin film 45, and then ultraviolet light L is radiated thereon from a side of the gray tone mask 60 opposite to the insulating substrate 10. Then, the second photosensitive resin film 45 is exposed through the gray tone mask 60.

Then, in the second photosensitive resin film 45, one side portion (left side portion of FIG. 45(b)) of the gate electrode 15a formation region in the first semiconductor layer 12a facing the light-shielding portion 62, the entire second semiconductor layer 12d, and the entire gate electrode 15b formation region in the third semiconductor layer 12b are completely unexposed to light, and the other side portion (right side portion of FIG. 45(b)) of the gate electrode formation region in the first semiconductor layer 12a facing the semi-transmissive portion 63, and the gate electrode formation region in the fourth semiconductor layer 12c are exposed to an amount of light that is less than the portion facing the transmissive portion 61.

Thereafter, a developing process is performed on the second photosensitive resin film 45 that has been exposed (photosensitive resin film patterning step). As a result, the second photosensitive resin film 45 is patterned, and as shown in FIG. 46(a), a resist layer (third resist layer) 46a similar to Embodiment 1 is formed for forming the gate electrode over the first semiconductor layer 12a, a resist layer (fourth resist layer) 46d with a relatively large thickness that is even is formed over the entire second semiconductor layer 12d, a resist layer 46b with a relatively large thickness that is even is formed for forming the gate electrode over the third semiconductor layer 12b, and a resist layer 46c with a relatively small thickness that is even is formed for forming the gate electrode over the fourth semiconductor layer 12c.

More specifically, on the gate electrode formation region in the first semiconductor layer 12a, a resist layer 46a having a thick film portion 47a in the side where the drain region is to be formed and a thin film portion 47b in the side where the source region is to be formed is formed, the resist layer 46a being somewhat wider than the gate electrode 15a to be formed. The resist layer 46d with an even thickness that is approximately the same as the thick film portion 47a is formed over the entire second semiconductor layer 12d. A resist layer 46b with an even thickness that is approximately the same as the thick film portion 47a is formed somewhat wider than the gate electrode 15b to be formed over the gate electrode formation region in the third semiconductor layer 12b. Also, the resist layer 46c, which has an even thickness that is approximately the same as the thin film portion 47b and somewhat wider than the gate electrode 15c to be formed, is formed on the gate electrode formation region in a position corresponding to the fourth semiconductor layer 12c. These resist layers 46a, 46d, 46b, and 46c constitute first resist patterns P1.

With these resist layers 46a, 46d, 46b, and 46c as masks, isotropic wet etching is used to pattern the conductive film 44, and thus, as shown in FIG. 46(b), gate electrodes 15a, 15b, and 15c are respectively formed over the first semiconductor layer 12a, over the third semiconductor layer 12b, and over the fourth semiconductor layer 12c (conductive film patterning step).

At this time, the etching time is adjusted and by side etching, portions of the conductive films 44 at the periphery of the resist layers 46a, 46b, and 46c are also removed, and the gate electrodes 15a, 15b, and 15c are withdrawn towards the interior of the respective resist layers 46a, 46b, and 46c, thus being narrower than the corresponding resist layers 46a, 46b, and 46c. As a result, the respective resist layers 46a, 46b, and 46c each have overhanging portions 48 that overhang both of the respective sides of the gate electrodes 15a, 15b, and 15c in an eave-like shape.

<n-Type High-Concentration Impurity Region Forming Process>

The resist layers 46a, 46b, 46c, and 46d are removed gradually from the surface side by ashing, and as shown in FIG. 47(a), once the entire thin film portion 47b and resist layer 46c are completely removed, ashing is stopped (thin film portion removal step).

As a result, in the resist layer 46a, the thin film portion 47b is completely removed and the thick film portion 47a is thinned and left remaining, which causes the overhang portion 48 to hang over only one side of the gate electrode 15a. Also, the entirety of the resist layers 46d and 46b is thinned and left remaining. The entire resist layer 46c is completely removed. The resist layers 46a, 46d, and 46b remaining at this stage constitute a second resist pattern P2.

Next, as shown in FIG. 47(b), phosphorus (P) as an n-type impurity is implanted at a high concentration by ion doping in the first semiconductor layer 12a with the resist layer 46a constituted of a constituent portion of the thinned thick film portion and the gate electrode 15a as masks, in the third semiconductor layer 12b with the thinned resist layer 46b as a mask, and in the fourth semiconductor layer 12c with the gate electrode 15b as a mask (impurity implantation step; high-concentration impurity implantation step).

As a result, in the first semiconductor layer 12a, an n-type high-concentration impurity region 13ns functioning as the source region is formed on one side (right side of FIG. 47(b)) of the channel region formation portion 13c' without forming a gap between the n-type high-concentration impurity region 13ns and the channel region formation portion 13c', which is formed at a position corresponding to the gate electrode 15a, and an n-type high-concentration impurity region 13nd functioning as the drain region is formed on the other side (left side of FIG. 47(b)) of the channel region formation portion 13c' with a gap between the n-type high-concentration impurity region 13nd and the channel region formation portion 13c', the gap corresponding in width to the overhang portion 48 that hangs over from the resist layer 46a. Then, between the n-type high-concentration impurity region 13nd functioning as the drain region in the first semiconductor layer 12a and the channel region formation portion 13c', an offset region 13o to which no impurity is implanted is formed.

On the other hand, in the third semiconductor layer 13b, the n-type high-concentration impurity regions 13ns and 13nd are formed on both sides of the channel region formation portion 13c' with gaps between the n-type high-concentration impurity regions 13ns and 13nd and the channel region formation portion 13c' corresponding in position to the gate electrode 15b, the gaps corresponding in width to the portions of the overhang portion 48 that hang over from the resist layer 46b. Between the channel region forming portion 13' in the third semiconductor layer 12b and the respective n-type high-concentration impurity regions 13ns and 13nd, offset regions 13o that are not doped with an impurity are formed.

Also, in the fourth semiconductor layer 12c, the n-type high-concentration impurity regions 13ns and 13nd functioning respectively as the source region and the drain region are formed on both sides of the portion corresponding in position to the gate electrode 15c without a gap between the high-concentration impurity regions 13ns and 13nd and the portion corresponding in position to the gate electrode 15c. Then, in the portion of the fourth semiconductor layer 12c below the gate electrode 15c, a channel region 13c is formed in a self-aligned manner.

<n-Type Low-Concentration Impurity Region Forming Process>

After forming the n-type high-concentration impurity regions 12ns and 12nd respectively in the first semiconductor layer 12a, the third semiconductor layer 12c, and the fourth semiconductor layer 12b as described above, the remaining resist layers 46a, 46d, and 46b are removed by a resist removal solution, ashing, or the like (third resist layer removal step; resist layer removal step).

Thereafter, as shown in FIG. 48, by ion-doping, phosphorus (P) as an n-type impurity is implanted at a low concentration into the first semiconductor layer 12a, the second semiconductor layer 12d, the third semiconductor layer 12b, and the fourth semiconductor layer 12c by using the gate electrodes 15a, 15b, 15c, and 15d as masks (low-concentration impurity implantation step).

As a result, phosphorus (P) is additionally implanted into the respective n-type high-concentration impurity regions 13ns and 13nd of the first semiconductor layer 12a, the third semiconductor layer 12b, and the fourth semiconductor layer 12c. Also, phosphorus (P) is implanted into the respective offset regions 13o in the first semiconductor layer 12a and third semiconductor layer 12b, thereby forming n-type low-concentration impurity regions 13nl in the respective offset regions 13o. A channel region 13c is formed in a self-aligned manner in each of the first semiconductor layer 12a and the third semiconductor layer 12b in positions corresponding to the gate electrodes 15a and 15b.

At this time, phosphorus (P) is also injected into the respective p-type high-concentration impurity regions 13ph of the second semiconductor layer 12d, but because of a low concentration thereof, the characteristics of the respective p-type high-concentration impurity regions 13ph are not affected.

<Respective Processes after Interlayer Insulating Film Forming Process>

After the n-type low concentration impurity region forming process, as shown in FIGS. 49(a) and 49(b), the interlayer insulating film forming process and the source/drain electrode forming process are performed in that order, and in addition, the protective insulating film forming process is also performed thereafter as in Embodiment 1.

By performing the respective processes above, it is possible to manufacture a semiconductor device S including single LDD structure TFTs 20LNa, a double LDD structure TFTs 20LNb, and a normal structure n-type TFT 20NN and p-type TFT 20NP.

—Effects of Embodiment 4—

According to Embodiment 4, it is possible to attain effects similar to Embodiment 1, and single LDD structure TFTs 20LNa, double LDD structure TFTs 20LNb, normal structure n-type TFTs 20NN, and normal structure p-type TFTs 20NP are formed together on the same substrate 10. With the combination of the both LDD structure n-type TFTs 20LNa and 20LNb and normal structure n-type TFTs 20NN and p-type TFTs 20NP, the number of types of circuits that can be formed is even greater than in Embodiment 3 with the addition of the normal structure p-type TFTs, and thus, the design flexibility of the circuit can be made as high as possible.

Furthermore, it is possible to form a CMOS with the combination of the n-type TFTs 20LNa, 20LNb, and 20NN and the p-type TFTs 20NP, and thus, in the semiconductor device S, power consumption is reduced, and the respective circuits can be designed so as to take up less space, and thus, a semiconductor device S having excellent performance can be attained.

Modification Example of Embodiment 4

Figure 50:
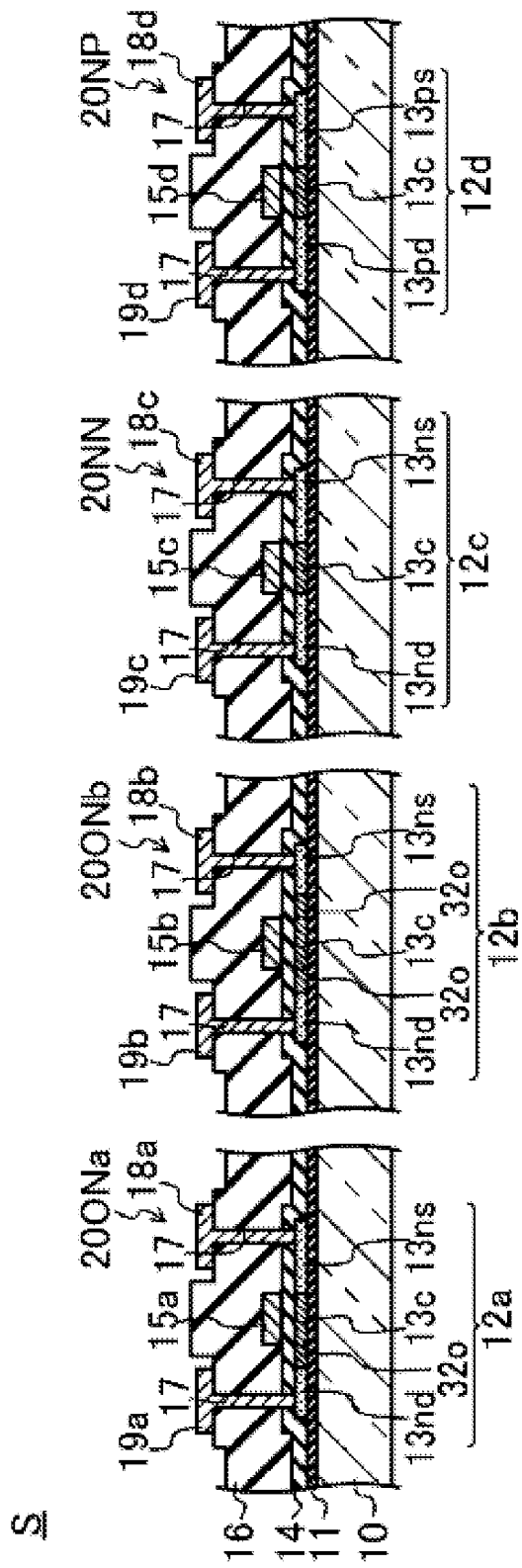
FIG. 50 shows cross-sectional views in order from the left side of the page showing cross-sectional structures of a single offset structure n-type TFT, a double offset structure n-type TFT, a normal structure n-type TFT, and a normal structure p-type TFT included in a semiconductor device of a modification example of Embodiment 4.

FIG. 50 shows respective cross-sectional views from the left side of the page of a single offset structure n-type TFT 20ONa, a double offset structure n-type TFT 20ONb, and a normal structure n-type TFT 20NN and p-type TFT 20NP included in a semiconductor device S according to the present modification example.

As shown in FIG. 50, the semiconductor device S of the present modification example includes a single offset structure n-type TFT 20ONa instead of the single LDD structure n-type TFT 20LNa, and a double LDD structure n-type TFT 20ONb instead of the double LDD structure n-type TFT 20LNb.

The single offset structure TFT 20ONa has the same structure as the TFT 20ONa with the same structure described in the modification example of Embodiment 1. The double offset structure n-type TFT 20ONb has the same structure as the n-type TFT 20ONb of the same structure described in the modification example of Embodiment 2.

—Manufacturing Method—

A method for manufacturing a semiconductor device S including such a single offset structure n-type TFT 20ONa, double offset structure TFT 20ONb, and normal structure n-type TFT 20NN and p-type TFT 20NP will be described as an example with reference to FIGS. 51(a) and 51(b) and FIGS. 52(a) and 52(b).

Figure 51:
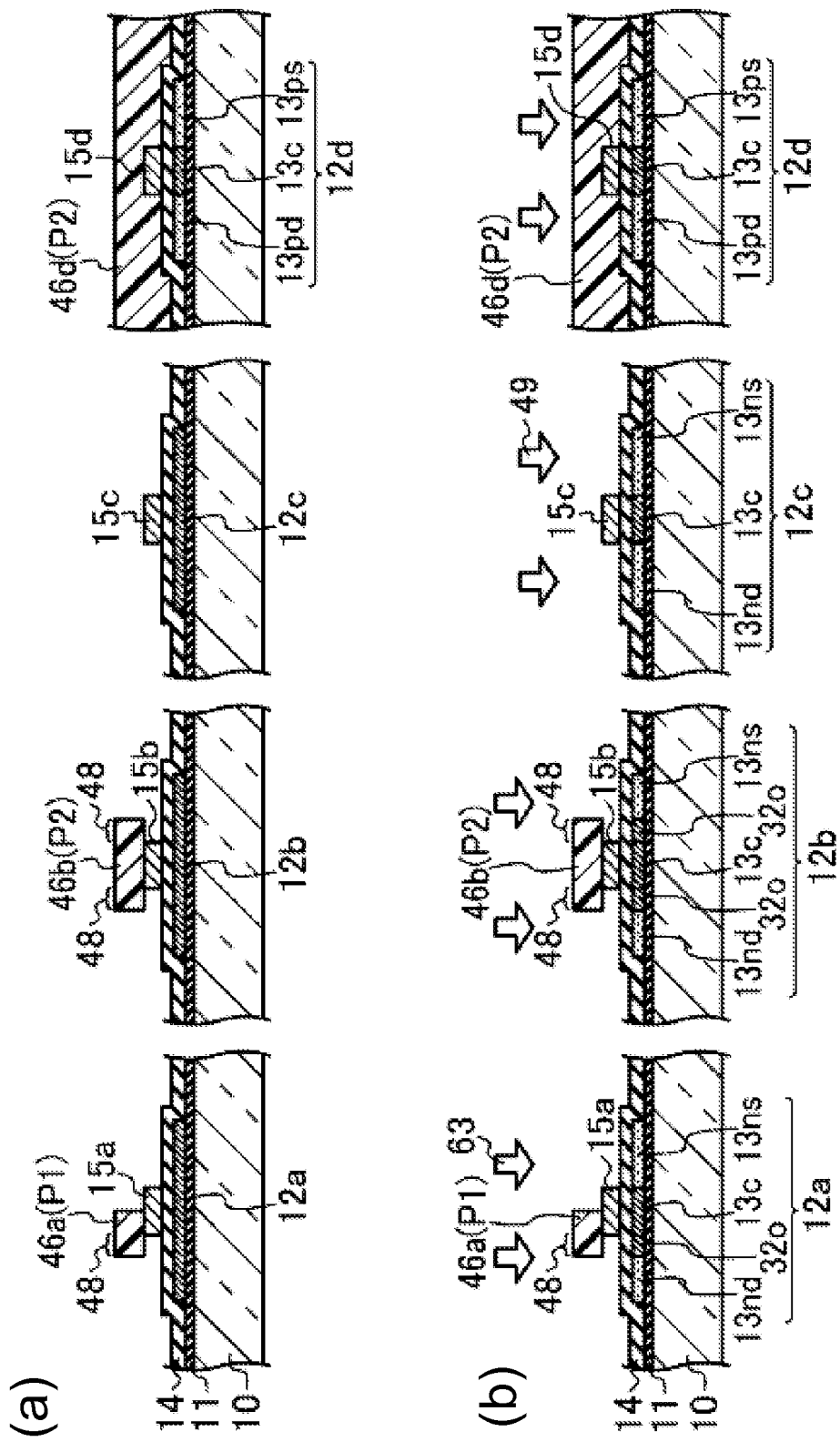
FIGS. 51(*a*) and 51(*b*) are cross-sectional views corresponding to the respective views of FIG. 50, illustrating a process to form n-type high-concentration impurity regions in the manufacturing method for a semiconductor device of a modification example of Embodiment 4.

FIGS. 51(a) and 51(b) are cross-sectional views illustrating an n-type high-concentration impurity region forming process. FIGS. 52(a) and 52(b) are cross-sectional views showing respective processes after an interlayer insulating film forming process. FIGS. 51(a) and 51(b) and FIGS. 52(a) and 52(b) respectively show portions corresponding to FIG. 50.

The manufacturing method for the semiconductor device S of the present modification example includes a base insulating film forming process, a semiconductor layer forming process, a gate insulating film forming process, a conductive type adjusting process, a first gate electrode forming process, a p-type high-concentration impurity region forming process, a second gate electrode forming process, an n-type high-concentration impurity region forming process, an interlayer insulating film forming process, a source/drain electrode forming process, and a protective insulating film forming process, but does not include an n-type low-concentration impurity region forming process.

The base insulating film forming process, the semiconductor layer forming process, the gate insulating film forming process, the conductive type adjusting process, the first gate electrode forming process, the p-type high-concentration impurity region forming process, and the second gate electrode forming process are similar to those in Embodiment 4, and therefore, detailed descriptions thereof are omitted.

<n-Type High-Concentration Impurity Region Forming Process>

After forming the respective gate electrodes 15a, 15b, and 15c in the second gate electrode forming process, the resist layers 46a, 46d, 46b, and 46c are ashed, thus removing them gradually from the surface, and as shown in FIG. 51(a), once the entirety of the thin film portion 47b and resist layer 46c is removed, ashing is stopped (thin film portion removal step).

As a result, in the resist layer 46a, the thin film portion 47b is completely removed and the thick film portion 47a is thinned and left remaining, which causes the overhang portion 48 to hang over only one side of the gate electrode 15a. Also, the entirety of the resist layers 46d and 46b is thinned and left remaining. The entire resist layer 46c is completely removed. The resist layers 46a, 46d, and 46b remaining at this stage constitute a second resist pattern P2.

Next, as shown in FIG. 51(b), phosphorus (P) as an n-type impurity is implanted at a high concentration by ion doping in the first semiconductor layer 12a with the resist layer 46a constituted of a constituent portion of the thinned thick film portion and the gate electrode 15a as masks, in the third semiconductor layer 12b with the thinned resist layer 46b as a mask, and in the fourth semiconductor layer 12c with the gate electrode 15c as a mask (impurity implantation step).

As a result, on both sides of the position in the first semiconductor layer 12a corresponding to the resist layer 46a and the gate electrode 15a, n-type high-concentration impurity regions 13ns and 13nd functioning respectively as the source region and the drain region are formed. At this time, the n-type high-concentration impurity region 13nd functioning as the drain region is formed with a gap from the position corresponding to the gate electrode 15a, the gap being equivalent in width to the overhang of the overhang portion 48 of the resist layer 46a. In addition, the channel region 13c is formed in the position of the first semiconductor layer 12a corresponding to the gate electrode 15a, and the offset region 13o is formed between the channel region 13c and the n-type high-concentration impurity region 13nd functioning as the drain region.

On the other hand, on both sides of a portion of the third semiconductor layer 12b below the resist layer 46b, n-type high-concentration impurity regions 13ns and 13nd, which function as a source region and a drain region, are formed. At this time, the n-type high-concentration impurity regions 13*ns* and 13*nd* are formed with gaps from the position corresponding to the gate electrode, the gaps corresponding in width to the overhang portions 48 that hang over from the resist layer 46*b*. Additionally, the channel region 13*c* is formed in the position corresponding to the gate electrode 15*b* of the third semiconductor layer 12*b*, and offset regions 13*o* are formed between the channel region 13*c* and the respective n-type high-concentration impurity regions 13*ns* and 13*nd*.

Also, in the fourth semiconductor layer 12*c*, the n-type high-concentration impurity regions 13*ns* and 13*nd* functioning respectively as the source region and the drain region are formed on both sides of the portion corresponding in position to the gate electrode 15*c* without a gap between the high-concentration impurity regions 13*ns* and 13*nd* and the portion corresponding in position to the gate electrode 15*c*. Then, in the portion of the fourth semiconductor layer 12*c* below the gate electrode 15*c*, a channel region 13*c* is formed in a self-aligned manner.

Thereafter, the remaining resist layers 46*a*, 46*d*, and 46*b* are removed by a resist removal solution, ashing, or the like (third resist layer removal step; resist layer removal step).

<Respective Processes after Interlayer Insulating Film Forming Process>

Figure 52:
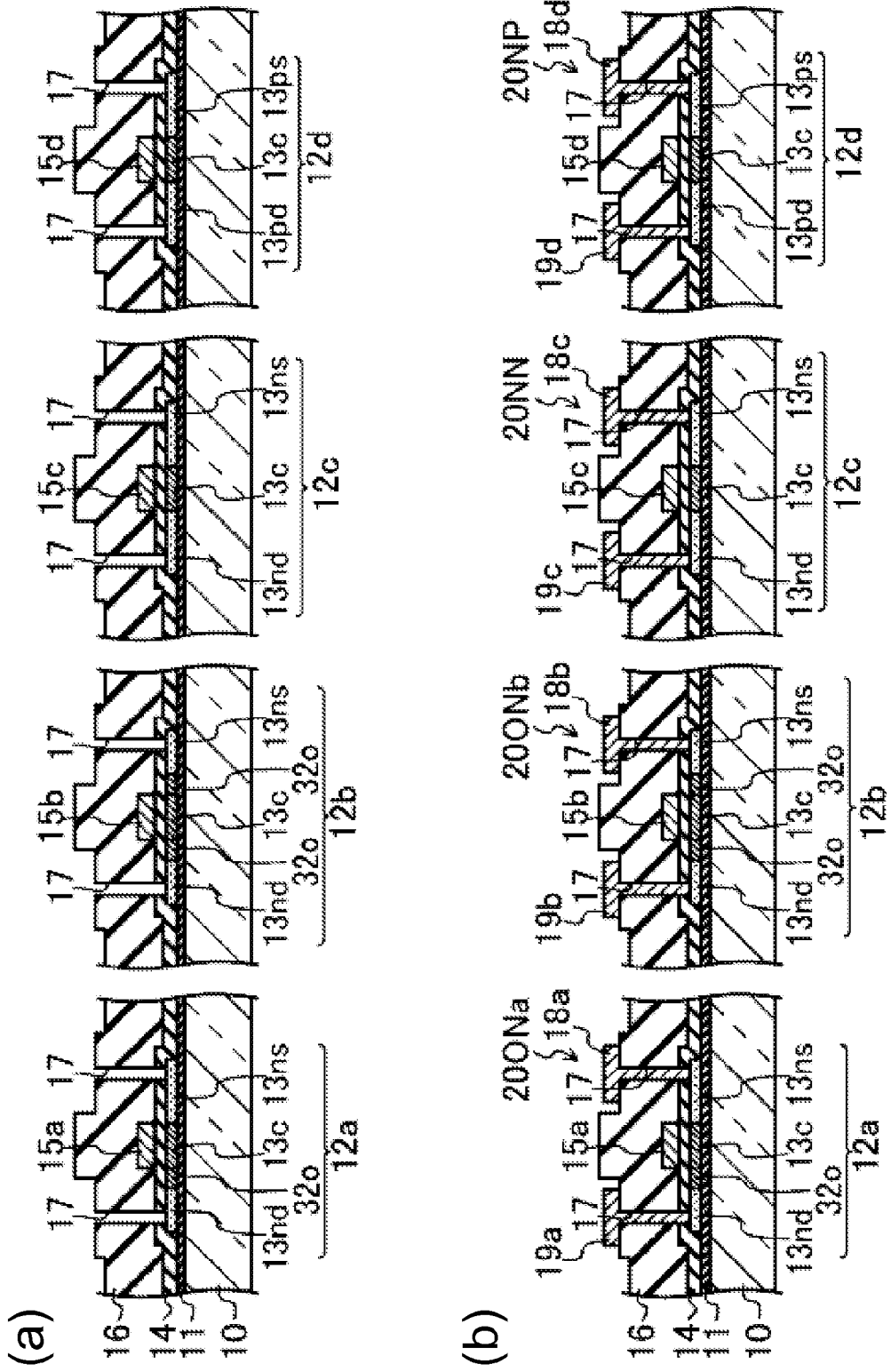
FIGS. 52(*a*) and 52(*b*) are cross-sectional views corresponding to the respective views of FIG. 50, illustrating respective steps after a step to form an interlayer insulating film in the manufacturing method for a semiconductor device of a modification example Embodiment 4.

After the n-type low concentration impurity region forming process, as shown in FIGS. 52(*a*) and 52(*b*), the interlayer insulating film forming process and the source/drain electrode forming process are performed in that order, and in addition, the protective insulating film forming process is also performed thereafter as in Embodiment 1.

In the manner above, a semiconductor device S can be manufactured in which impurities are not implanted in the respective offset regions 13*o* of the first semiconductor layer 12*a* and third semiconductor layer 12*b* in the respective steps after the n-type high-concentration impurity regions 13*ns* and 13*nd* are formed, the semiconductor device S including single offset structure n-type TFTs 20ONa, double offset structure n-type TFTs 20ONb, and normal structure n-type TFTs 20NN and p-type TFTs 20NP.

—Effects of Modification Example of Embodiment 4—

According to this modification example, it is possible to attain effects similar to Embodiment 4 without the need for impurity implantation (low-concentration impurity implanting step) in the respective offset regions 13*o* of the first semiconductor layer 12*a* and the third semiconductor layer 12*b*, and thus, compared to Embodiment 4 in which the single LDD structure n-type TFT 20LNa and the double LDD structure TFT 20LNb are formed, the number of steps can be reduced in an excellent manner, thus allowing a less expensive semiconductor device S to be manufactured.

Other Embodiments

Embodiments 1 to 4 and the modification examples thereof may be modified as follows.

<Configuration of Semiconductor Device S>

In Embodiment 3, the semiconductor device S includes single LDD structure n-type TFTs 20LNa, double LDD structure n-type TFTs 20LNb, and normal structure n-type TFTs 20NN, but the present invention is not limited thereto, and the semiconductor device S may be constituted only of single LDD structure n-type TFTs 20LNa and normal structure n-type TFTs 20NN.

Also, in Embodiment 4, the semiconductor device S includes normal structure p-type TFTs 20NP in addition to single LDD structure n-type TFTs 20LNa, double LDD structure n-type TFTs 20LNb, and normal structure n-type TFTs 20NN, but the present invention is not limited thereto. For example, the semiconductor device S may include only single LDD structure n-type TFTs 20LNa and normal structure n-type TFTs 20NN and p-type TFTs 20NP, or may be include only single LDD structure n-type TFTs 20LNa, double LDD structure n-type TFTs 20LNb, and normal structure p-type TFTs 20NP.

<Configuration of Multiple Gradation Mask>

In the manufacturing method for the active matrix substrate 1 described above, the gray tone mask 60 in which a plurality of light-shielding layers 65 are arranged in a stripe pattern in the semi-transmissive portion 63 was used as the multiple gradation mask, but the present invention is not limited to such.

For example, in the semi-transmissive portion 63 of the gray tone mask 60, light-shielding layers may be formed in a mesh pattern. Also, instead of the gray tone mask 60, a halftone mask that conducts intermediate exposure by using a semi-transmissive film may be used as the multiple gradation mask.

<Impurity and Implantation Method Thereof>

In the impurity level adjusting process, the conductive type adjusting process, the n-type or p-type high-concentration impurity region forming process, and the n-type low-concentration impurity region forming process, the impurities were implanted by ion-doping, but the present invention is not limited to such. The impurity may be implanted by using other known methods such as an ion shower doping method.

Also, in the impurity level adjusting process, the conductive type adjusting process, the n-type or p-type high-concentration impurity region forming process, and the n-type low-concentration impurity region forming process, boron (B) was used as the p-type impurity and phosphorus (P) was used as the n-type impurity, but the present invention is not limited thereto, and another p-type impurity other than boron (B) such as gallium (Ga) may be used as the p-type impurity, and another n-type impurity other than phosphorus (P) such as arsenic (As) may be used as the n-type impurity.

Preferred embodiments of the present invention and modification examples thereof were described above, but the technical scope of the present invention is not limited to the embodiments and modification examples above. It shall be understood by a person skilled in the art that the above embodiments and modification examples are illustrative, that various modifications can further be made to the combinations of the respective constituting elements and respective manufacturing processes, and that those modification examples are included in the scope of the present invention.

For example, an example was given in Embodiment 1 of a semiconductor device S being applied to an active matrix substrate included in an active matrix driven liquid crystal display device, but the present invention is not limited thereto. The semiconductor device S according to the present invention can be applied not only to a liquid crystal display device but various other display devices such as an organic EL display device or a plasma display device. Furthermore, the semiconductor device S can be applied to a memory device, an image sensor, or the like, and as long as the semiconductor device includes TFTs, it can be applied to a wide range of uses.

INDUSTRIAL APPLICABILITY

As described above, the present invention is useful as a manufacturing method for a semiconductor device including single LDD structure or single offset structure TFTs, and in particular, is suited to a manufacturing method for a semiconductor device in which excellent characteristics can be reliably attained in single LDD structure or single offset structure TFTs, and in which manufacturing the semiconductor device including such TFTs with a small number of photomasks while reducing the number of steps and reducing the cost is desired.

DESCRIPTION OF REFERENCE CHARACTERS

S semiconductor device
10 insulating substrate (base substrate)
12a first semiconductor layer
12b second semiconductor layer
12c third semiconductor layer
12d fourth semiconductor layer
13c channel region
13ns, 13nd n-type high-concentration impurity region
13nl n-type low-concentration impurity region
13ps, 13pd p-type high-concentration impurity region
14 gate insulating film
15a, 15b, 15c, 15d gate electrode
40 amorphous silicon film (semiconductor film)
42 polysilicon film (crystalline semiconductor film)
44 conductive film for forming gate electrodes
45 photosensitive resin film, second photosensitive resin film
46a first resist layer
46b second resist layer
46c third resist layer
46d fourth resist layer
47a thick film portion
47b thin film portion
48 overhang portion
50 gray tone mask (multiple gradation mask)

The invention claimed is:

1. A manufacturing method for a semiconductor device, comprising:
a semiconductor layer forming step of forming a semiconductor film on a base substrate and patterning the semiconductor film to form a semiconductor layer;
a gate insulating film forming step of forming a gate insulating film so as to cover the semiconductor layer;
a conductive film forming step of forming, on the gate insulating film, a conductive film that is used to form gate electrodes;
a photosensitive resin film forming step of forming a photosensitive resin film on the conductive film;
a photosensitive resin film patterning step of patterning the photosensitive resin film by exposure such that an amount of light radiated onto the photosensitive resin film is controlled by using a multiple gradation mask and then developing is performed on the photosensitive resin film, thereby forming a resist layer over a portion of the semiconductor layer, the resist layer having a thick film portion on one side, and a thin film portion that is thinner than the thick film portion on another side;
a conductive film patterning step of patterning the conductive film by isotropic etching using the resist layer as a mask and thereby forming a gate electrode that is narrower than the resist layer over the semiconductor layer, providing the resist layer with overhang portions that hang over both sides of the gate electrode in an eave-shape;
a thin film portion removal step of removing the thin film portion, and thereby shaping the resist layer having the overhang portions such that an overhang portion hangs over only one side of the gate electrode; and
an impurity implantation step of, after the thin film removal step, implanting a conductive impurity of a conductivity type different from a conductivity type of the semiconductor layer to the semiconductor layer using the resist layer as a mask, to form impurity implanted regions in the semiconductor layer respectively on both sides of a portion corresponding in position to the gate electrode, the impurity implanted region on one side of the gate electrode being formed with a gap therefrom corresponding to the overhang portion.

2. The manufacturing method for a semiconductor device according to claim 1,
wherein, in the impurity implantation step, in addition to forming the impurity implanted regions, a channel region is formed in a position corresponding to the gate electrode in the semiconductor layer, and an offset region in which the impurity is not implanted is formed in said gap between one of the impurity implanted regions and the channel region, and
wherein an impurity is not implanted in the offset region in a step after forming the impurity implanted regions.

3. The manufacturing method for a semiconductor device according to claim 1,
wherein the impurity implantation step is a high-concentration impurity implantation step,
wherein, in the high-concentration impurity implantation step, high-concentration impurity regions are formed as the impurity implanted regions, and
wherein the manufacturing method further comprises:
a resist layer removal step of removing the resist layer that remains after the high-concentration impurity implantation step; and
a low-concentration impurity implantation step of, after the resist layer removal step, implanting an impurity of the same type as the high-concentration impurity regions in the semiconductor layer using the gate electrode as a mask, and thereby forming respectively in the semiconductor layer a channel region in the position corresponding to the gate electrode and a low-concentration impurity region between the channel region and one of said high-concentration impurity regions.

4. A manufacturing method for a semiconductor device, comprising:
a semiconductor layer forming step of forming a semiconductor film on a base substrate and patterning the semiconductor film to form a first semiconductor layer and a second semiconductor layer;
a gate insulating film forming step of forming a gate insulating film so as to cover the first semiconductor layer and the second semiconductor layer;
a conductive film forming step of forming, on the gate insulating film, a conductive film that is used to form gate electrodes;
a photosensitive resin film forming step of forming a photosensitive resin film on the conductive film;
a photosensitive resin film patterning step of forming a first resist layer having a thick film portion on one side thereof and a thin film portion that is thinner than the thick film portion on another side thereof over a portion of the first semiconductor layer, and forming a second resist layer that is thicker than the thin film portion over a portion of the second semiconductor layer by controlling an amount of light radiated onto the photosensitive resin film by using a multiple gradation mask;

a conductive film patterning step of patterning the conductive film by isotropic etching that uses the first resist layer and the second resist layer as masks, to form gate electrodes respectively over the first semiconductor layer and over the second semiconductor layer so as to be narrower than the corresponding first resist layer and second resist layer, and to form overhang portions in the first resist layer and in the second resist layer, respectively, the overhang portions hanging over both sides of the gate electrodes in an eave shape;

a thin film portion removal step of removing the thin film portion, and thereby shaping the first resist layer such that an overhang portion hangs over only one side of the gate electrode, and thinning the second resist layer while leaving the second resist layer remaining; and an impurity implantation step of, after the thin film portion removal step, respectively implanting an impurity of a conductivity type different from the conductivity type of both semiconductor layers in the first semiconductor layer using the first resist layer as a mask and in the second semiconductor layer using the gate electrode as a mask, and thereby forming in the first semiconductor layer impurity implanted regions respectively on both sides of the position corresponding to the gate electrode, the impurity implanted region on one side of the gate electrode being formed with a gap therefrom corresponding to the overhang portion the overhang portion, and forming in the second semiconductor layer impurity implanted regions on both sides of the position corresponding to the gate electrode with gaps therefrom corresponding to the overhang portions.

5. The manufacturing method for a semiconductor device according to claim 1,
wherein, in the photosensitive resin film patterning step, a gray tone mask is used as the multiple gradation mask.

6. A manufacturing method for a semiconductor device, comprising:
a semiconductor layer forming step of forming a semiconductor film on a base substrate and patterning the semiconductor film to form a first semiconductor layer and a second semiconductor layer;

a gate insulating film forming step of forming a gate insulating film so as to cover the first semiconductor layer and the second semiconductor layer;

a conductivity type adjusting step of adjusting a concentration of an impurity included in at least one of the first semiconductor layer and the second semiconductor layer such that the first semiconductor layer has a first conductivity type and the second semiconductor layer has a second conductivity type by implanting an impurity in at least one of the first semiconductor layer and the second semiconductor layer;

a conductive film forming step of forming a conductive film to be used to form a gate electrode on the gate insulating film after the conductivity type adjusting step;

a first photosensitive resin film forming step of forming a first photosensitive resin film on the conductive film;

a first photosensitive resin film patterning step of patterning the first photosensitive resin film, and thereby forming a first resist layer over the entire first semiconductor layer and forming a second resist layer over a portion of the second semiconductor layer;

a first conductive film patterning step of patterning the conductive film by etching that uses the first resist layer and the second resist layer as masks, to form a gate electrode above the second semiconductor layer;

a first conductivity type impurity implantation step of implanting a first conductivity type impurity in the second semiconductor layer using the second resist layer as a mask, thereby forming a channel region in a position of the second semiconductor layer corresponding to the gate electrode and impurity implanted regions on both sides of the channel region, without implanting the first conductivity type impurity in the first semiconductor layer using the first resist layer as a mask;

a first and second resist layer removal step of removing the first resist layer and the second resist layer after the first conductivity type impurity implantation step, a second photosensitive resin film forming step of forming a second photosensitive resin film on the conductive film;

a second photosensitive resin film patterning step of forming a third resist layer having a thick film portion on one side thereof and a thin film portion that is thinner than the thick film portion on another side thereof over a portion of the first semiconductor layer, and forming a fourth resist layer that is thicker than the thin film portion over the entire second semiconductor layer by controlling an amount of light radiated onto the second photosensitive resin film by using a multiple gradation mask;

a second conductive film patterning step of patterning the conductive film by isotropic etching using the third resist layer and the fourth resist layer as masks, in which a gate electrode narrower than the third resist layer is formed over the first semiconductor layer and overhang portions that hang over from the third resist layer on both sides of the gate electrode in an eave-shape are formed;

a thin film portion removal step of, after the second conductive film patterning step, removing the thin film portion, and thereby shaping the third resist layer such that an overhang portion hangs over only one side of the gate electrode, and thinning the fourth resist layer while leaving the fourth resist layer remaining; and a second conductivity type impurity implantation step of implanting a second conductivity type impurity in the first semiconductor layer using the third resist layer as a mask after the thin film portion removal step, thereby forming impurity implanted regions respectively on one side of a position of the first semiconductor layer corresponding to the gate electrode with a gap therefrom corresponding to the overhang portion and on another side of the position corresponding to the gate electrode with no gap from the position corresponding to the gate electrode, without implanting the second conductivity type impurity in the second semiconductor layer using the fourth resist layer as a mask.

7. The manufacturing method for a semiconductor device according to claim 6,
wherein the second conductivity type impurity implantation step is a high-concentration impurity implantation step,
wherein, in the high-concentration impurity implantation step, high-concentration impurity regions are formed as the impurity implanted regions,
wherein the manufacturing method further comprises: a third resist layer removal step of removing the remaining third resist layer after the high-concentration impurity implantation step; and
a low-concentration impurity implantation step of forming a channel region in a portion of the first semiconductor layer corresponding in position to the gate electrode and a low-concentration impurity region between one side of the channel region and one of the high-concentration impurity regions by implanting a second conductivity type impurity in the first semiconductor layer using the gate electrode as a mask, after the third resist layer removal step.

8. The manufacturing method for a semiconductor device according to claim 6,
wherein, in the second photosensitive resin film patterning step, a gray tone mask is used as the multiple gradation mask.

9. The manufacturing method for a semiconductor device according to claim 1,
wherein, in the semiconductor layer forming step, the semiconductor film is crystallized to form a crystalline semiconductor film.

10. The manufacturing method for a semiconductor device according to claim 4,
wherein, in the photosensitive resin film patterning step, a gray tone mask is used as the multiple gradation mask.

11. The manufacturing method for a semiconductor device according to claim 4,
wherein, in the semiconductor layer forming step, the semiconductor film is crystallized to form a crystalline semiconductor film.

12. The manufacturing method for a semiconductor device according to claim 6,
wherein, in the semiconductor layer forming step, the semiconductor film is crystallized to form a crystalline semiconductor film.

* * * * *